US010833101B2

(12) United States Patent
Shimomura et al.

(10) Patent No.: US 10,833,101 B2
(45) Date of Patent: Nov. 10, 2020

(54) THREE-DIMENSIONAL MEMORY DEVICE WITH HORIZONTAL SILICON CHANNELS AND METHOD OF MAKING THE SAME

(71) Applicant: SANDISK TECHNOLOGIES LLC, Addison, TX (US)

(72) Inventors: Shigeki Shimomura, Cuptertino, CA (US); Satoru Mayuzumi, Cupertino, CA (US); Hiroyuki Ogawa, Nagoya (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/291,673

(22) Filed: Mar. 4, 2019

(65) Prior Publication Data

US 2020/0286901 A1  Sep. 10, 2020

(51) Int. Cl.
*H01L 27/1159* (2017.01)
*H01L 27/11597* (2017.01)
*H01L 23/522* (2006.01)
*G11C 11/16* (2006.01)
*H01L 29/78* (2006.01)
(Continued)

(52) U.S. Cl.
CPC ........ *H01L 27/1159* (2013.01); *G11C 11/161* (2013.01); *H01L 23/5226* (2013.01); *H01L 27/11597* (2013.01); *H01L 29/516* (2013.01); *H01L 29/6684* (2013.01); *H01L 29/78391* (2014.09)

(58) Field of Classification Search
CPC ............. H01L 27/1159; H01L 27/1211; H01L 27/0823
See application file for complete search history.

(56) References Cited

U.S. PATENT DOCUMENTS 5,915,167 A   6/1999  Leedy
9,331,093 B2  5/2016  Rabkin et al.
(Continued)

OTHER PUBLICATIONS

Endoh, T. et al., "Novel Ultra High Density Flash Memory with a Stacked-Surrounding Gate Transistor (S-GT) Structured Cell," IEDM Proc., pp. 33-36, (2001).
(Continued)

*Primary Examiner* — Wael M Fahmy
*Assistant Examiner* — Sarah K Salerno
(74) *Attorney, Agent, or Firm* — The Marbury Law Group PLLC

(57) ABSTRACT

A vertically alternating sequence of multi-fingered silicon-germanium layers and multi-fingered silicon layers is formed over a substrate. The multi-fingered silicon-germanium layers include silicon-germanium wires, and the multi-fingered silicon layers include silicon wires. Tubular memory films and multi-fingered gate electrodes are formed. Each gate electrode includes a respective gate electrode bar which overlies the silicon wires and a respective set of vertically-extending gate electrode fingers which is adjoined to a bottom portion of the respective gate electrode bar and spaced apart by the silicon wires. The multi-fingered silicon-germanium layers are removed selective to multi-fingered silicon layers. First active regions are formed at an end portion of each of the silicon wires. Second active regions are formed on silicon plate portions of the multi-fingered silicon layers.

12 Claims, 71 Drawing Sheets

(51) Int. Cl.
*H01L 29/66* (2006.01)
*H01L 29/51* (2006.01)

(56) References Cited

U.S. PATENT DOCUMENTS

| | | | |
|---|---|---|---|
| 9,870,945 | B2 | 1/2018 | Pachamuthu et al. |
| 9,941,299 | B1 | 4/2018 | Chen et al. |
| 10,121,794 | B2 | 11/2018 | Gunji-Yoneoka et al. |
| 2016/0099250 | A1 | 4/2016 | Rabkin et al. |
| 2016/0172369 | A1* | 6/2016 | Hu .................. H01L 27/11578 257/314 |
| 2016/0268209 | A1 | 9/2016 | Pachamuthu et al. |
| 2017/0365613 | A1 | 12/2017 | Gunji-Yoneoka et al. |
| 2019/0221558 | A1* | 7/2019 | Chen ................ H01L 27/11575 |
| 2020/0013791 | A1* | 1/2020 | Or-Bach ........... H01L 29/42332 |
| 2020/0044087 | A1* | 2/2020 | Guha ................ H01L 29/66439 |

OTHER PUBLICATIONS

Chen, C.P. et al., "A Highly Pitch Scalable 3D Vertical Gate (VG) NAND Flash Decoded by a Novel Self-Aligned Independently Controlled Double Gate (IDG) String Select Transistor (SSL)," 2012 Symp. on VLSI Technology Digest of Technical Papers, pp. 91-92, (2012).

Hsiao, Y.H. et al., "A critical examination of 3D stackable NAND Flash memory architectures by simulation study of the scaling capability," Proceedings of *2010 IEEE International Memory Workshop*, 978-1-4244-6721-1, Date of Conference: May 16-19, 2010, Seoul, S. Korea, (2010).

Mikolajick, T. et al., "Doped Hafnium Oxide—An Enabler for Ferroelectric Field Effect Transistors," *Advances in Science and Technology* vol. 95, pp. 136-145, (2014).

Loubet, N. et al., "Stacked Nanosheet Gate-All-Around Transistor to Enable Scaling Beyond FinFET," 2017 Symposium on VLSI Technology Proceedings, Jun. 2017, 3 pages, (2017).

U.S. Appl. No. 15/951,916, filed Apr. 12, 2018, SanDisk Technologies LLC.
U.S. Appl. No. 16/021,899, filed Jun. 28, 2018, SanDisk Technologies LLC.
U.S. Appl. No. 16/200,115, filed Nov. 26, 2018, SanDisk Technologies LLC.
U.S. Appl. No. 16/221,894, filed Dec. 17, 2018, SanDisk Technologies LLC.
U.S. Appl. No. 16/221,942, filed Dec. 17, 2018, SanDisk Technologies LLC.
U.S. Appl. No. 16/227,889, filed Dec. 20, 2018, SanDisk Technologies LLC.
U.S. Appl. No. 16/249,300, filed Jan. 16, 2019, SanDisk Technologies LLC.

Weckx, P. et al., "Stacked nanosheet fork architecture for SRAM design and device co-optimization toward 3nm," IEEE, pp. 20.5.1-20.5.4, IEDM17-505 to IEDM17-508, (2017).

Breil, N. et al., "Highly-selective superconformal CVD Ti silicide process enabling area-enhanced contacts for next—CMOS architectures," 2017 Symposium on VLSI Technology Digest of Technical Papers, JSAP, pp. T216-T217, (2017).

Kikuchi, Y. et al., "Electrical Characteristics of p-Type Bulk Si Fin Field-Effect Transistor Using Solid-Source Doping With 1-nm Phosphosilicate Glass," IEEE Electronic Device Letters, vol. 37, No. 9, pp. 1084-1087, (2016).

Mertens, H. et al., "Vertically Stacked Gate-All-Around Si Nanowire Transistors: Key Process Optimizations and Ring Oscillator Demonstration," Applied Materials, Crown, pp. 37.4.1-37.4.4, IEDM17-828 to IEDM17-831, (2017).

Mertens, H. et al., "Vertically Stacked Gate-All-Around Si Nanowire CMOS Transistors with Dual Work Function Metal Gates," IEEE, pp. 19.7.1-19.7.4, IEDM16-524 to IEDM16-527, (2016).

Barraud, S. et al., "Vertically Stacked-NanoWires MOSFETs in a Replacement Metal Gate Process with Inner Spacer and SiGe Source/Drain," STMicroelectronics, IEEE, pp. 17.6.1-17.6.4, IEDM16-464-IEDM16-467, (2016).

Loubet, N. et al., "Selective etching of Si1—xGex versus Si with gaseous HCI for the formation of advanced CMOS devices," Thin Solid Films, vol. 517, pp. 93-97, (2008).

Chen, C.P. et al., "A Highly Pitch Scalable 3D Vertical Gate (VG) NAND Flash Decoded by a Novel Self-Aligned Independently Controlled Double Gate (IDG) String Select Transistor (SSL)," IEEE, 2012 Symposium on VLSI Technology Digest of Technical Papers, pp. 91-92, (2012).

Nitayama, A. et al., "Bit Cost Scalable (BiCS) Flash Technology for Future Ultra High Density Storage Devices," IEEE, pp. 130-131, (2010).

* cited by examiner

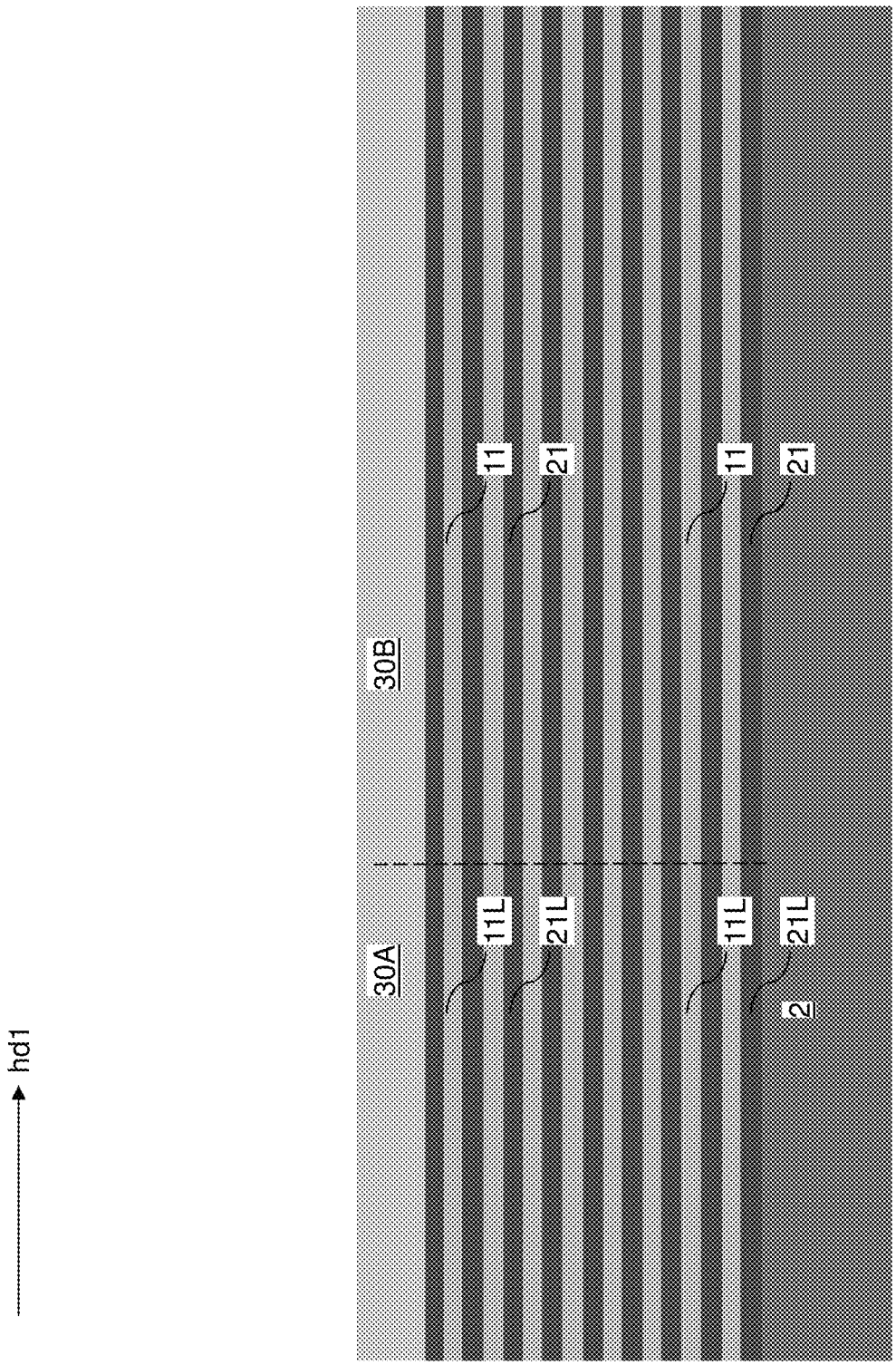

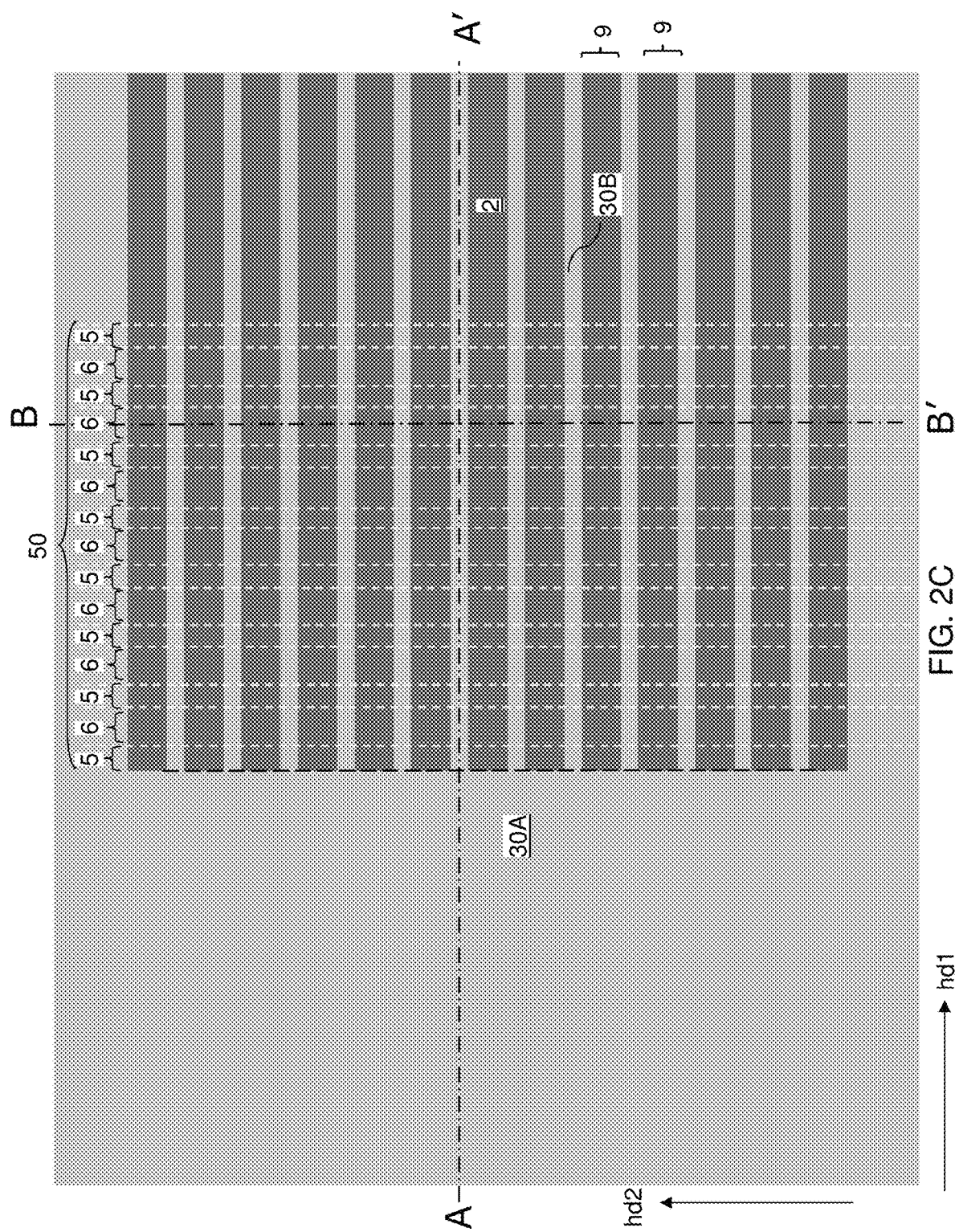

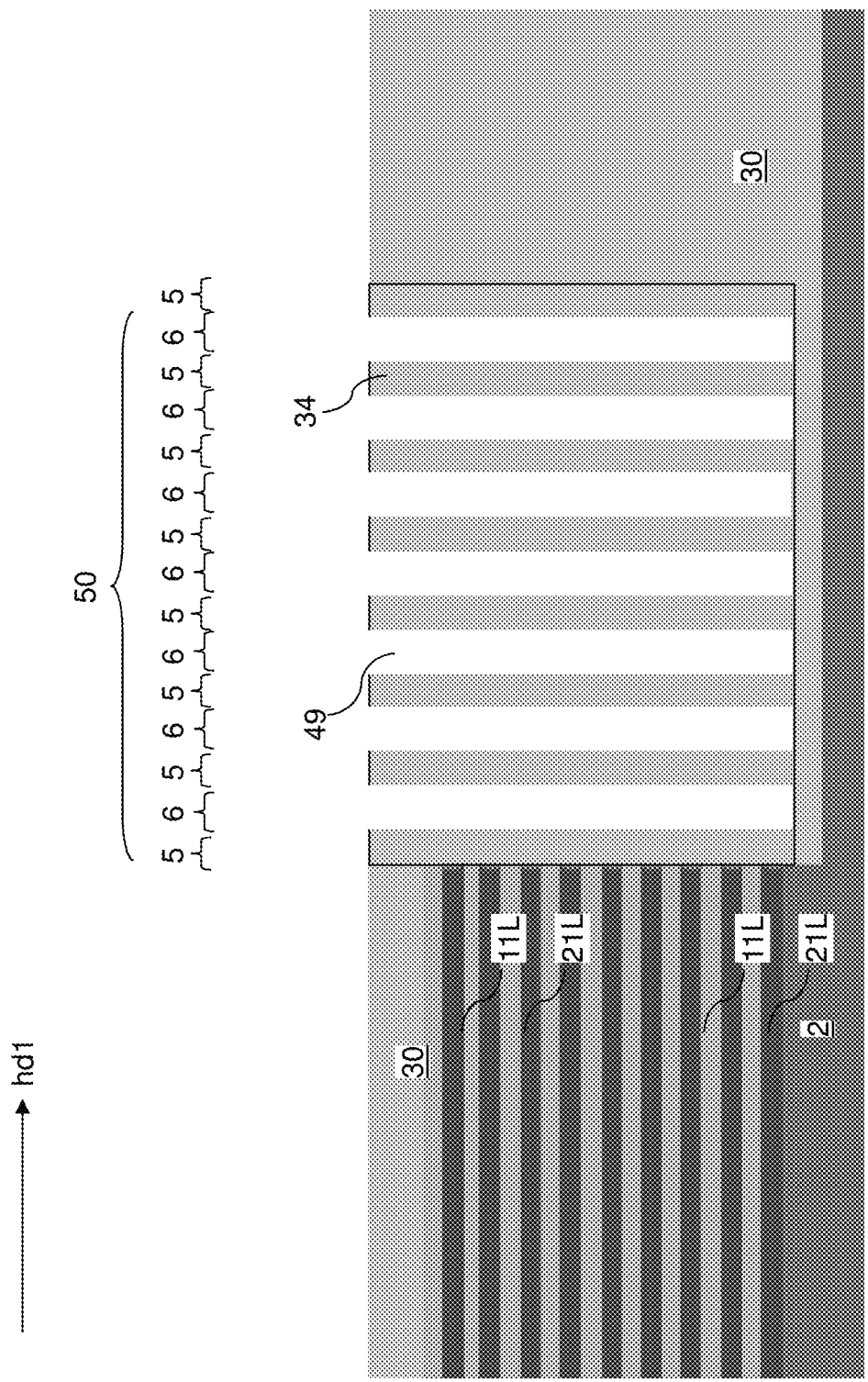

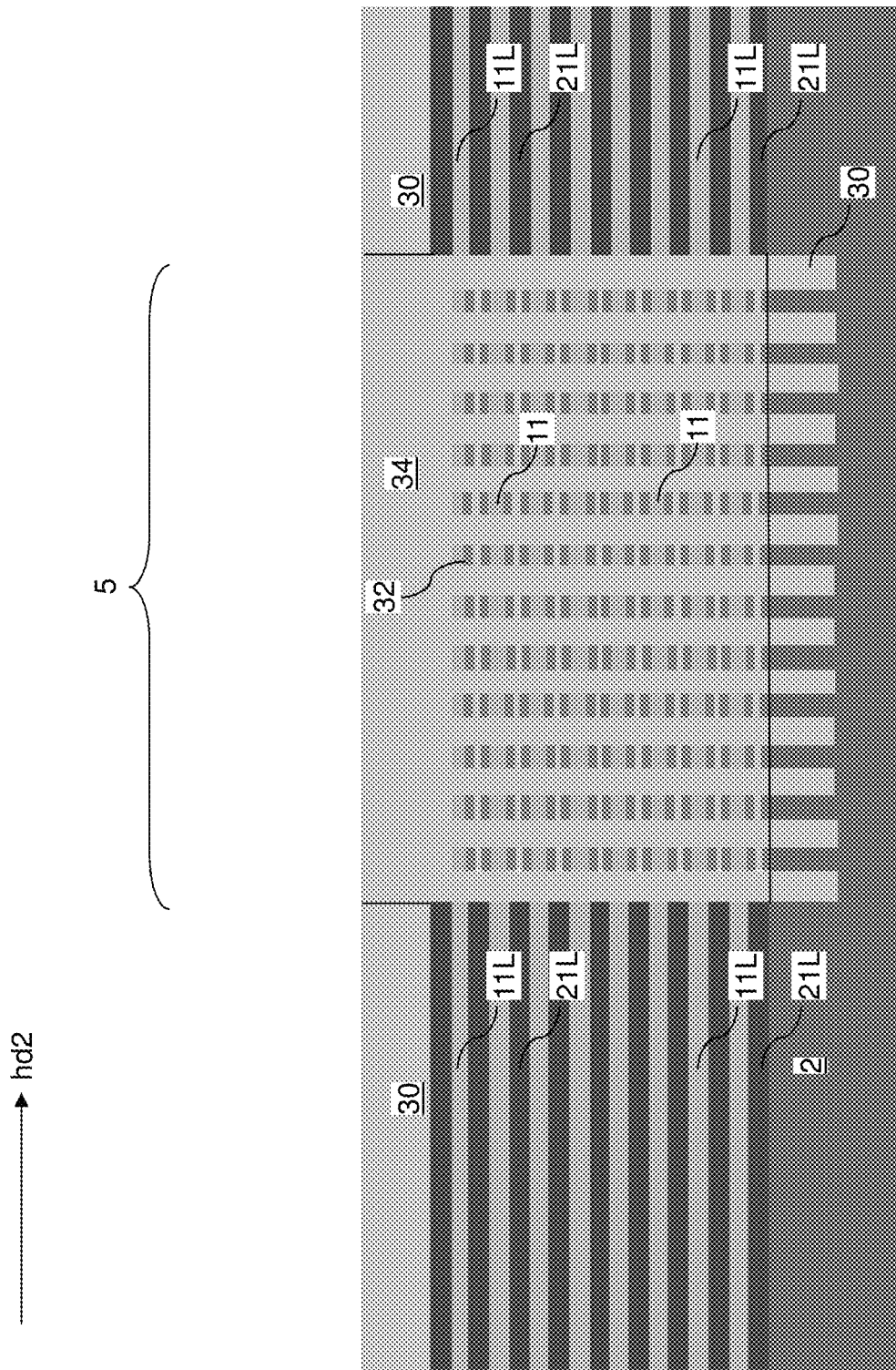

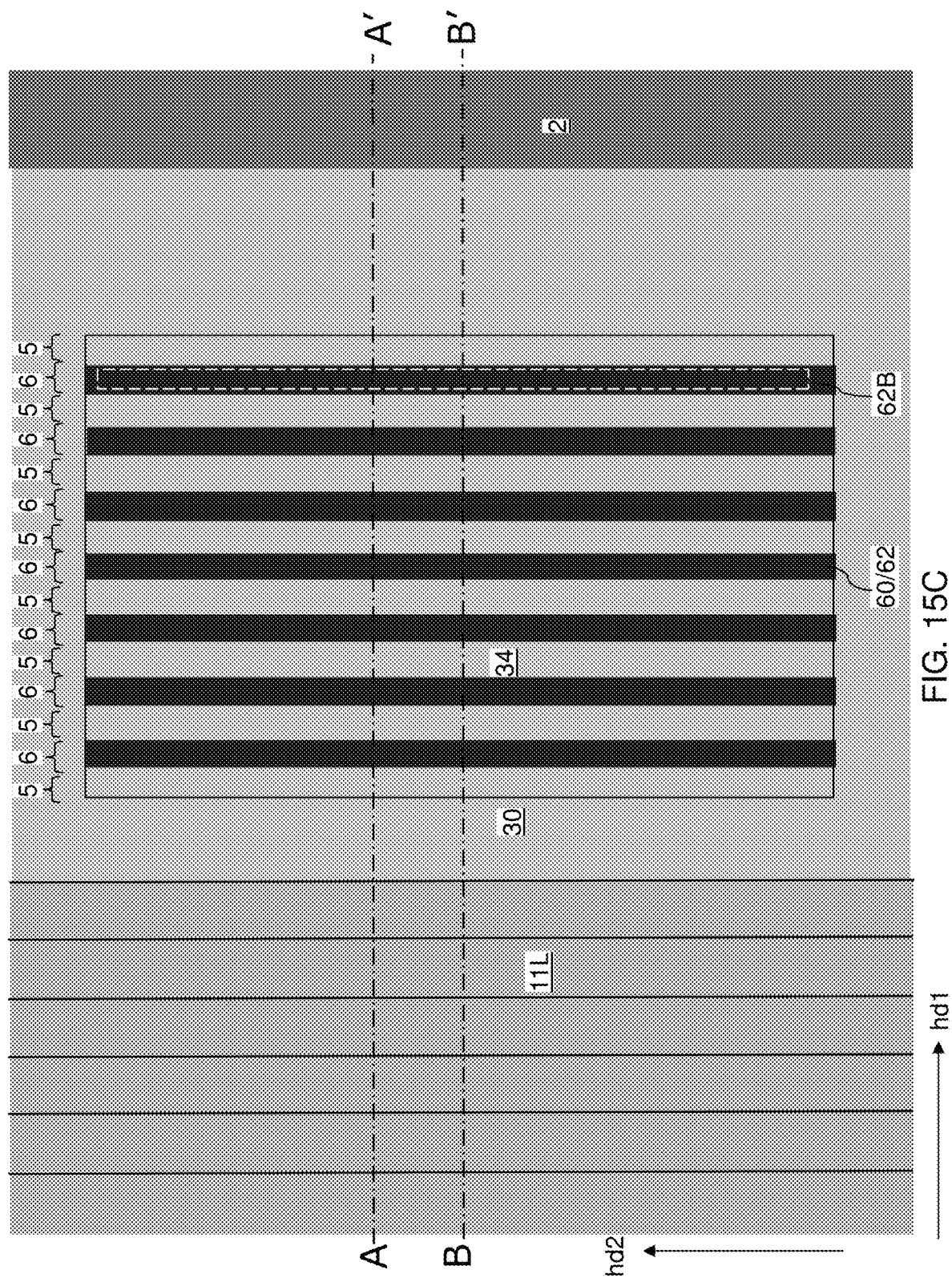

US 10,833,101 B2

1

THREE-DIMENSIONAL MEMORY DEVICE WITH HORIZONTAL SILICON CHANNELS AND METHOD OF MAKING THE SAME

FIELD

The present disclosure relates generally to the field of semiconductor devices, and particular to a three-dimensional NAND memory device employing horizontal channels and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device comprises multi-fingered silicon layers which are vertically spaced from one another and which are located over a substrate, wherein each of the multi-fingered silicon layers includes a respective silicon plate portion and a respective set of silicon wires extending along a first horizontal direction and laterally spaced apart along a second horizontal direction, tubular memory films that surround respective portions of each of the silicon wires, gate electrodes comprising vertically-extending gate electrode fingers which extend vertically between a respective laterally-neighboring pair of silicon wires; and wherein the gate electrodes are laterally spaced apart along the first horizontal direction, wherein each of the silicon wires comprises a respective channel portion that is undoped or has a doping of a first conductivity type and extending under each of the gate electrodes, first active regions located at an end portion of each of the silicon wires and having a doping of a second conductivity type that is an opposite of the first conductivity type, and second active regions located in the silicon plate portions of the multi-fingered silicon layers and having a doping of the second conductivity type.

According to another aspect of the present disclosure, a three-dimensional memory device comprises horizontal semiconductor channels which are vertically spaced from one another and which are located over a substrate, multi-fingered gate electrodes, each including a respective gate electrode bar which overlies the multi-fingered silicon layers and extends along the second horizontal direction, and a respective set of vertically-extending gate electrode fingers which is adjoined to a bottom portion of the respective gate electrode bar, wherein each of the vertically-extending gate electrode fingers extends vertically between a respective laterally-neighboring pair of horizontal semiconductor channels, and ferroelectric memory films that are located between the horizontal semiconductor channels and the multi-fingered gate electrodes.

According to another aspect of the present disclosure, a method of forming a three-dimensional memory device is provided, which comprises: forming a vertically alternating sequence of multi-fingered silicon-germanium layers and multi-fingered silicon layers over a substrate, wherein each of the multi-fingered silicon-germanium layers comprises a respective silicon-germanium plate portion and a respective set of silicon-germanium wires extending along a first horizontal direction and laterally spaced apart along a sec-

2 ond horizontal direction, and each of the multi-fingered silicon layers is undoped or has a doping of a first conductivity type and comprises a respective silicon plate portion and a respective set of silicon wires extending along the first horizontal direction and laterally spaced apart along the second horizontal direction; forming tubular memory films around the silicon wires; forming multi-fingered gate electrodes that are laterally spaced apart along the first horizontal direction, wherein each of the multi-fingered gate electrodes includes a respective gate electrode bar which overlies the vertically alternating sequence and extends along the second horizontal direction, and includes a respective set of vertically-extending gate electrode fingers which is adjoined to a bottom portion of the respective gate electrode bar and spaced apart along the second horizontal direction by the silicon wires; removing the multi-fingered silicon-germanium layers selective to multi-fingered silicon layers; forming first active regions having a doping of a second conductivity type that is an opposite of the first conductivity type at an end portion of each of the silicon wires; and forming second active region having a doping of the second conductivity type on the silicon plate portions of the multi-fingered silicon layers.

BRIEF DESCRIPTION OF THE DRAWINGS

FIG. 2A is a schematic vertical cross-sectional view of the exemplary structure after formation of a vertically alternating sequence of multi-fingered silicon-germanium layers and multi-fingered silicon layers and line trenches extending therethrough according to an embodiment of the present disclosure.

FIG. 2C is a top-down view of the exemplary structure of FIGS. 2A and 2B. The vertical plane A-A' is the plane of the vertical cross-sectional view of FIG. 2A, and the vertical plane B-B' is the plane of the vertical cross-sectional view of FIG. 2B.

FIG. 11B is a second schematic vertical cross-sectional view of the exemplary structure at the processing steps of FIG. 11A.

FIG. 12D is a fourth schematic vertical cross-sectional view of the exemplary structure of FIGS. 12A-12C within a fourth vertical plane corresponding to the vertical plane D-D' in FIG. 11E.

FIG. 15C is a top-down view of the exemplary structure of FIGS. 15A and 15B. The vertical plane A-A' is the plane of the vertical cross-sectional view of FIG. 15A. The vertical plane B-B' is the plane of the vertical cross-sectional view of FIG. 15B.

DETAILED DESCRIPTION

Figure 1:
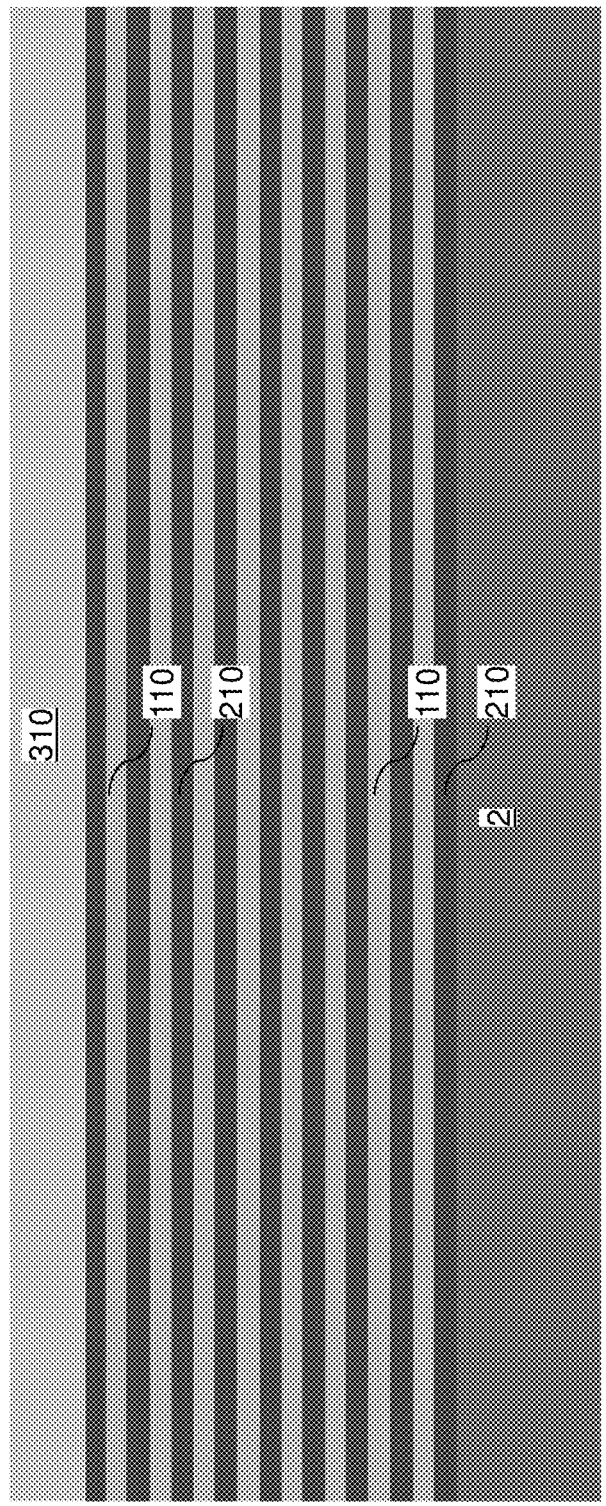
FIG. 1 is a schematic vertical cross-sectional view of an exemplary structure after formation of a vertically alternating sequence of silicon-germanium layers and silicon layers according to an embodiment of the present disclosure.

Vertical NAND strings typically contain polycrystalline semiconductor channels, such as polysilicon channels, which provide a lower than desired charge carrier mobility. As discussed above, the present disclosure is directed to a three-dimensional memory device containing horizontal channels and methods of manufacturing the same, the various aspects of which are described below. The horizontal channels may be single crystalline silicon channels which provide a higher mobility than polysilicon channels. The memory device may be a ferroelectric type memory device or a charge trapping (i.e., charge storage) type memory device. The embodiments of the disclosure can be employed to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

A monolithic three-dimensional memory array is a memory array in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Referring to FIG. 1, an exemplary structure according to an embodiment of the present disclosure is illustrated, which may be used, for example, to fabricate a device structure containing vertical NAND memory devices. The exemplary structure includes a substrate 2, which may be a semiconductor substrate. As used herein, a "semiconducting material" refers to a material having electrical conductivity in the range from $1.0 \times 10^{-6}$ S/cm to $1.0 \times 10^5$ S/cm. As used herein, a "semiconductor material" refers to a material having electrical conductivity in the range from $1.0 \times 10^{-6}$ S/cm to $1.0 \times 10^5$ S/cm in the absence of electrical dopants therein, and is capable of producing a doped material having electrical conductivity in a range from 1.0 S/cm to $1.0 \times 10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure.

As used herein, a "conductive material" refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

In one embodiment, the substrate 2 includes a silicon layer at least at an upper portion thereof. The substrate 2 can consist of a silicon layer, or may include a semiconductor-on-insulator substrate that contains a silicon layer at a top portion. In one embodiment, the substrate 2 can include single crystalline silicon substrate consisting of a single crystalline silicon layer, or a semiconductor-on-insulator (SOI) substrate with a single crystalline silicon layer as a topmost layer overlying an insulator layer and a bulk substrate layer.

A vertically alternating sequence of silicon layers 110 and sacrificial silicon-germanium layers 210 may be formed over the substrate 2. Other materials may also be used. For example, any material which can be etched selectively compared to the silicon layers 110 may be used as the sacrificial layer 210. However, silicon-germanium provides a single crystalline or highly crystalline silicon layers 110 during the epitaxial deposition of the vertically alternating sequence due to similar lattice structure of both materials. As used herein, a "vertically alternating sequence" refers to an alternating sequence of multiple instances of a first element and multiple instances of a second element that alternate vertically such that an instance of the second element overlies and/or underlies each instance of the first element, and an instance of the first element overlies and/or underlies each instance of the second element. The vertically alternating sequence may include a stack of an alternating plurality of silicon layers 110 and silicon-germanium layers 210. As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. Thus, a vertically alternating sequence of first elements and second elements may be an alternating plurality of the first elements and the second elements in which the alternating of the first elements and second elements occurs along the vertical direction. The first elements may have the same thickness throughout, or may have different thicknesses. The second elements may have the same thickness throughout, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The alternating plurality of silicon layers 110 and silicon-germanium layers 210 may constitute a prototype stack, or an in-process stack, of alternating layers comprising silicon layers 110 and silicon-germanium layers 210. As used herein, a "prototype" structure or an "in-process" structure refers to a transient structure that is subsequently modified in the shape or composition of at least one component therein.

The first material of the silicon layers 110 can consist essentially of silicon and dopants of a conductivity type, which may be p-type or n-type. The atomic concentration of the dopants of the first conductivity type can be in a range from $1.0 \times 10^{14}/cm^{3}$ to $1.0 \times 10^{18}/cm^{3}$, such as from $1.0 \times 10^{15}/cm^{3}$ to $3.0 \times 10^{17}/cm^{3}$, although lesser and greater dopant concentrations can also be employed. The second material of the silicon-germanium layers 210 is a sacrificial material that may be removed selective to the first material of the silicon layers 110. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material. The second material of the silicon-germanium layers 210 can be a silicon-germanium alloy consisting essentially of silicon, germanium, and optional electrical dopants, which may be p-type or n-type. The second material of the silicon-germanium layers 210 can include germanium at an atomic percentage in a range from 10% to 50%, such as from 20% to 40%, although lesser and greater atomic percentages can also be employed.

The silicon layers 110 can be single crystalline silicon layers having a thickness in a range from 5 nm to 50 nm, although lesser and greater thicknesses can also be used. Alternatively, the silicon layers 110 may comprise polysilicon layers. The silicon-germanium layers 210 can be single crystalline silicon-germanium layers having a thickness in a range from 5 nm to 50 nm, although lesser and greater thicknesses can also be used. Each of the silicon layers 110 and the silicon-germanium layers 210 can be formed by an epitaxial deposition process such as a silicon epitaxy process or a silicon-germanium epitaxy process. For example, each of the silicon layers 110 can be formed by an epitaxial deposition process employing silane, disilane, dichlorosilane, or trichlorosilane, and each of the silicon-germanium layers 210 can be formed by an epitaxial deposition process employing a silicon precursor gas (such as silane, disilane, dichlorosilane, or trichlorosilane) and a germanium-precursor gas (such as germane or digermane). The number of repetitions of the pairs of a silicon layer 110 and a silicon-germanium layer 210 may be in a range from 2 to 1,024, and typically from 8 to 256, although a greater number of repetitions may also be used.

An insulating matrix layer 310 can be formed over the vertically alternating sequence (110, 210) of the silicon layers 110 and the silicon-germanium layers 210. The insulating matrix layer 310 includes a dielectric material such as silicon oxide. The thickness of the insulating matrix layer 310 can be in a range from 30 nm to 300 nm, although lesser and greater thicknesses can also be employed.

Figure 2B:
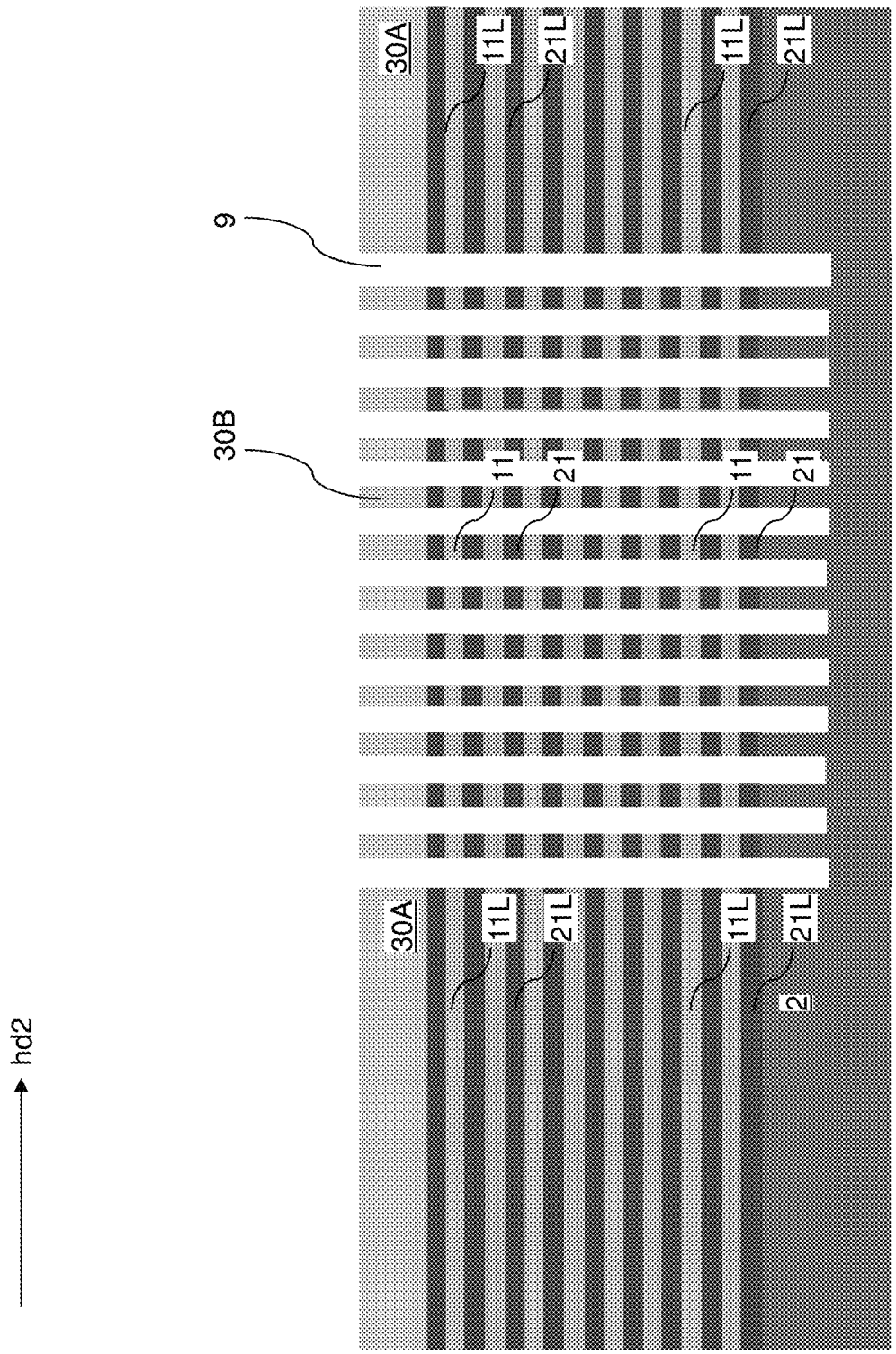
FIG. 2B is another schematic vertical cross-sectional view of the exemplary structure of FIG. 2A.
Figure 3A:
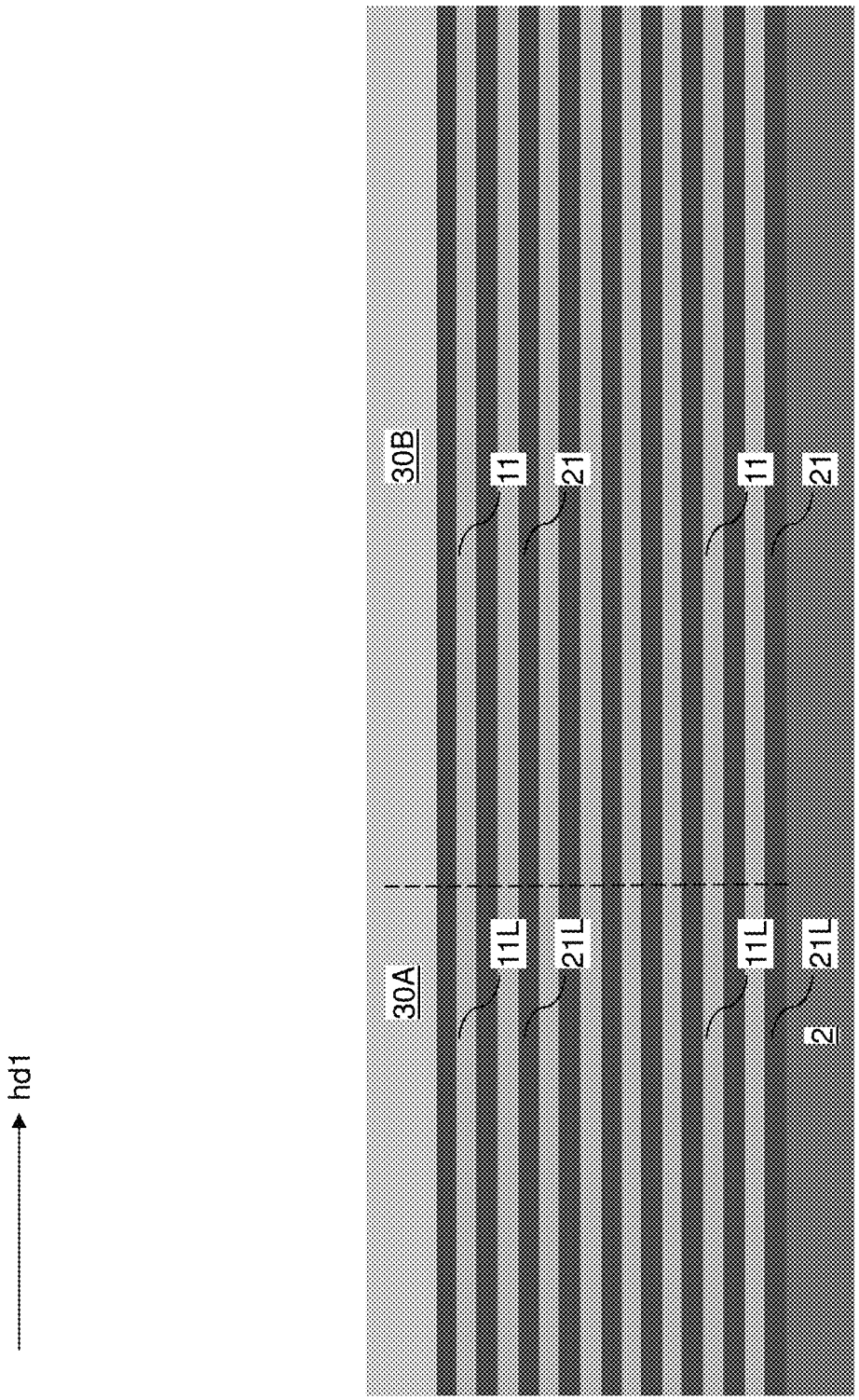
FIG. 3A is a first schematic vertical cross-sectional view of the exemplary structure after formation of a dielectric matrix in the line trenches and over the vertically alternating sequence according to an embodiment of the present disclosure.
Figure 3B:
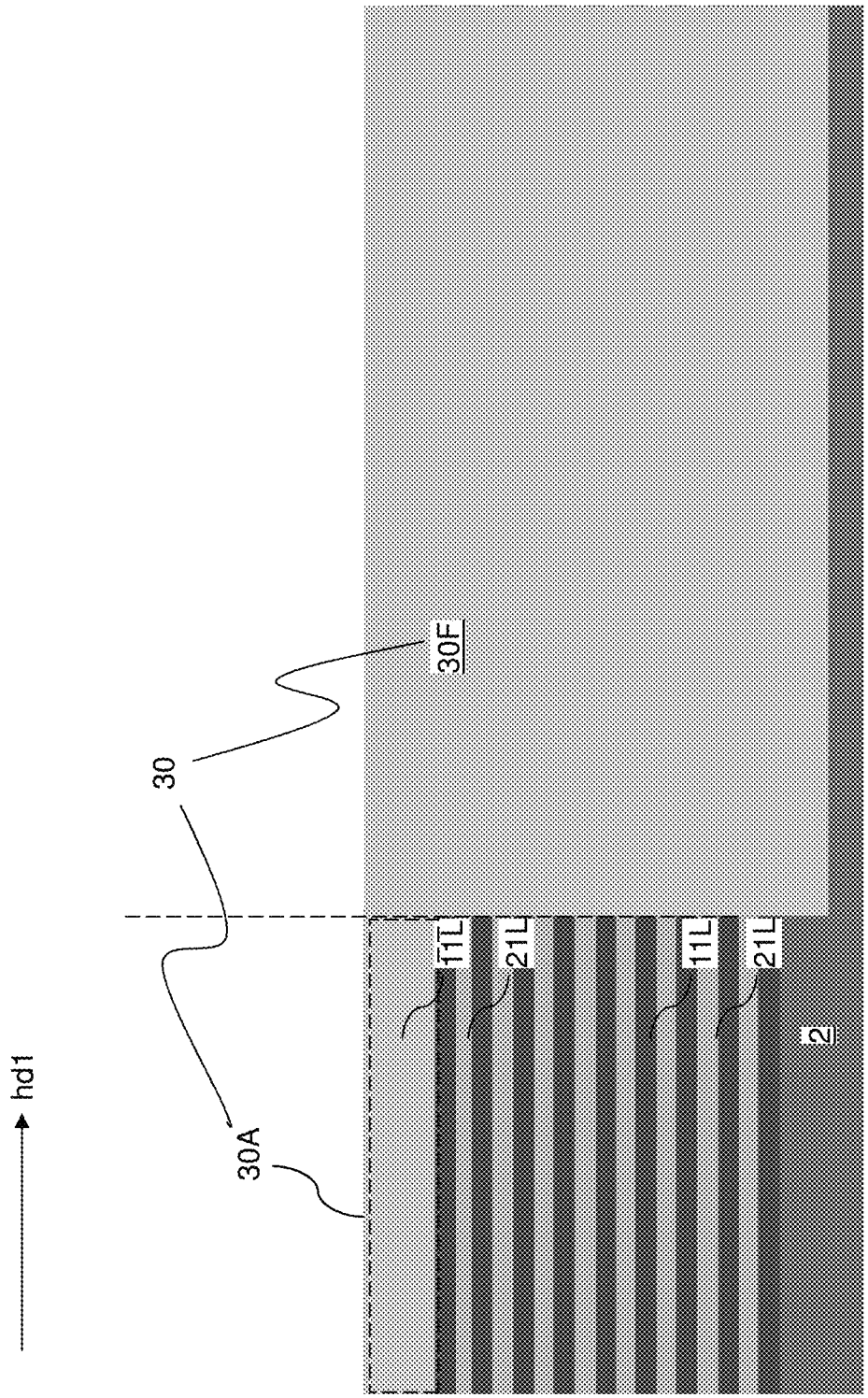
FIG. 3B is a second schematic vertical cross-sectional view of the exemplary structure of FIG. 3A.
Figure 3C:
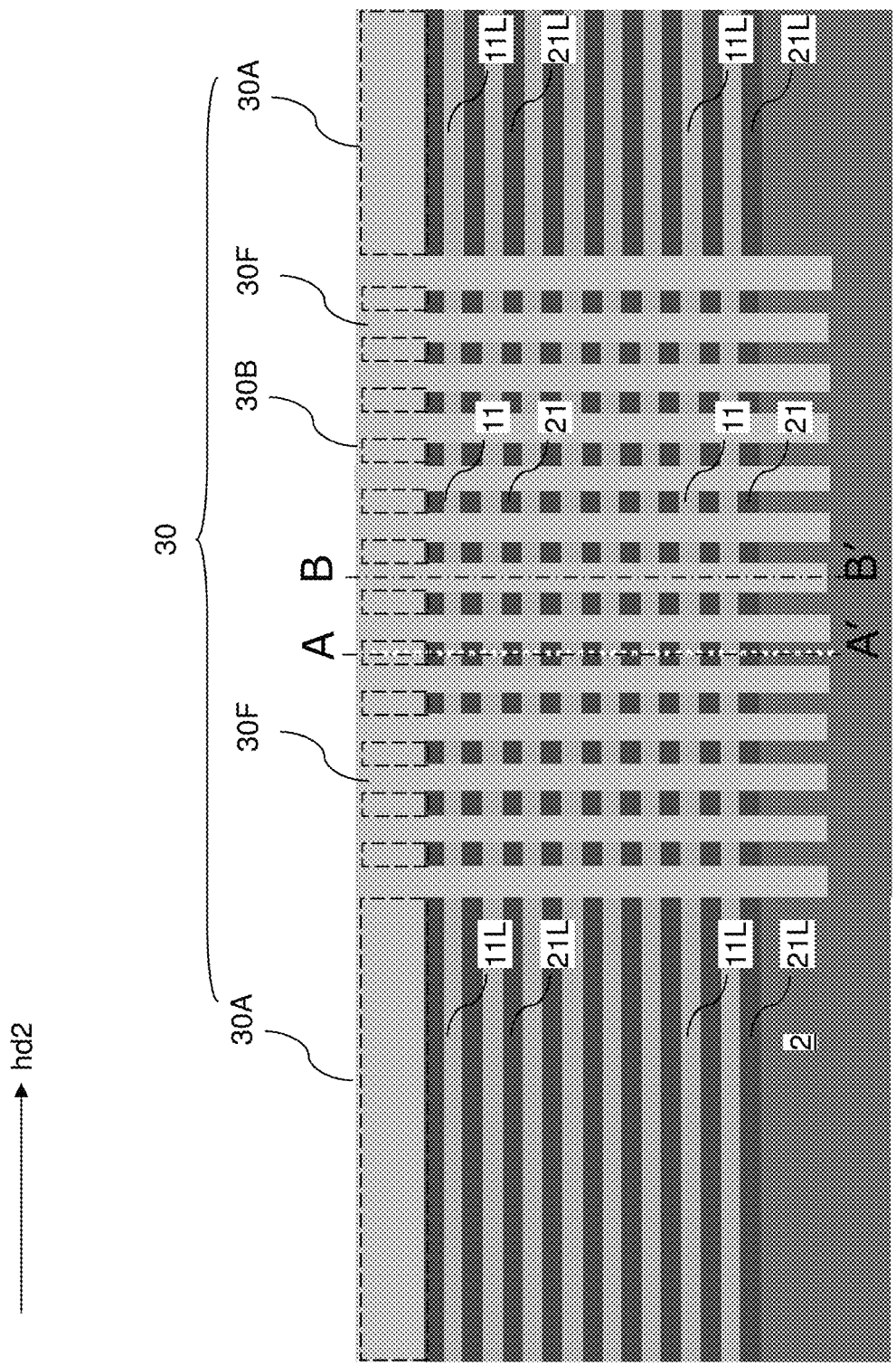
FIG. 3C is a third schematic vertical cross-sectional view of the exemplary structure of FIG. 3A.
Figure 3D:
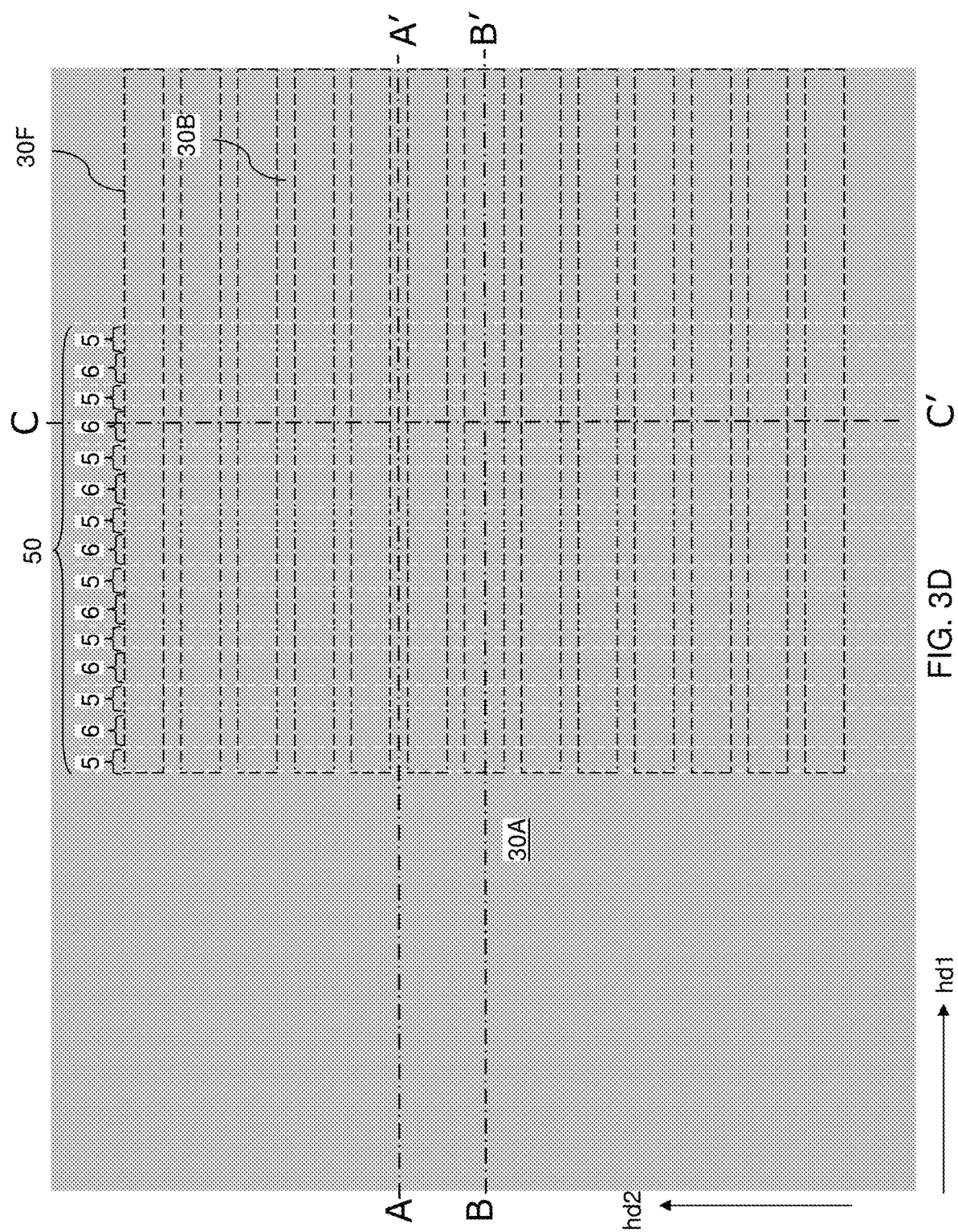
FIG. 3D is a top-down view of the exemplary structure of FIGS. 3A-3C. The vertical plane A-A' is the plane of the vertical cross-sectional view of FIG. 3A. The vertical plane B-B' is the plane of the vertical cross-sectional view of FIG. 3B. The vertical plane C-C' is the plane of the vertical cross-sectional view of FIG. 3C.

Referring to FIGS. 2A-2C, the vertically alternating sequence of the silicon layers 110 and the silicon-germanium layers 210 may be patterned to form line trenches 9 that laterally extend along a first horizontal direction hd1.

For example, a photoresist layer (not shown) can be applied over the insulating matrix layer 310, and can be lithographically patterned to form a set of elongated rectangular opening that laterally extend along the first horizontal direction hd1. An anisotropic etch process can be performed to transfer the pattern of the rectangular openings through the insulating matrix layer 310 and the vertically alternating sequence (110, 210) of the silicon layers 110 and the silicon-germanium layers 210, thereby forming the line trenches 9 that vertically extend through the vertically alternating sequence (110, 210) to a top surface of the substrate 2. The photoresist layer can be subsequently removed, for example, by ashing.

The remaining portions of the insulating matrix layer 310 can include an insulating plate portion 30A and laterally-extending insulating fingers 30B laterally adjoined to the insulating plate portion 30A. The remaining portions of the silicon layers 110 include multi-fingered silicon layers (11L, 11), each of which includes a silicon plate portion 11L and a plurality of silicon wires 11 laterally adjoined to the silicon plate portion 11L and in one embodiment having a rectangular vertical cross-sectional shape within vertical planes that are perpendicular to the first horizontal direction hd1. The remaining portions of the silicon-germanium layers 210 include multi-fingered silicon-germanium layers (21L, 21), each of which includes a silicon-germanium plate portion 21L and a plurality of silicon-germanium wires 21 laterally adjoined to the silicon-germanium plate portion 21L and in one embodiment having a rectangular vertical cross-sectional shape within vertical planes that are perpendicular to the first horizontal direction hd1.

Generally, a vertically alternating sequence of multi-fingered silicon-germanium layers (21L, 21) and multi-fingered silicon layers (11L, 11) is formed over the substrate 2. Each of the multi-fingered silicon-germanium layers (21L, 21) comprises a respective silicon-germanium plate portion 21L and a respective set of silicon-germanium wires 21 extending along the first horizontal direction hd1 and laterally spaced apart along a second horizontal direction hd2 that is perpendicular to the first horizontal direction hd1. Each of the multi-fingered silicon layers (11L, 11) has a doping of the first conductivity type and comprises a respective silicon plate portion 11L and a respective set of silicon wires 11 extending along the first horizontal direction hd1 and laterally spaced apart along the second horizontal direction hd2.

As shown in FIG. 2C, a plurality of vertically alternating sequences of silicon wires 11 and silicon-germanium wires 21 is provided. Each vertically alternating sequences of silicon wires 11 and silicon-germanium wires 21 can have a respective uniform width, which can be in a range from 5 nm to 50 nm, such as from 10 nm to 30 nm, although lesser and greater widths can also be employed. Neighboring pairs of vertically alternating sequences of silicon wires 11 and silicon-germanium wires 21 can be laterally spaced part by a respective line trench 9, which can have a uniform width in a range from 5 nm to 50 nm, such as from 10 nm to 30 nm, although lesser and greater widths can also be employed.

The region including proximal ends of the vertically alternating sequences of silicon wires 11 and silicon-germanium wires 21 that are adjoined to the silicon plate portions 11L or the silicon-germanium plate portions 21L is herein referred to as a NAND gate region 50, in which silicon channels located within a respective silicon wire 11 are subsequently formed. The NAND gate region 50 includes gate electrode regions 6 in which gate electrodes are to be subsequently formed, and electrode gap regions 5 located between neighboring pairs of gate electrode regions 6 or between a gate electrode region 6 and regions in which source/drain regions are to be subsequently formed. As used herein, a "source/drain region" is a name that refers to any of a source region or a drain region of a field effect transistor (i.e., of a charge trapping multi-gate NAND string or a multi-gate ferroelectric memory string each having a channel between and source region and drain region, similar to a field effect transistor of a logic device).

Referring to FIGS. 3A-3D, a dielectric material such as undoped silicate glass or a doped silicate glass can be deposited in the line trenches 9 by a conformal deposition process or by spin coating. A reflow process or a densification process may be optionally performed. Optionally, the top surface of the deposited dielectric material may be planarized by a planarization process such as chemical mechanical planarization. Remaining portions of the deposited dielectric material include vertically-extending dielectric plates 30F each of which fills a respective one of the line trenches 9. The combination of the insulating plate portion 30A, the laterally-extending insulating fingers 30B, and the vertically-extending dielectric plates 30F constitute a dielectric matrix 30, which fills the line trenches 9 and overlies the vertically alternating sequence {(11L, 11), (21L, 21)}.

Figure 4A:
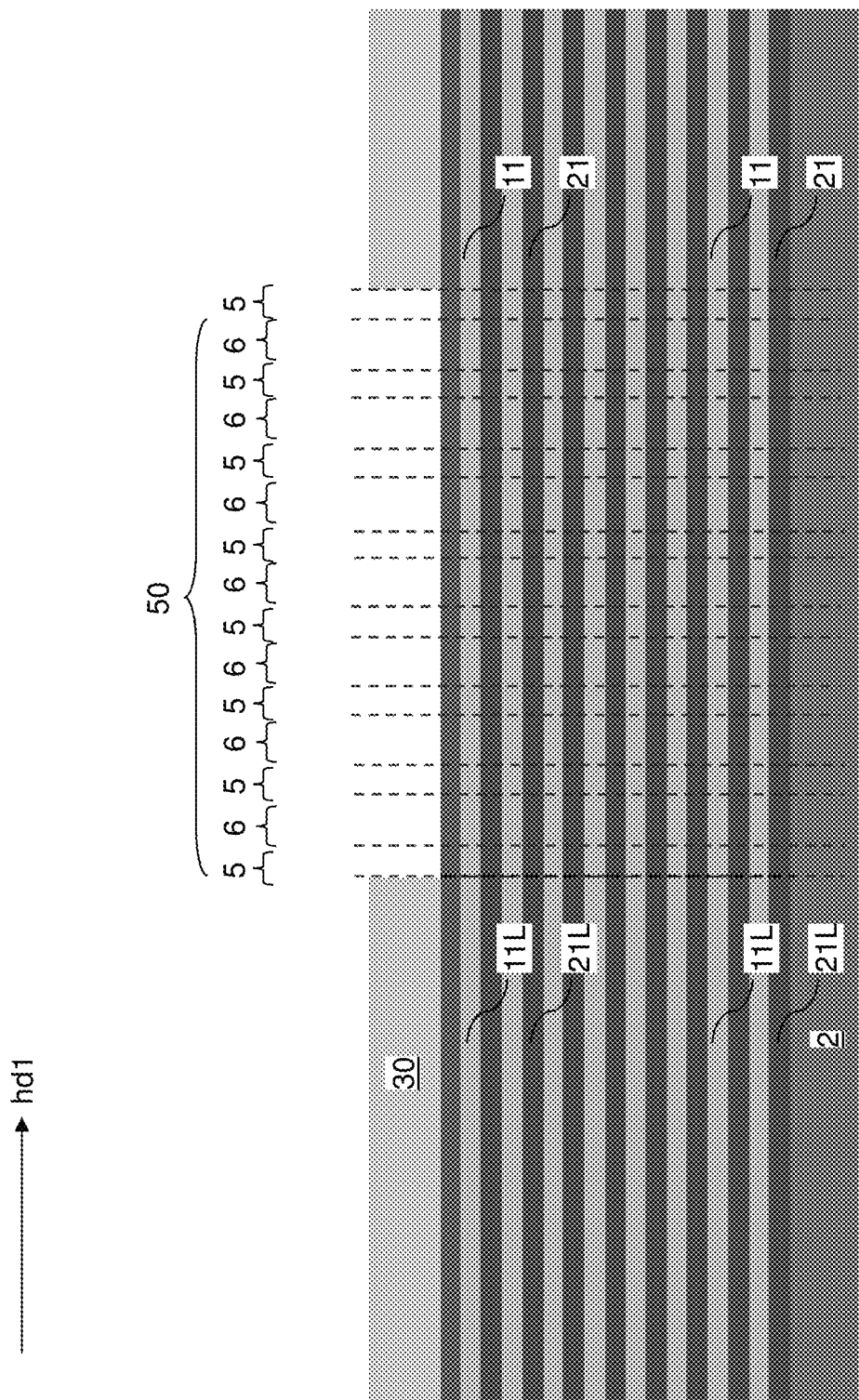
FIG. 4A is a first schematic vertical cross-sectional view of the exemplary structure within a first vertical plane corresponding to the vertical plane A-A' in FIG. 3D after removal of a portion of the material of the dielectric matrix within a NAND gate region to form line cavities according to an embodiment of the present disclosure.
Figure 4B:
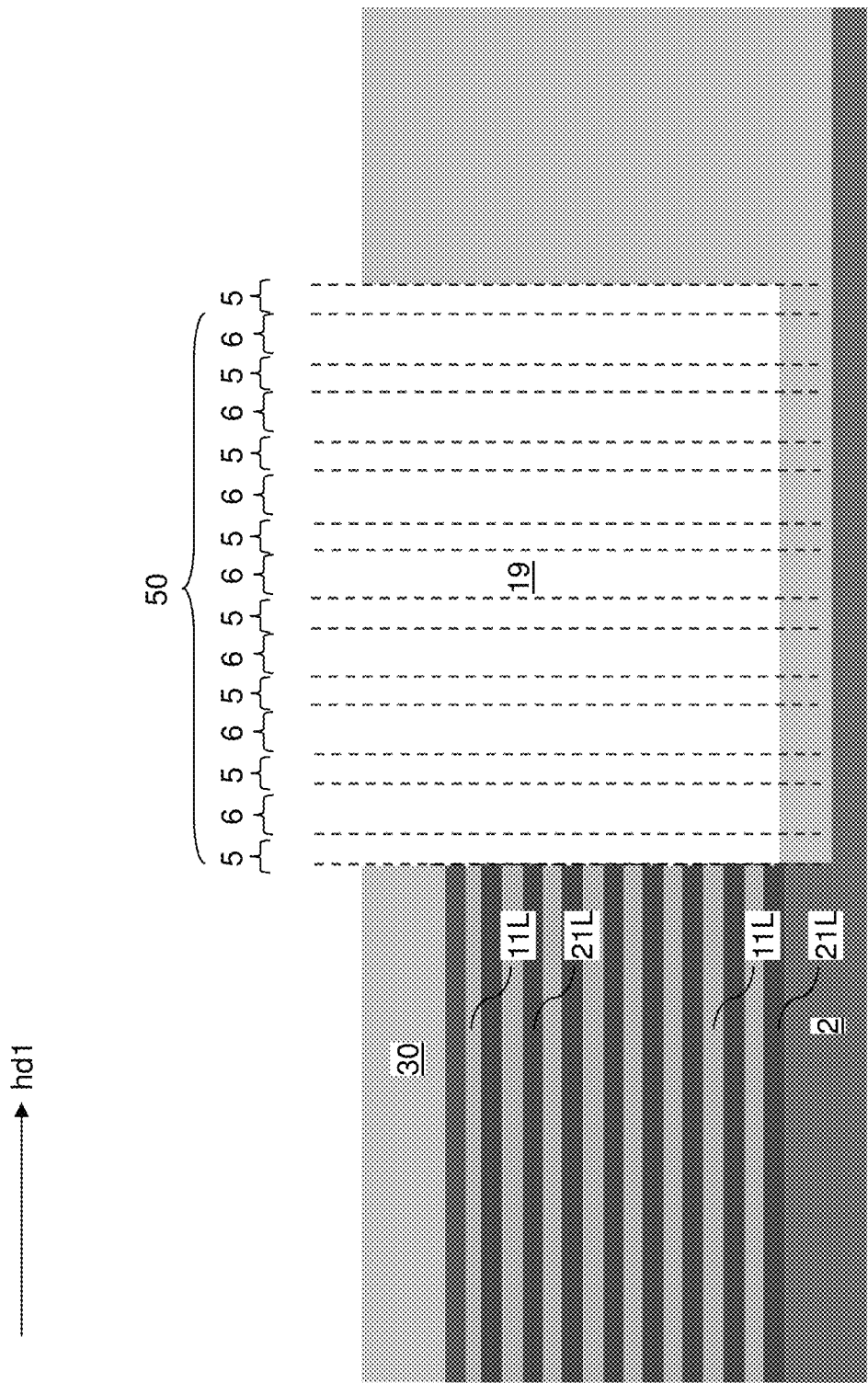
FIG. 4B is a second schematic vertical cross-sectional view of the exemplary structure within a second vertical plane corresponding to the vertical plane B-B' in FIG. 3D at the processing steps of FIG. 4A.

Referring to FIGS. 4A-4B, a photoresist layer can be applied over the dielectric matrix 30, and can be lithographically patterned to form a rectangular opening within the area of the NAND gate region 50. An anisotropic etch process that etches the silicon oxide materials of the dielectric matrix 30 selective to the materials of the silicon wires 11 and the silicon-germanium wires 21 can be performed. Line trenches 19 laterally extending along the first horizontal direction hd1 can be formed between neighboring pair of vertically alternating sequences of silicon wires 11 and silicon-germanium wires 21 within the area of the NAND gate region 50. An upper end of each line trench 19 can be adjoined to an overlying recess region, which can have the same depth as the thickness of a horizontal portion of the dielectric matrix 30 overlying the vertically alternating sequence of the multi-fingered silicon layers (11L, 11) and the multi-fingered silicon-germanium layers (21L, 21). The photoresist layer can be subsequently removed, for example, by ashing.

Figure 5A:
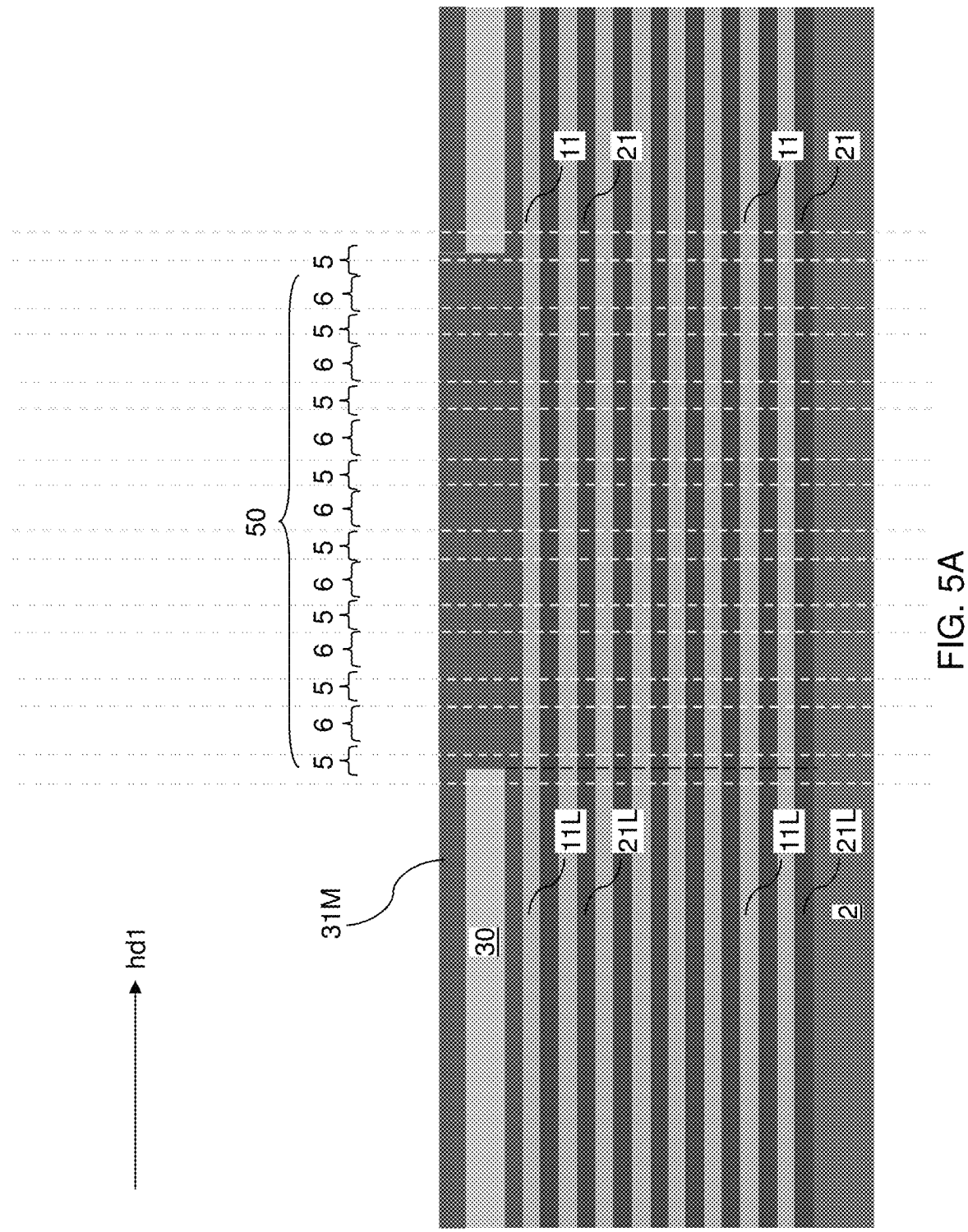
FIG. 5A is a first schematic vertical cross-sectional view of the exemplary structure within the first vertical plane corresponding to the vertical plane A-A' in FIG. 3D after formation of a sacrificial matrix material structure within a NAND gate region to form line cavities according to an embodiment of the present disclosure.
Figure 5B:
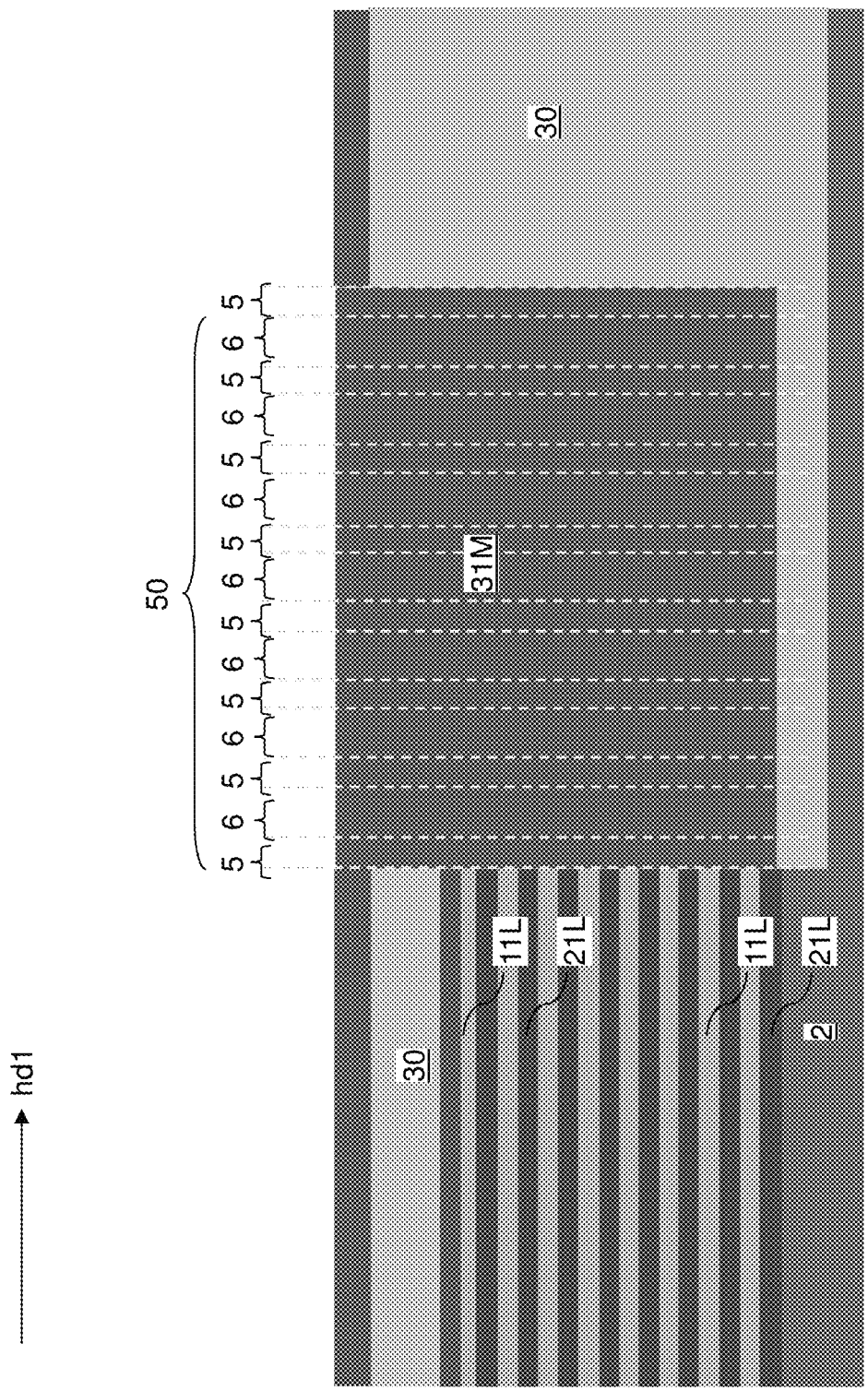
FIG. 5B is a second schematic vertical cross-sectional view of the exemplary structure within the second vertical plane corresponding to the vertical plane B-B' in FIG. 3D at the processing steps of FIG. 5A.

Referring to FIGS. 5A and 5B, a sacrificial matrix material is deposited in the line trenches 19 and over the remaining portions of the dielectric matrix 30 to form a sacrificial matrix material structure 31M. The sacrificial matrix material structure 31M includes a material that is different from the material of the dielectric matrix 30. For example, the sacrificial matrix material structure 31M can include amorphous silicon, an amorphous silicon-germanium alloy including germanium at an atomic percentage greater than 20%, polysilicon, amorphous carbon, diamond-like carbon (DLC), a doped silicate glass (such as borosilicate glass) having a greater etch rate than the materials of the dielectric matrix 30, or organosilicate glass. The sacrificial matrix material structure 31M includes vertically-extending portions that fill the line trenches 19 and a horizontally-extending portion that overlies the vertically-extending portions.

Figure 6A:
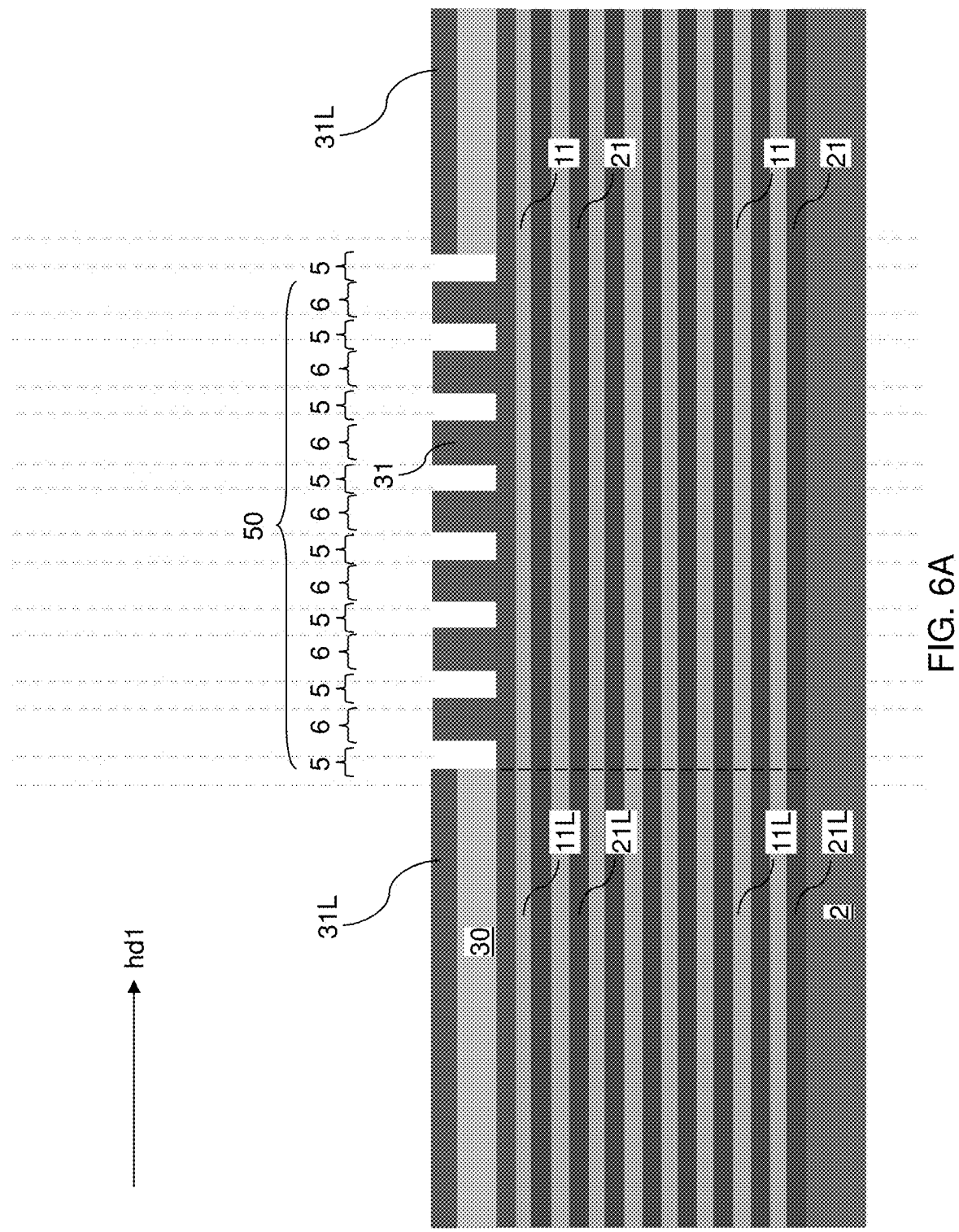
FIG. 6A is a first schematic vertical cross-sectional view of the exemplary structure within the first vertical plane corresponding to the vertical plane A-A' in FIG. 3D after formation of sacrificial multi-fingered gate structures in the NAND gate region according to an embodiment of the present disclosure.
Figure 6B:
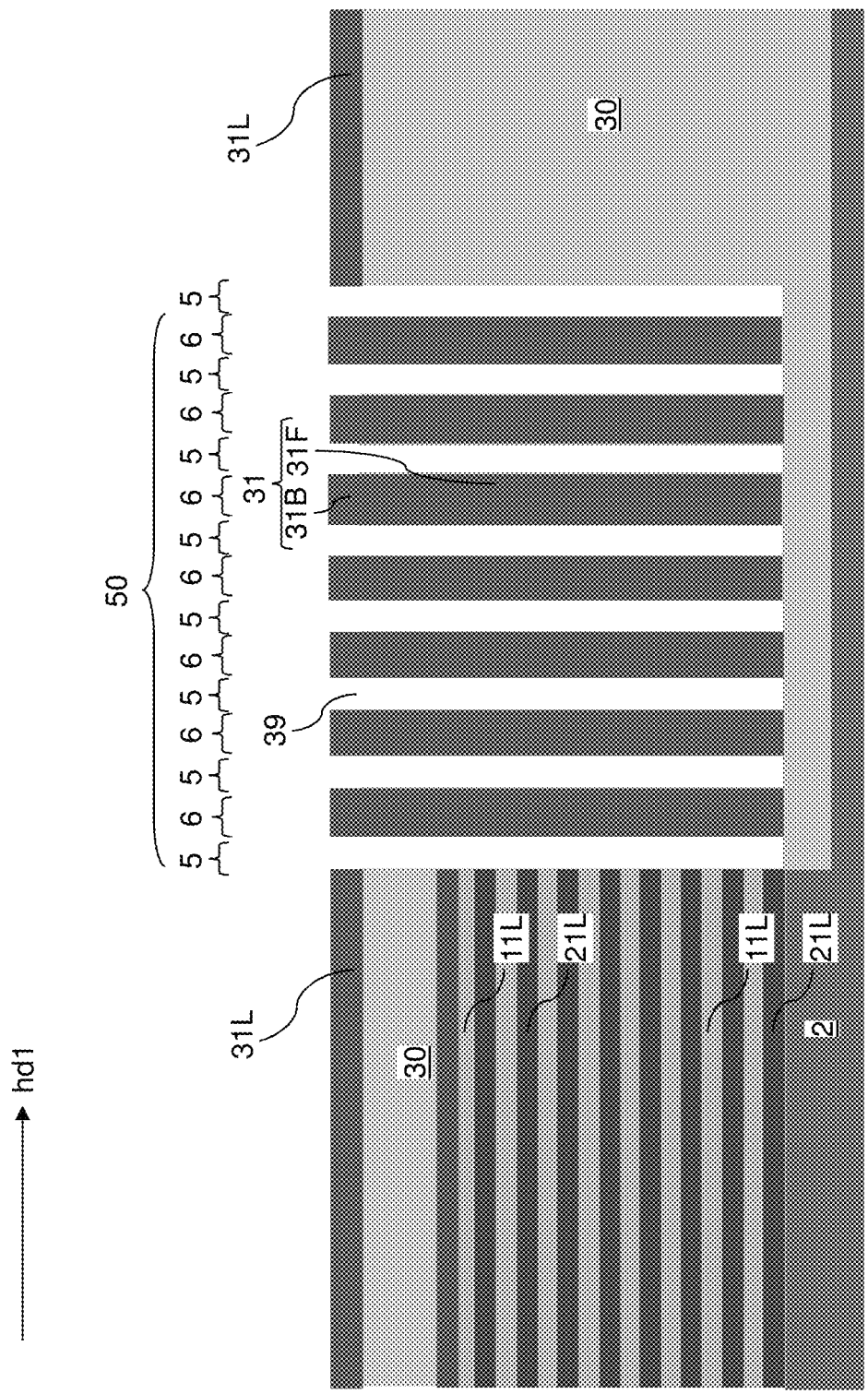
FIG. 6B is a second schematic vertical cross-sectional view of the exemplary structure within the second vertical plane corresponding to the vertical plane B-B' in FIG. 3D at the processing steps of FIG. 6A.

Referring to FIGS. 6A and 6B, the sacrificial matrix material structure 31M can be patterned by forming a line pattern that laterally extend along the second horizontal direction hd2 within the NAND gate region 50. For example, a photoresist layer (not shown) can be applied over the sacrificial matrix material structure 31M, and is lithographically patterned with a line and space pattern to form rectangular openings that laterally extend along the second horizontal direction hd2. The pattern of the rectangular openings in the photoresist layer can be selected such that the rectangular openings in the photoresist layer are formed in the electrode gap regions 5. In other words, the patterned photoresist layer covers the gate electrode regions 6 and the area outside of the NAND gate region 50, while not covering the electrode gap regions 5.

An anisotropic etch process can be performed to etch through segments of the sacrificial matrix material structure 31M that are not covered by the patterned photoresist layer. The chemistry of the anisotropic etch process can be selected such that the anisotropic etch process etches the material of the sacrificial matrix material structure 31M selective to the material of the silicon wires 11.

Figure 7A:
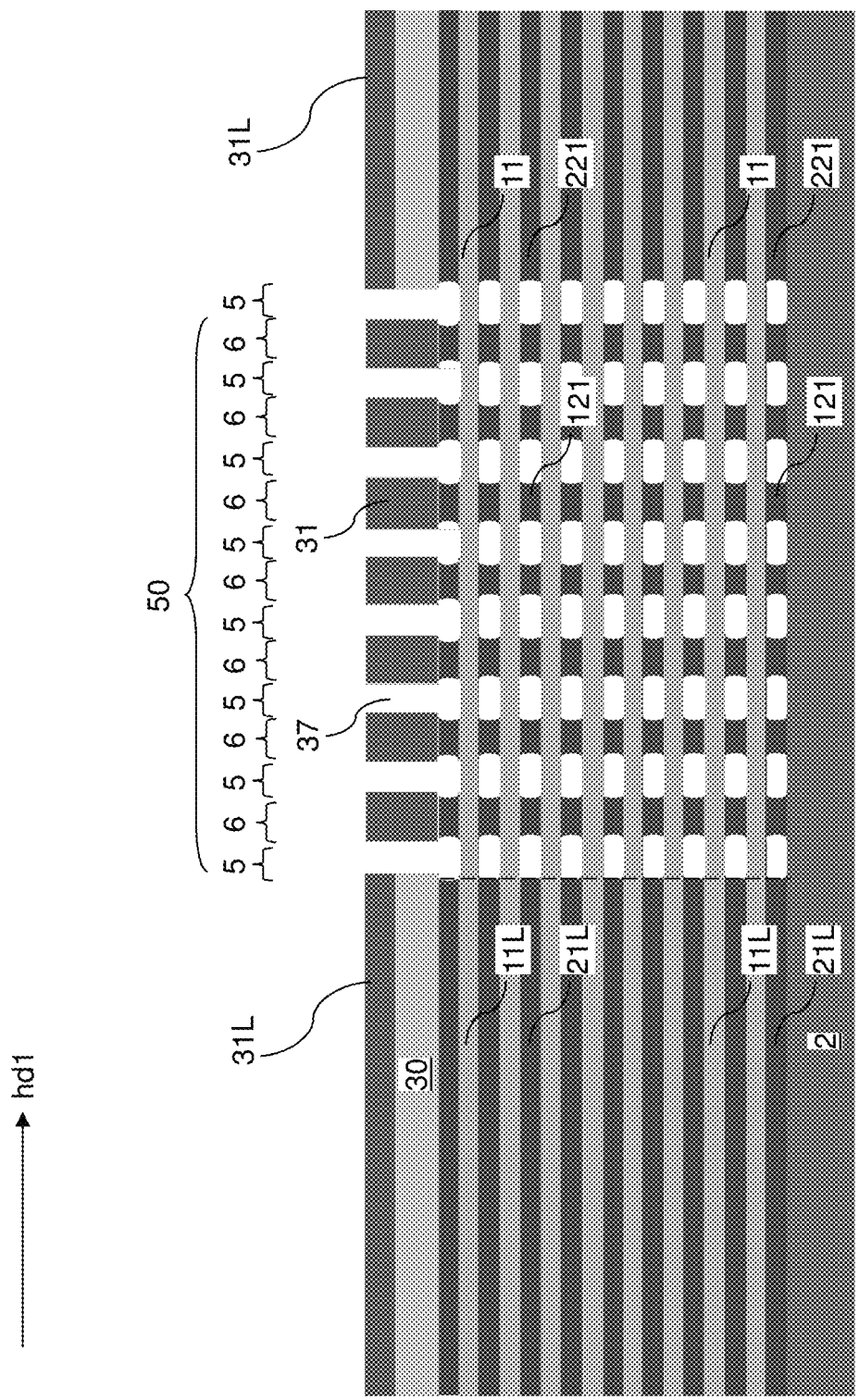
FIG. 7A is a first schematic vertical cross-sectional view of the exemplary structure after removing portions of the silicon-germanium wires that are not covered by the sacrificial multi-fingered gate structures in the NAND gate region according to an embodiment of the present disclosure.
Figure 7B:
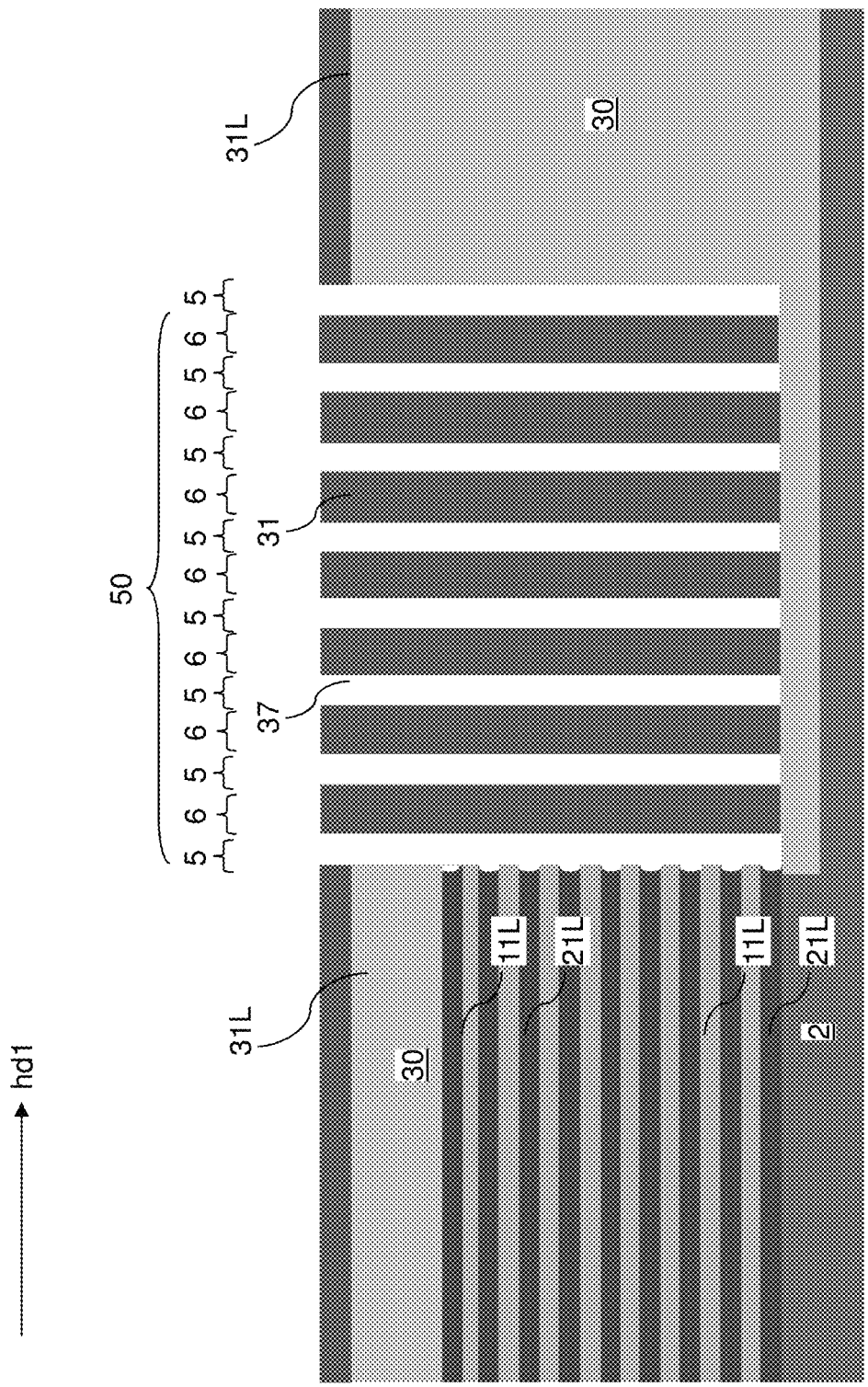
FIG. 7B is a second schematic vertical cross-sectional view of the exemplary structure at the processing steps of FIG. 7A.
Figure 7C:
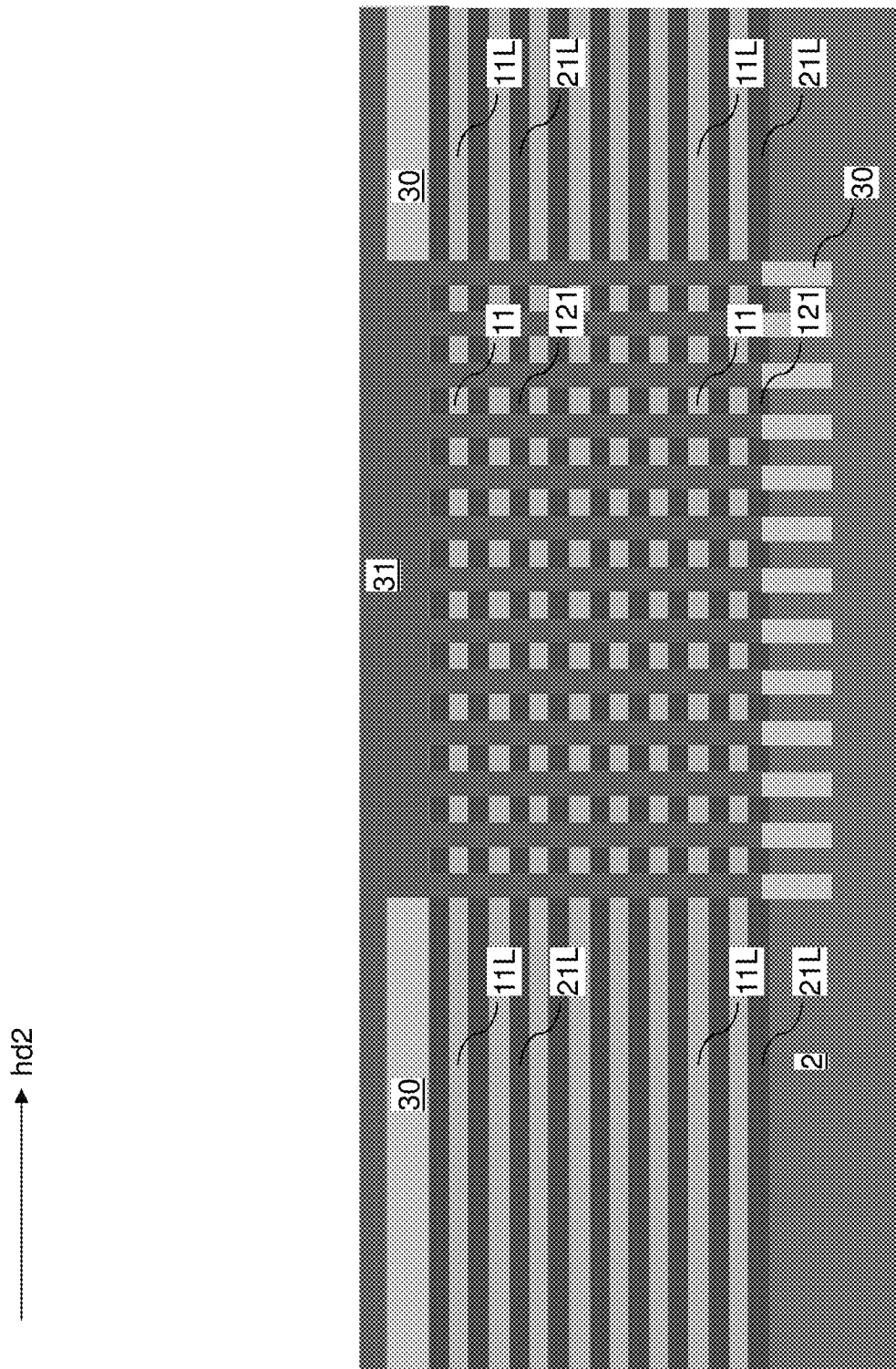
FIG. 7C is a third schematic vertical cross-sectional view of the exemplary structure of FIGS. 7A and 7B.
Figure 7D:
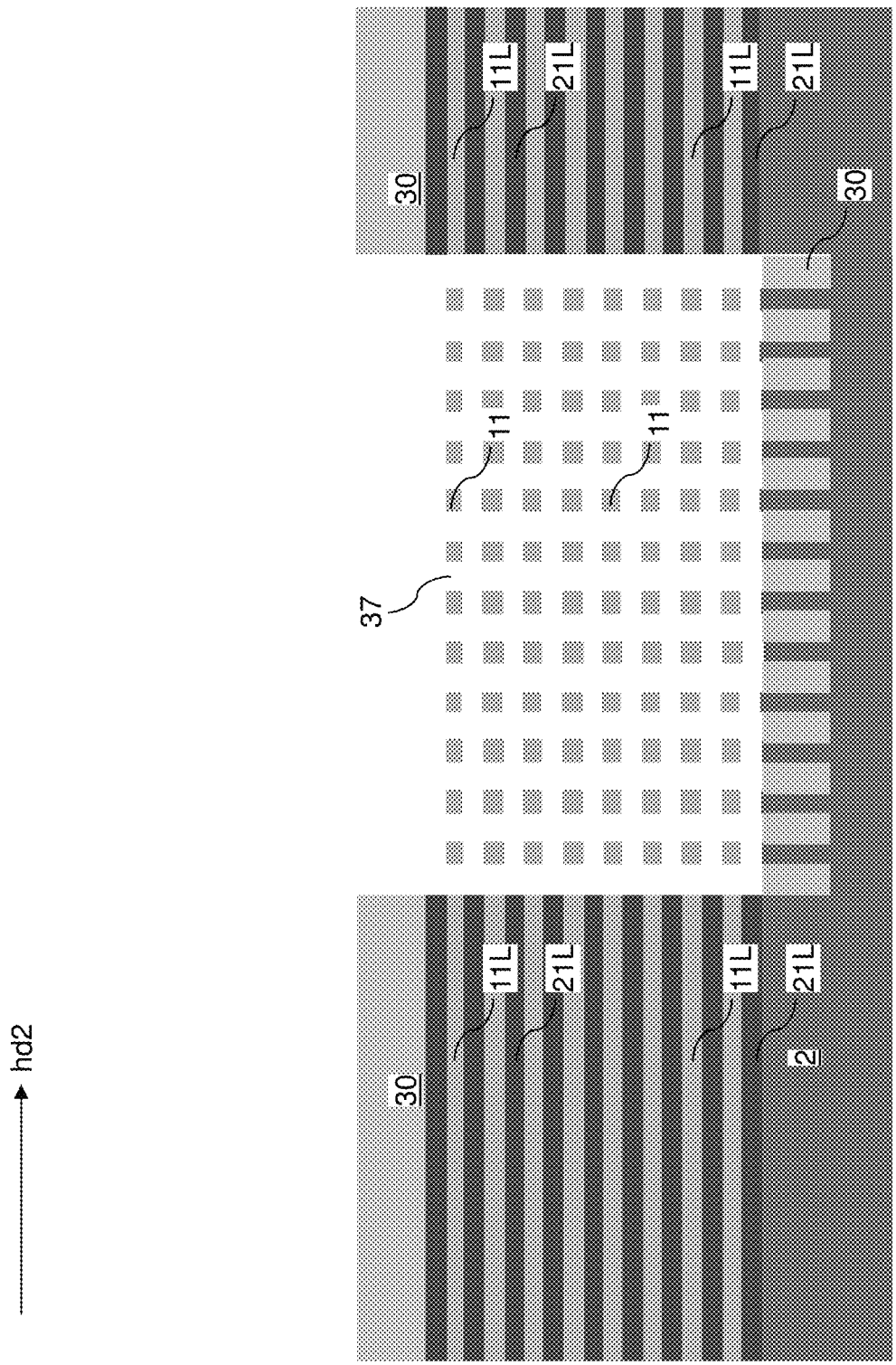
FIG. 7D is a fourth schematic vertical cross-sectional view of the exemplary structure of FIGS. 7A-7C.
Figure 7E:
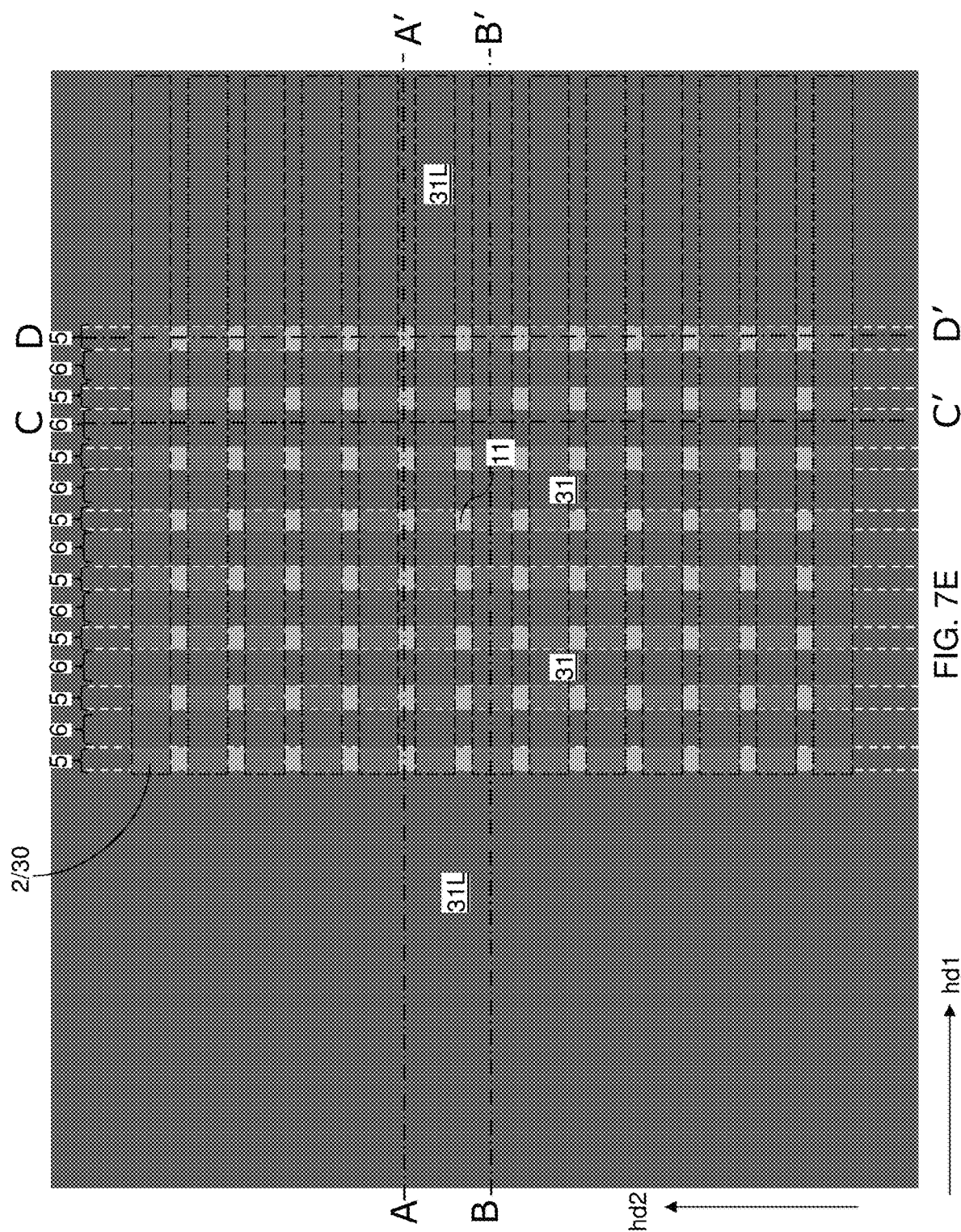
FIG. 7E is a top-down view of the exemplary structure of FIGS. 7A-7D. The vertical plane A-A' is the plane of the vertical cross-sectional view of FIG. 7A. The vertical plane B-B' is the plane of the vertical cross-sectional view of FIG. 7B. The vertical plane C-C' is the plane of the vertical cross-sectional view of FIG. 7C. The vertical plane D-D' is the plane of the vertical cross-sectional view of FIG. 7D.
Figure 8A:
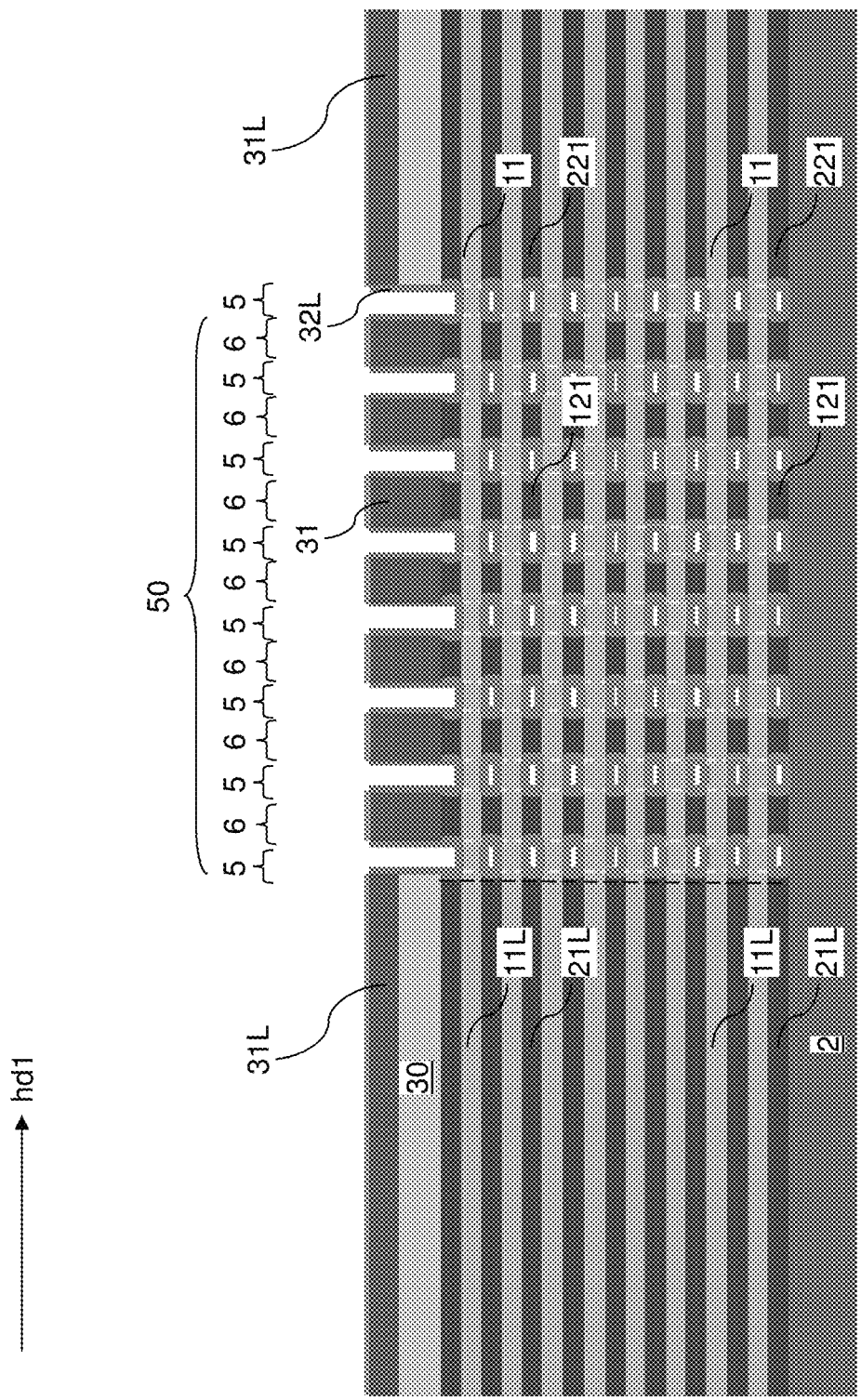
FIG. 8A is a first schematic vertical cross-sectional view of the exemplary structure within a first vertical plane corresponding to the vertical plane A-A' in FIG. 7E after deposition of a diffusion barrier material layer according to an embodiment of the present disclosure.
Figure 8B:
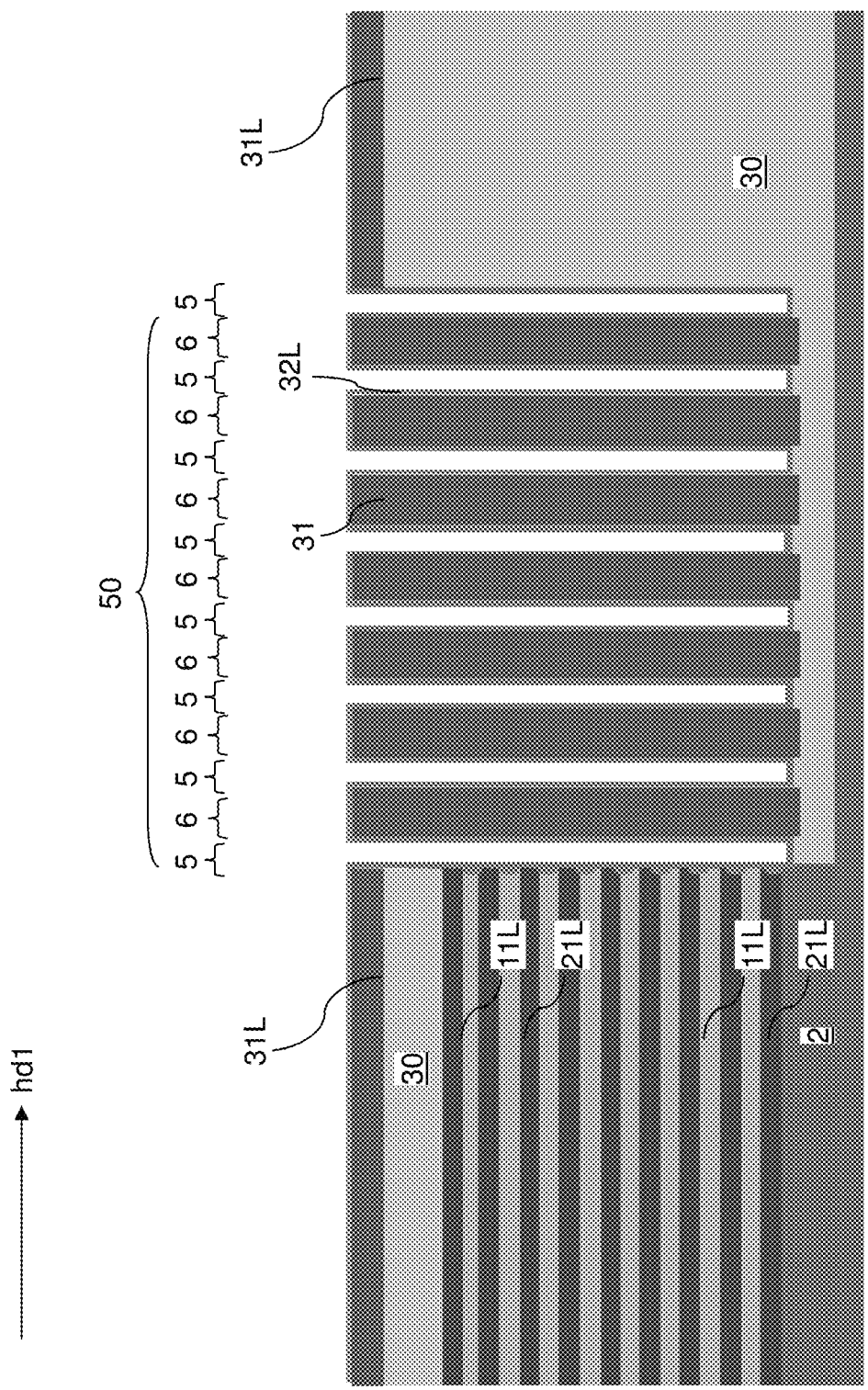
FIG. 8B is a second schematic vertical cross-sectional view of the exemplary structure of FIG. 8A within a second vertical plane corresponding to the vertical plane B-B' in FIG. 7E.
Figure 8C:
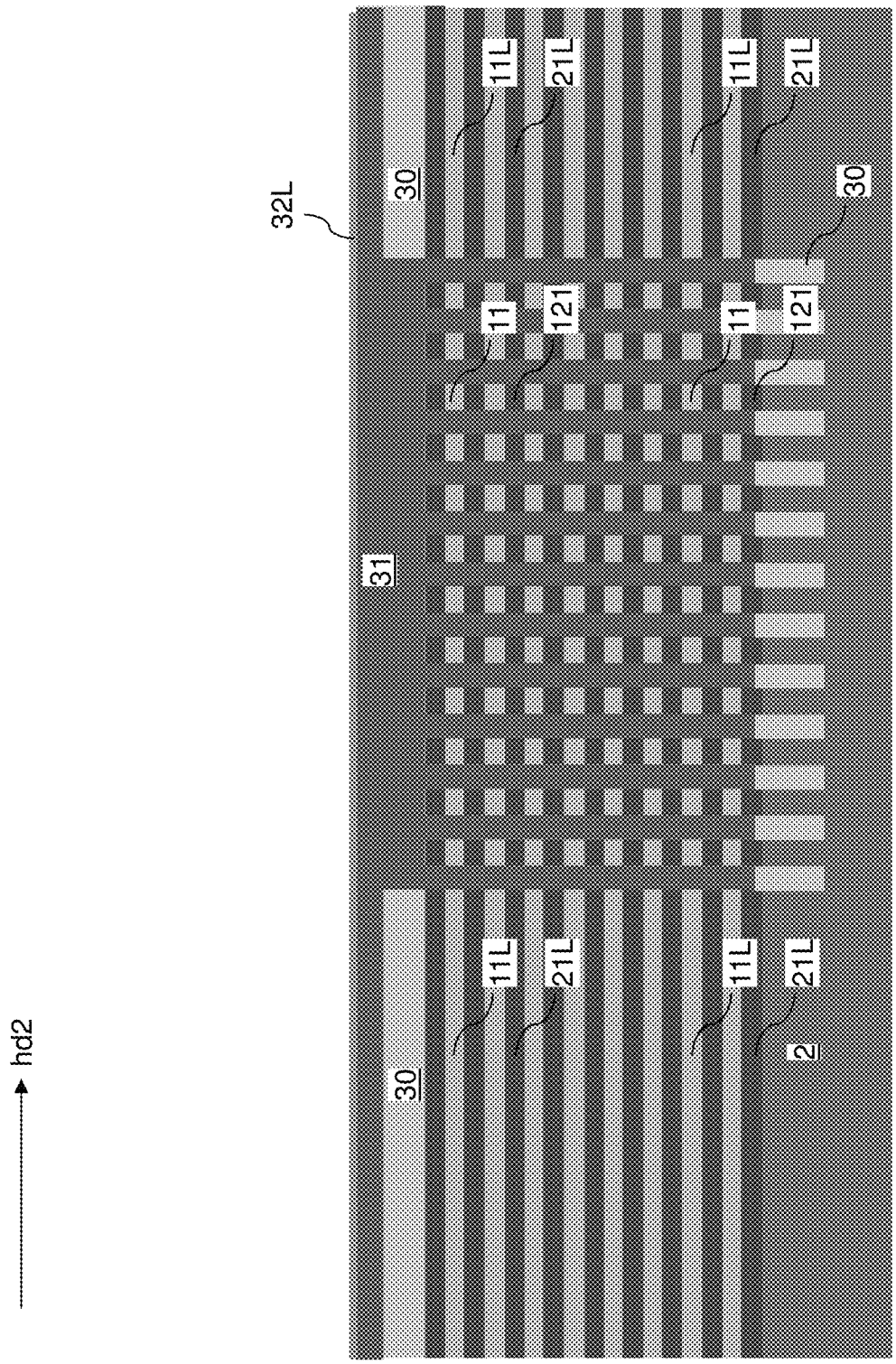
FIG. 8C is a third schematic vertical cross-sectional view of the exemplary structure of FIGS. 8A and 8B within a third vertical plane corresponding to the vertical plane C-C' in FIG. 7E.
Figure 8D:
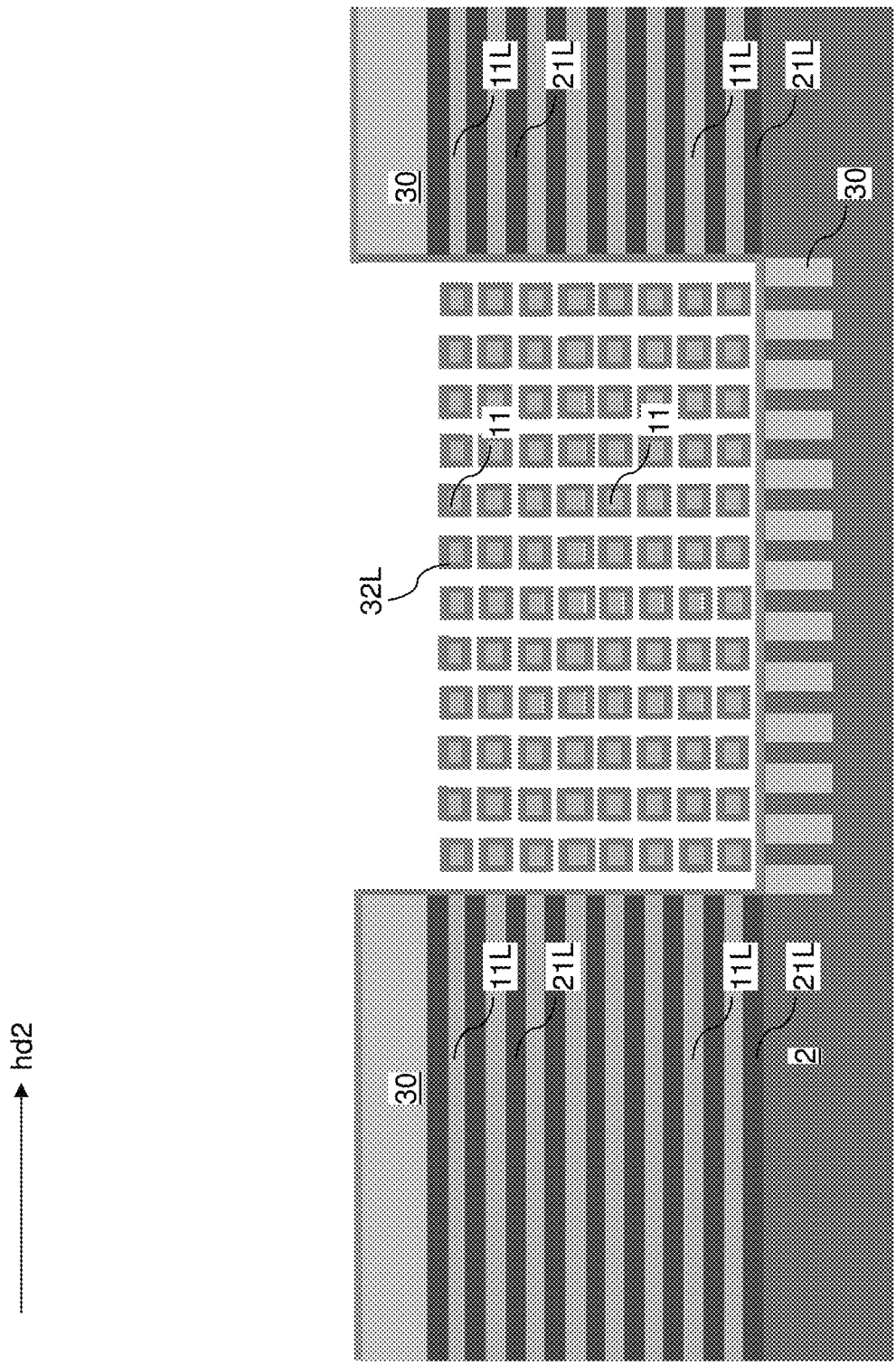
FIG. 8D is a fourth schematic vertical cross-sectional view of the exemplary structure of FIGS. 8A-8C within a fourth vertical plane corresponding to the vertical plane D-D' in FIG. 7E.
Figure 9A:
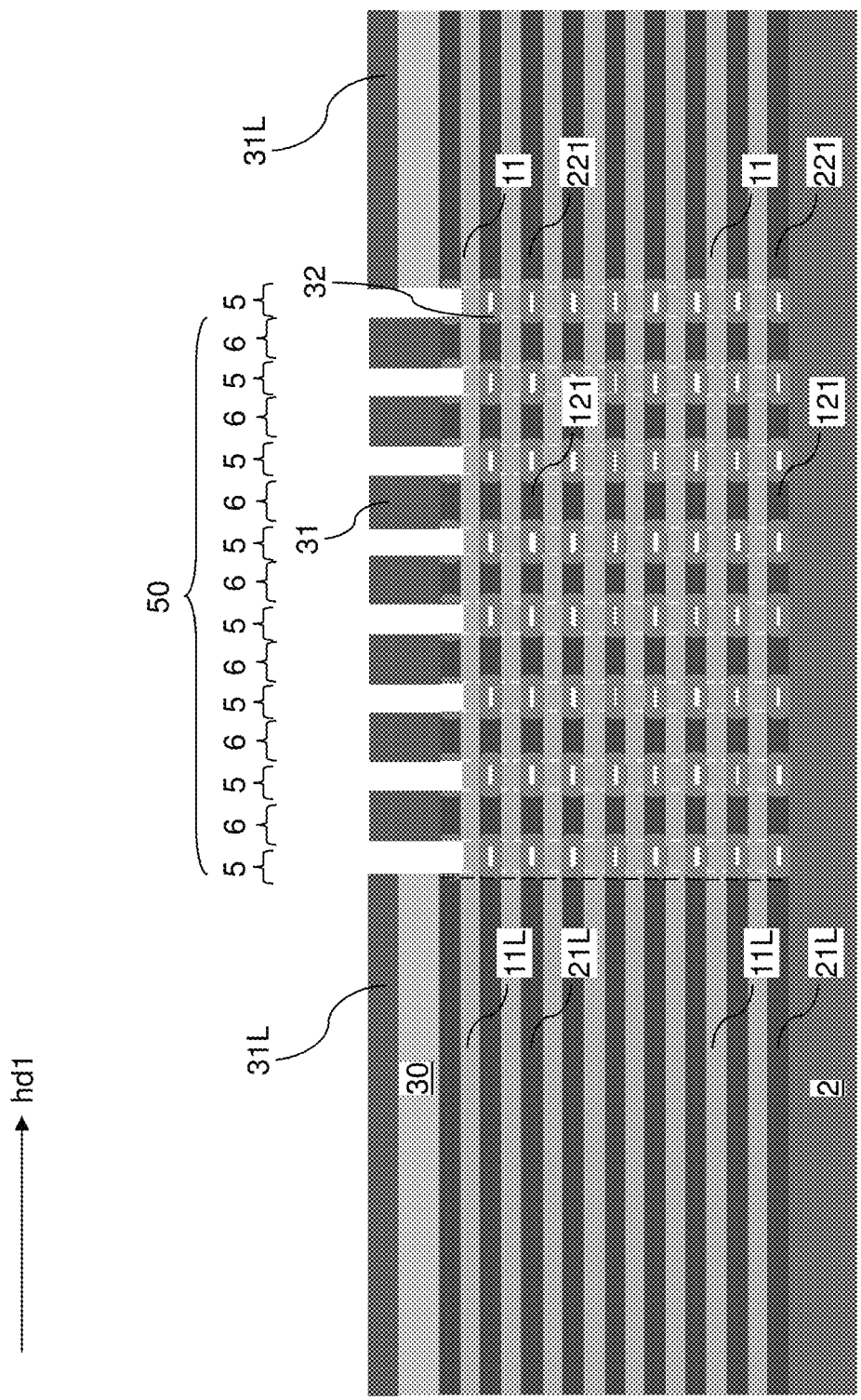
FIG. 9A is a first schematic vertical cross-sectional view of the exemplary structure within a first vertical plane corresponding to the vertical plane A-A' in FIG. 7E after formation of tubular diffusion barrier material portions by an anisotropic etch according to an embodiment of the present disclosure.
Figure 9B:
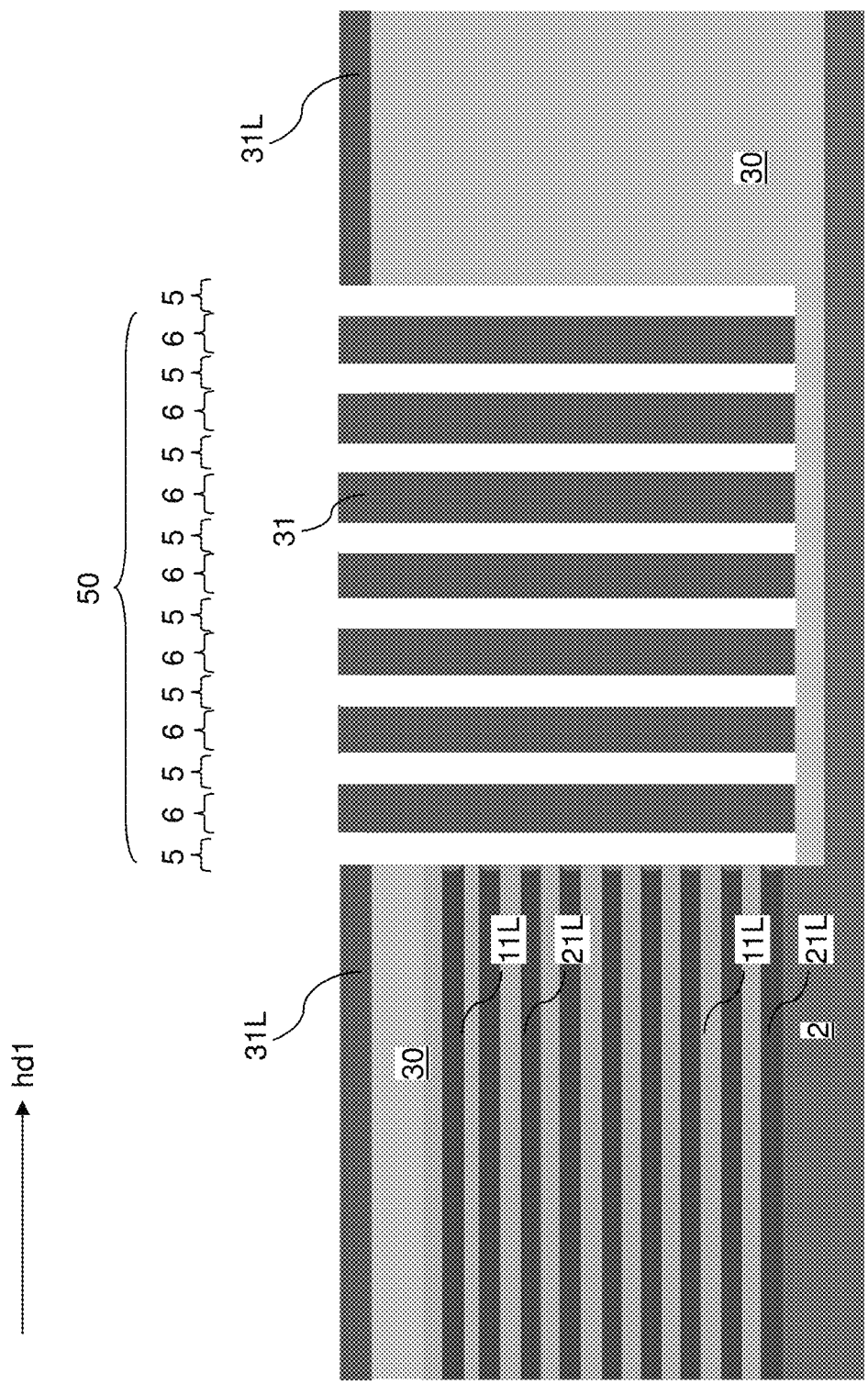
FIG. 9B is a second schematic vertical cross-sectional view of the exemplary structure of FIG. 9A within a second vertical plane corresponding to the vertical plane B-B' in FIG. 7E.
Figure 9C:
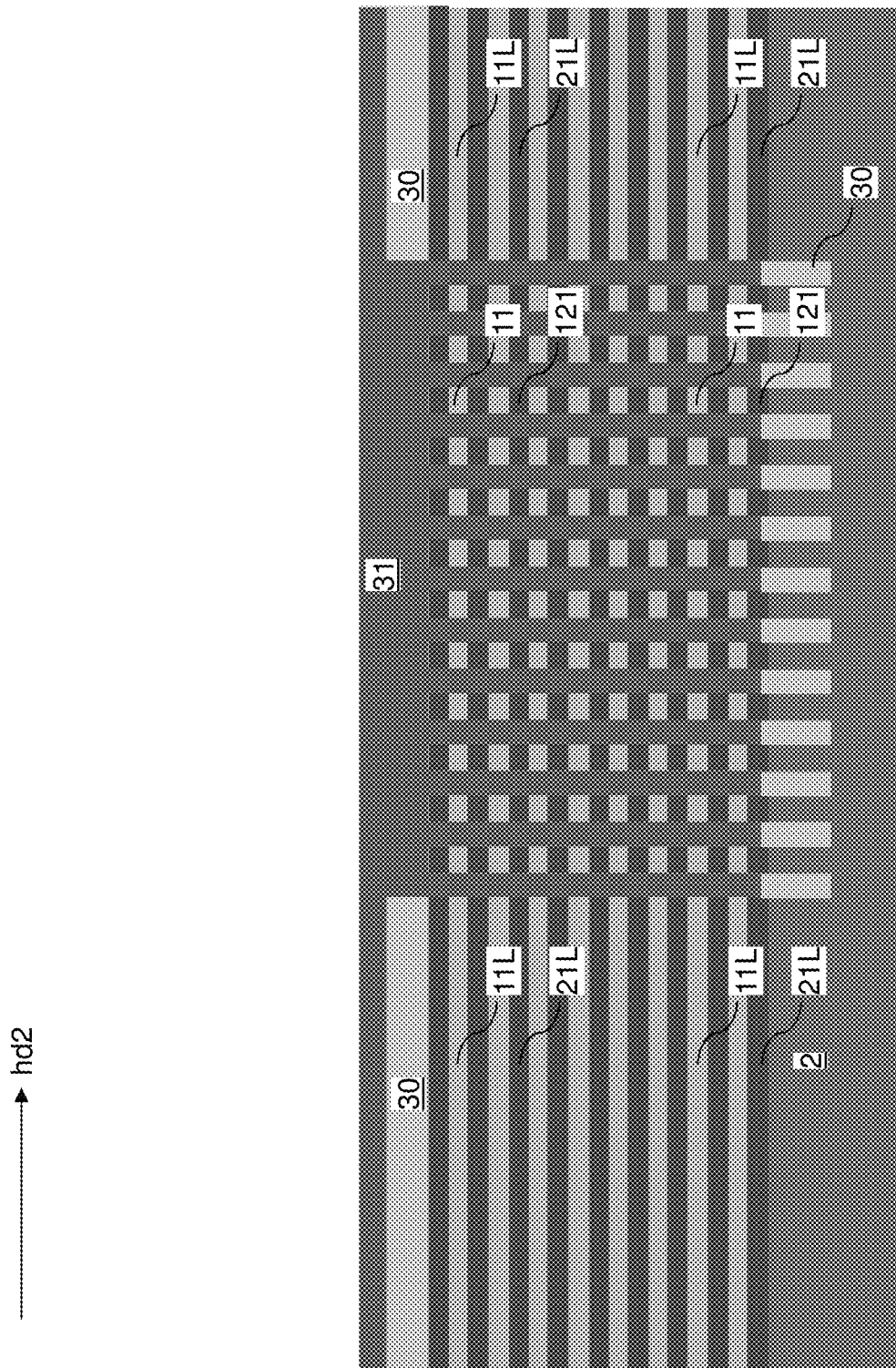
FIG. 9C is a third schematic vertical cross-sectional view of the exemplary structure of FIGS. 9A and 9B within a third vertical plane corresponding to the vertical plane C-C' in FIG. 7E.
Figure 9D:
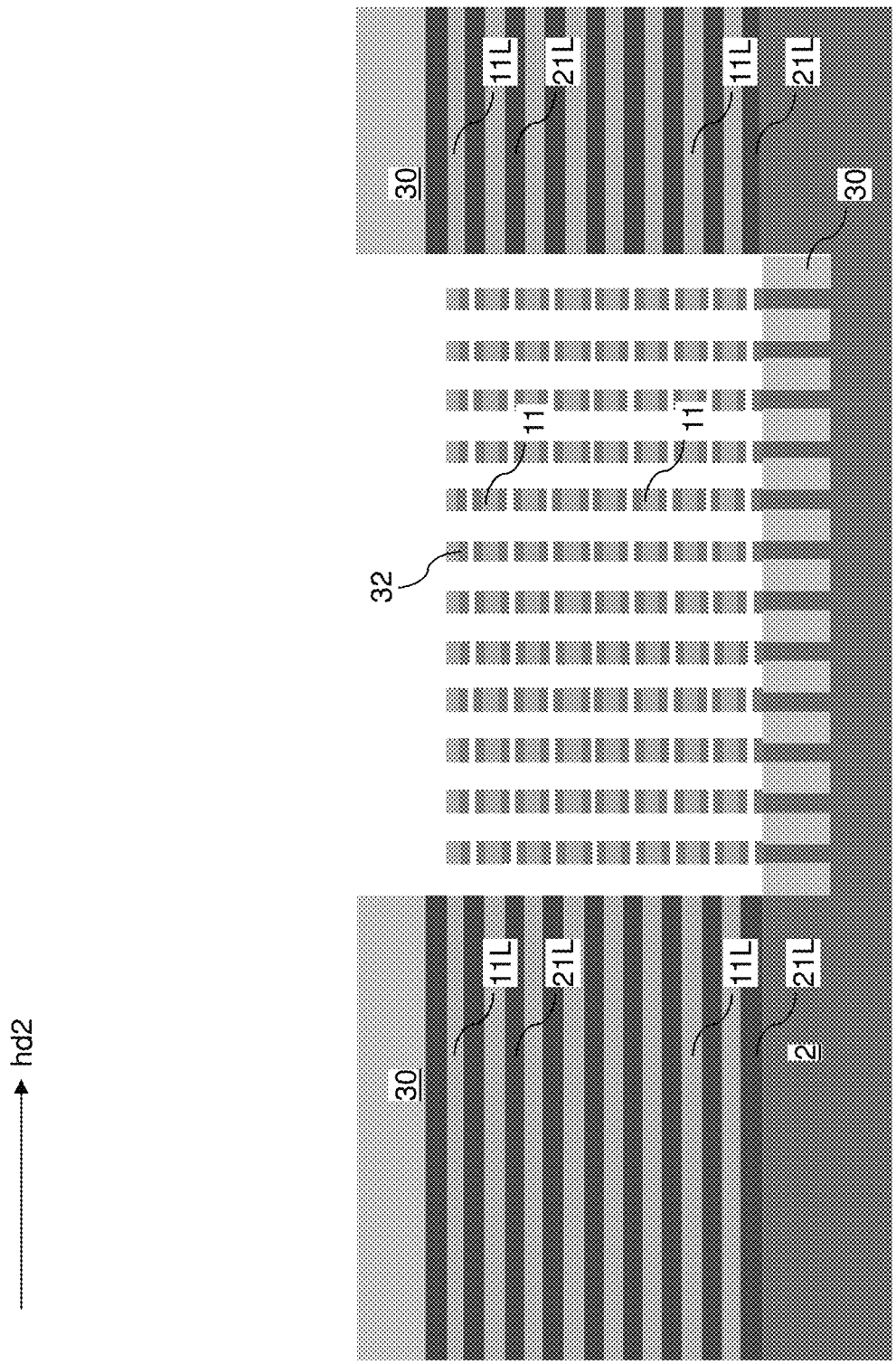
FIG. 9D is a fourth schematic vertical cross-sectional view of the exemplary structure of FIGS. 9A-9C within a fourth vertical plane corresponding to the vertical plane D-D' in FIG. 7E.

Each patterned portion of the sacrificial matrix material structure 31M that remains in the NAND gate region 50 constitutes a sacrificial multi-fingered gate structure 31. The remaining portion of the sacrificial matrix material structure 31M that remains outside the NAND gate region 50 constitutes a sacrificial matrix material layer 31L. The sacrificial multi-fingered gate structures 31 are laterally spaced apart along the first horizontal direction hd1. Volumes from which the material of the sacrificial matrix material structure 31M are removed constitute a two-dimensional array of vertically-extending cavities 39. The two-dimensional array of vertically-extending cavities 39 include multiple rows of vertically-extending cavities 39. Each row of vertically-extending cavities 39 can be arranged along the second horizontal direction hd2. The rows of vertically-extending cavities 39 and the sacrificial multi-fingered gate structures 31 alternate along the first horizontal direction hd1. The cavities 39 can extend to the lower portion of the dielectric matrix 30 above the substrate 2, as shown in FIG. 6B or through the entire dielectric matrix 30 to expose the substrate 2, as shown in FIGS. 7D and 7E which are described below. Each of the sacrificial multi-fingered gate structures 31 includes a respective sacrificial horizontal bar 31B which overlies the vertically alternating sequence of the silicon wires 11 and silicon-germanium wires 21, and extends along the second horizontal direction hd2. Further, each of the sacrificial multi-fingered gate structures 31 includes a respective set of vertically-extending sacrificial fingers 31F which is adjoined to a bottom portion of the respective sacrificial horizontal bar and spaced apart along the second horizontal direction hd2 by the silicon wires 11 and the silicon-germanium wires 21.

Referring to FIGS. 7A-7E, portions of the silicon-germanium wires 21 that are not covered by the sacrificial multi-fingered gate structures 31 are removed from the NAND gate region 50. Specifically, portions of the silicon-germanium wires 21 that are adjacent to the two-dimensional array of vertically-extending cavities 39 can be removed by an isotropic etch process that etches the silicon-germanium alloy material of the physically exposed portions of the silicon-germanium wires 21 selective to the silicon material of the silicon wires 11. The wet etching medium is provided into the cavities 39 to etch the silicon-germanium wires 21. For example, a wet etch using a combination of a dilute hydrofluoric acid and hydrogen peroxide etching medium can be employed to remove the physically exposed portions of the silicon-germanium wires 21 selective to the silicon material of the silicon wires 11. Nested cavities 37 are formed in the combined volumes of the vertically-extending cavities 39 and volumes formed by removal of the material of the silicon-germanium wires 21. Each of the nested cavities 37 can include a respective row of vertically-extending cavities 39 and a respective subset of volumes from which the portions of the silicon-germanium wires 21 are removed.

Each silicon-germanium wire 21 can be divided into multiple portions arranged along the first horizontal direction hd1. The divided portions derived from each silicon-germanium wire 21 can include silicon-germanium blocks 121 that underlie the sacrificial multi-fingered gate structures 31 and a silicon-germanium wire segment 221 located outside of the area of the NAND gate region 50 and located on an opposite side of the vertically alternating stack of the silicon plate portions 11L and the silicon-germanium plate portions 21L. Each nested cavity 37 laterally surrounds a two-dimensional array of silicon wires 11. Thus, each silicon wire 11 is laterally surrounded by each of the nested cavities 37, as shown in FIGS. 7D and 7E. Each of the silicon wires 11 can have a rectangular vertical cross-sectional shape along the direction perpendicular to the first horizontal direction hd1 at this step.

Referring to FIGS. 8A-8D, a diffusion barrier material layer 32L can be deposited on the physically exposed surfaces of the silicon wires 11, the silicon-germanium blocks 121, the silicon-germanium plate portions 21L, the silicon-germanium wire segments 221, the dielectric matrix 30, the sacrificial multi-fingered gate structures 31, and the sacrificial matrix material layer 31L. The diffusion barrier material layer 32L includes a dielectric material that can function as a diffusion barrier material during a subsequent oxidation process. For example, the diffusion barrier material layer 32L can include a silicon nitride layer. The diffusion barrier material layer 32L can be deposited by low pressure chemical vapor deposition process, and can have a thickness in a range from 2 nm to 6 nm, although lesser and greater thicknesses can also be employed. The thickness of the diffusion barrier material layer 32L may be less than one half of the width between laterally neighboring pairs of silicon wires 11, less than one half of the vertical distance between vertically neighboring pairs of silicon wires 11, and less than one half of the minimum lateral dimension of each vertically-extending cavity 39 as formed at the processing steps of FIGS. 6A and 6B.

Referring to FIGS. 9A-9D, an anisotropic etch process that etches the material of the diffusion barrier material layer 32L can be performed to physically remove unmasked portions of the diffusion barrier material layer 32L. The diffusion barrier material layer 32L can be removed from above the sacrificial multi-fingered gate structures 31 and the sacrificial matrix material layer 31L and from inside the volumes of the vertically-extending cavities 39 as formed at the processing steps of FIGS. 6A and 6B. Remaining volumes of the diffusion barrier material layer 32L in the volumes previously occupied by removed portions of the silicon-germanium wires 21 can have a respective tubular configuration, and are herein referred to as tubular diffusion barrier material portions 32. The tubular diffusion barrier material portions 32 include an opening that extends along the second horizontal direction hd2 between each vertically neighboring pair of silicon wires 11 within the volumes from which the portions of the silicon-germanium wires 21 are removed.

Referring to FIGS. 10A-10D, a dielectric fill material, such as silicon oxide, can be deposited in remaining voids underlying the horizontal plane including the top surface of the sacrificial matrix material layer 31L. The dielectric fill material can be deposited by a conformal deposition process and/or a self-planarizing deposition process (such as spin-coating of a flowable oxide (FOX) material). Optionally, the deposited dielectric material can be recessed, for example, by a recess etch, to remove horizontal portions of the dielectric material deposited over the sacrificial matrix material layer 31L, such that the recessed surfaces are at about the level of the top surface of the dielectric matrix 30.

Figure 10A:
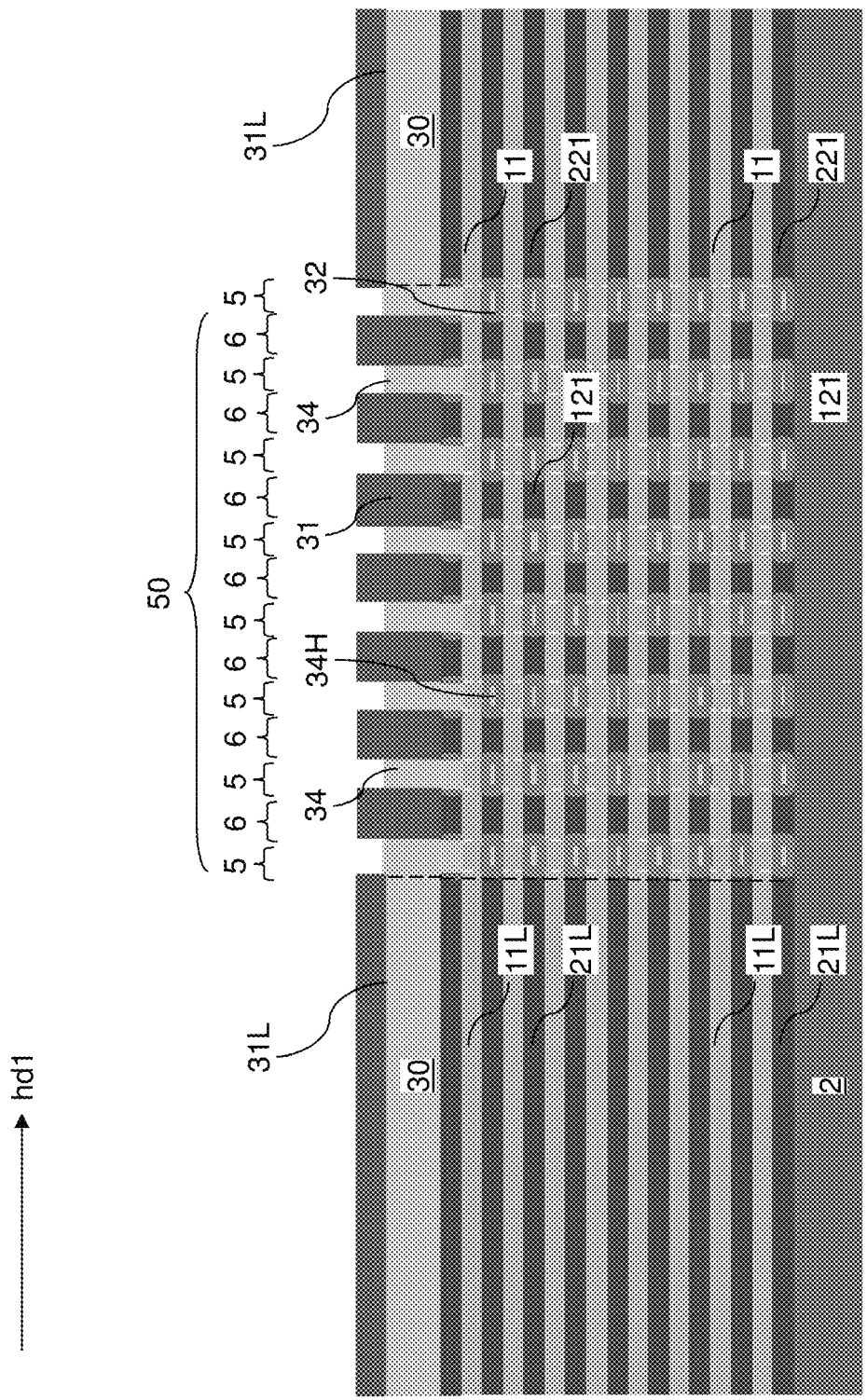
FIG. 10A is a first schematic vertical cross-sectional view of the exemplary structure within a first vertical plane corresponding to the vertical plane A-A' in FIG. 7E after formation of perforated dielectric wall structures according to an embodiment of the present disclosure.
Figure 10B:
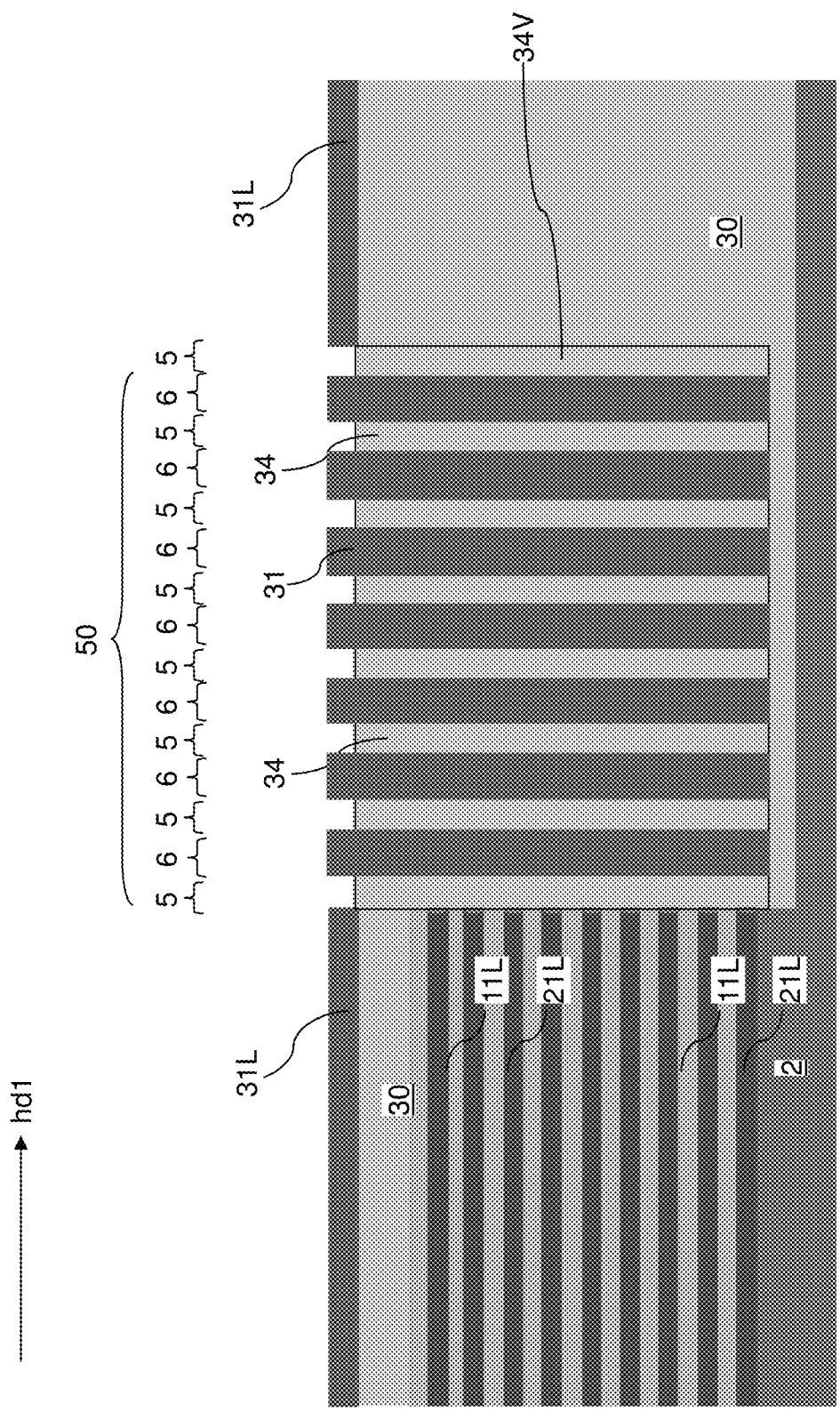
FIG. 10B is a second schematic vertical cross-sectional view of the exemplary structure of FIG. 10A within a second vertical plane corresponding to the vertical plane B-B' in FIG. 7E.
Figure 10C:
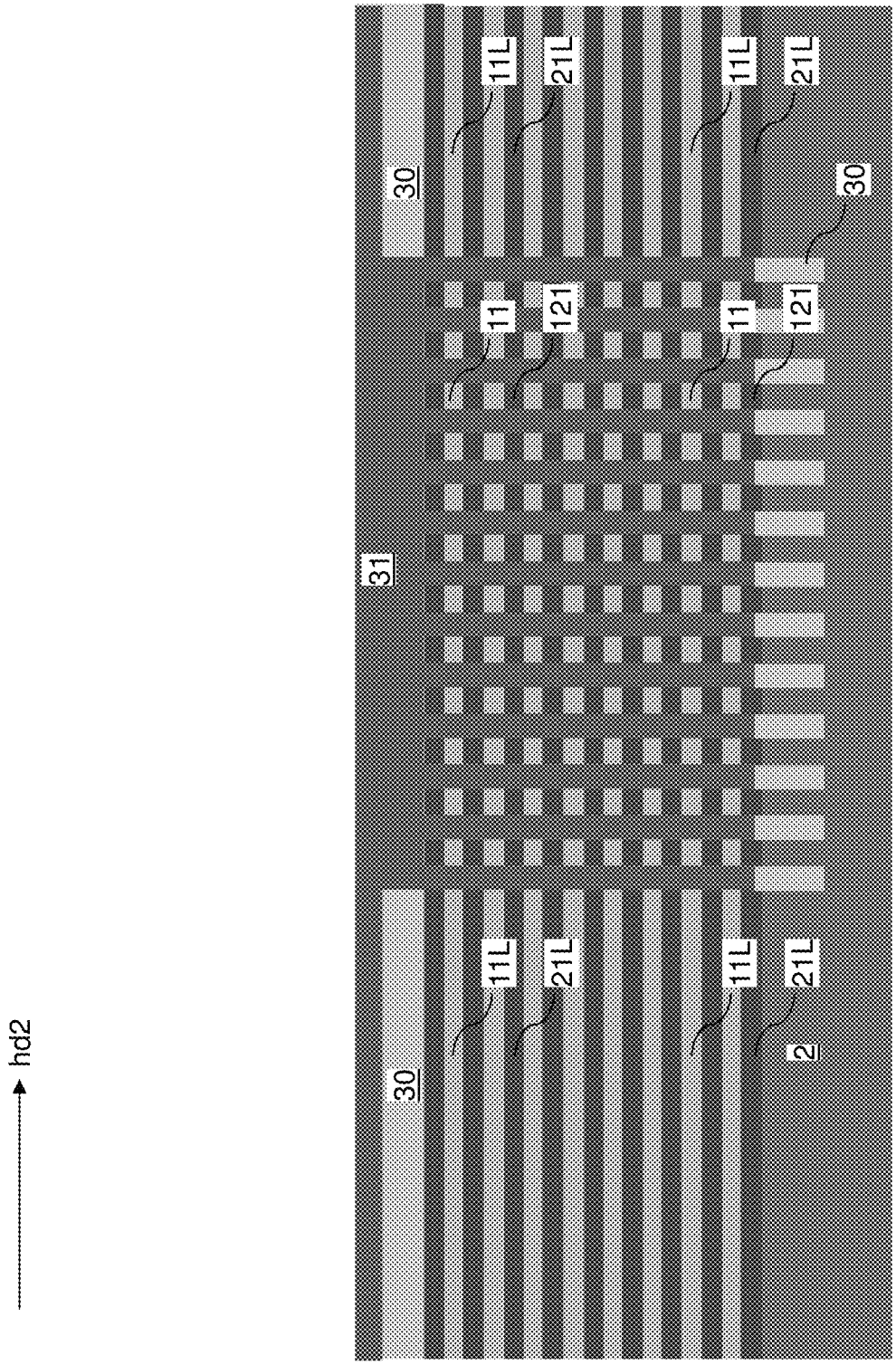
FIG. 10C is a third schematic vertical cross-sectional view of the exemplary structure of FIGS. 10A and 10B within a third vertical plane corresponding to the vertical plane C-C' in FIG. 7E.
Figure 10D:
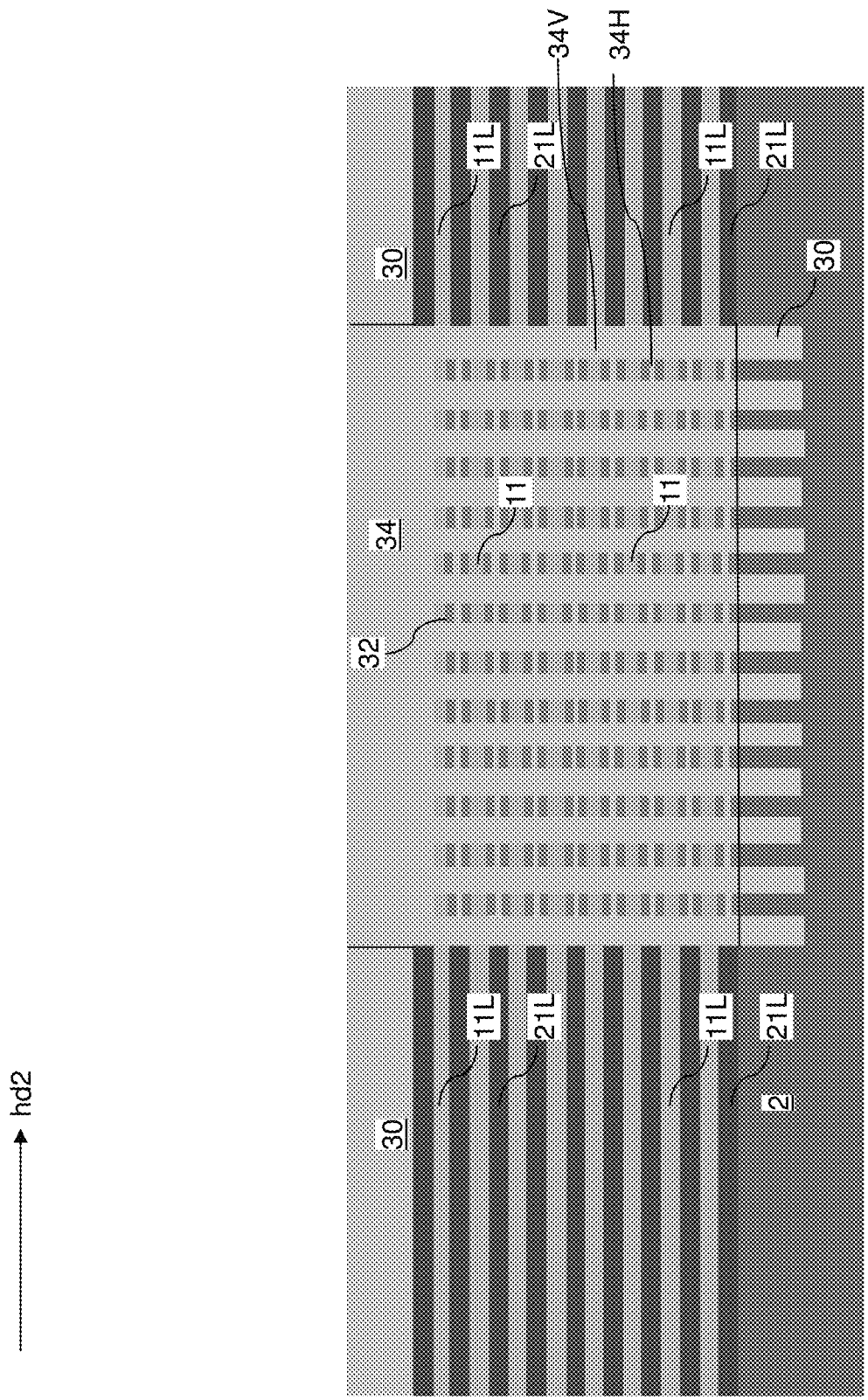
FIG. 10D is a fourth schematic vertical cross-sectional view of the exemplary structure of FIGS. 10A-10C within a fourth vertical plane corresponding to the vertical plane D-D' in FIG. 7E.
Figure 11A:
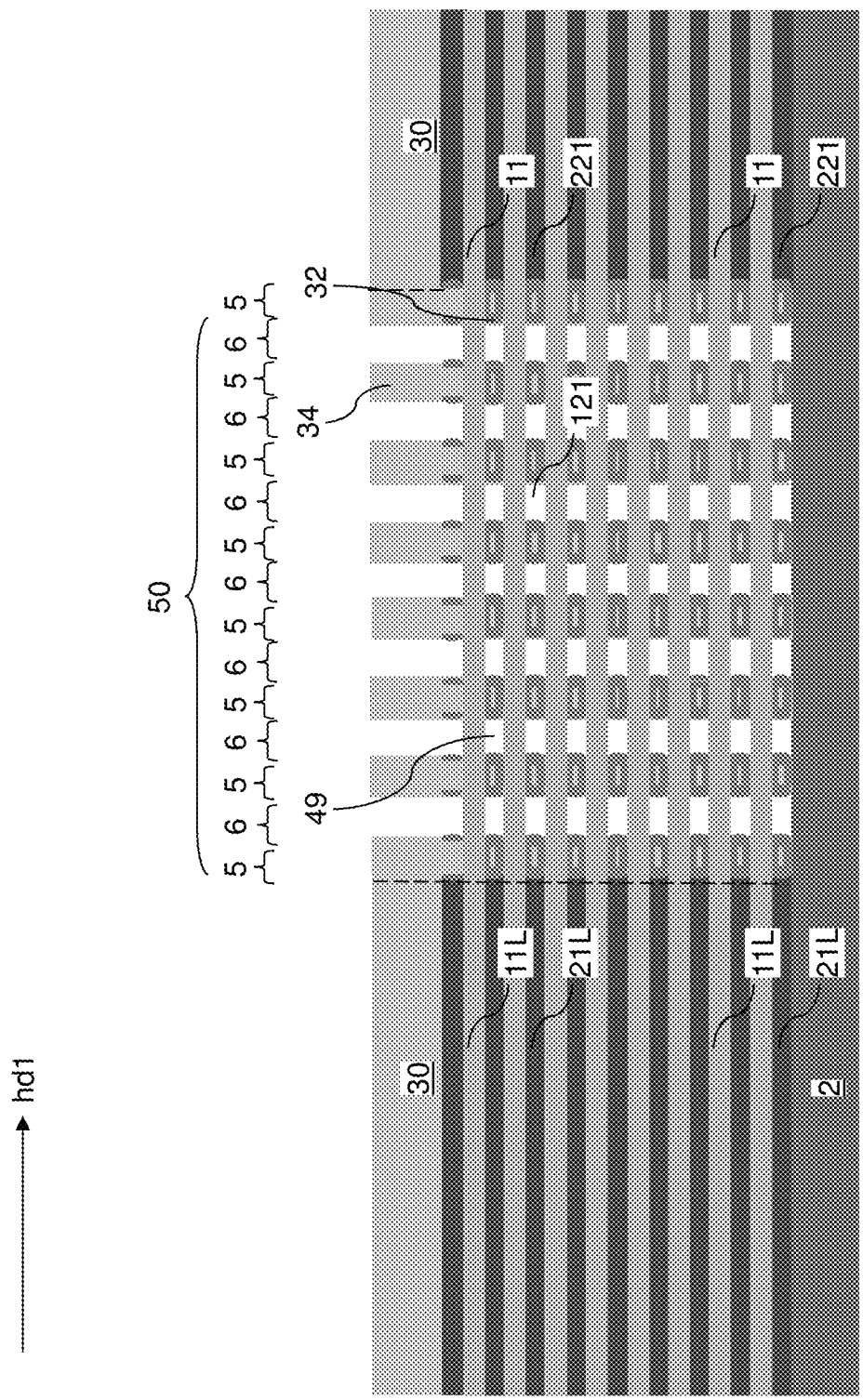
FIG. 11A is a first schematic vertical cross-sectional view of the exemplary structure after removal of the sacrificial multi-fingered gate structures from the NAND gate region and portions of the silicon-germanium wires that are laterally exposed after removal of the sacrificial multi-fingered gate structures according to an embodiment of the present disclosure.
Figure 11C:
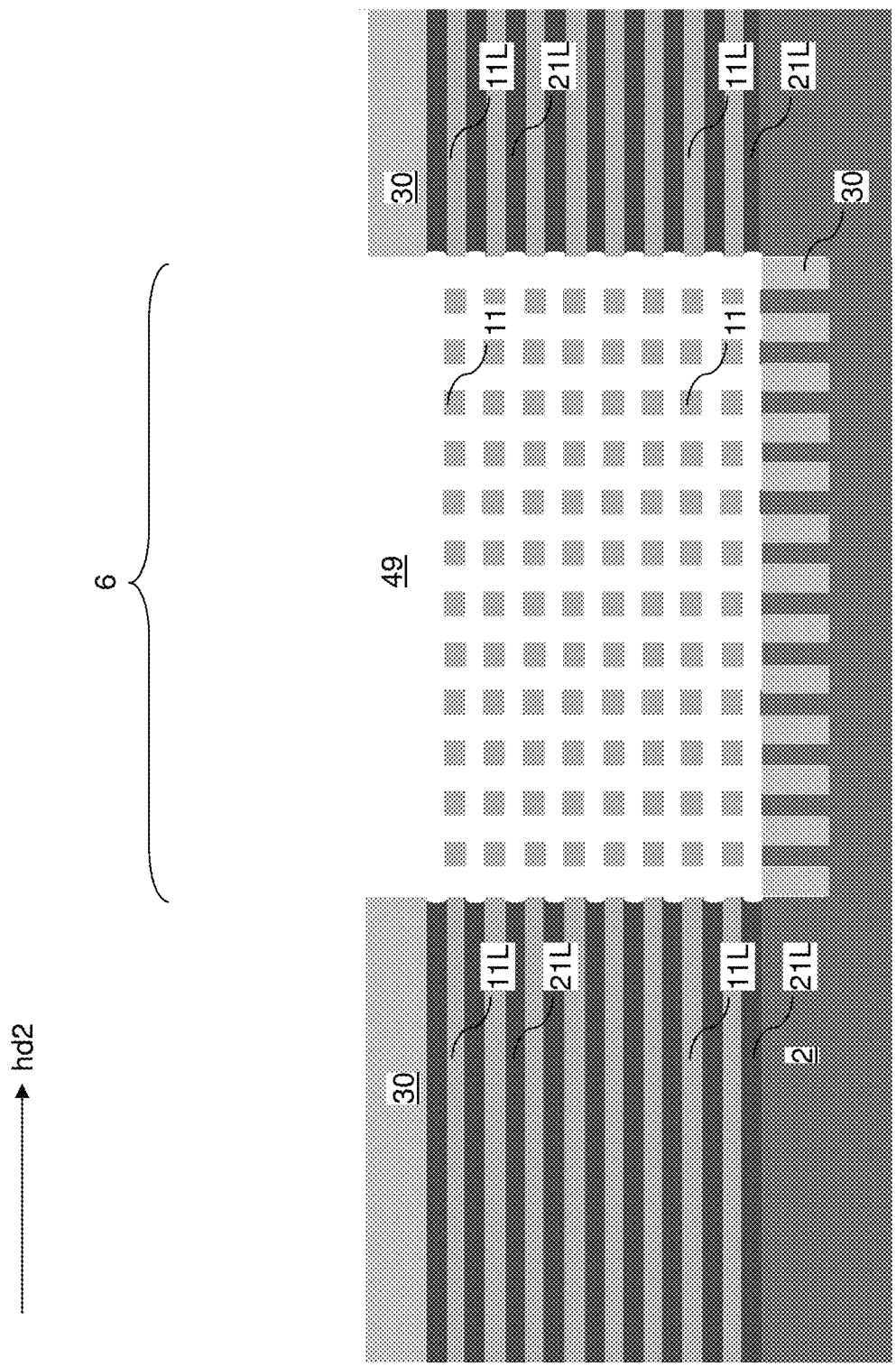
FIG. 11C is a third schematic vertical cross-sectional view of the exemplary structure of FIGS. 11A and 11B.
Figure 11D:
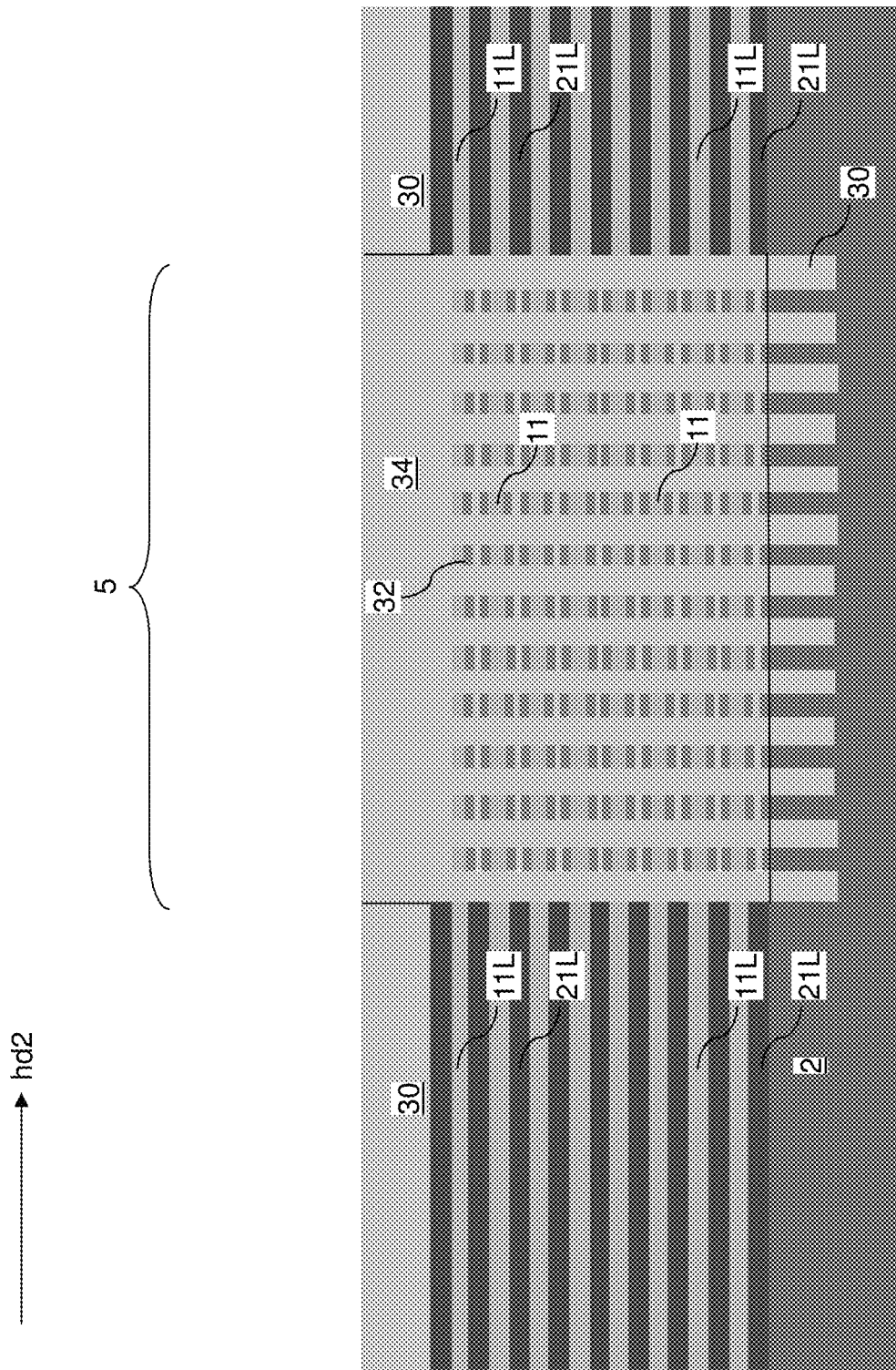
FIG. 11D is a fourth schematic vertical cross-sectional view of the exemplary structure of FIGS. 11A-11C.
Figure 11E:
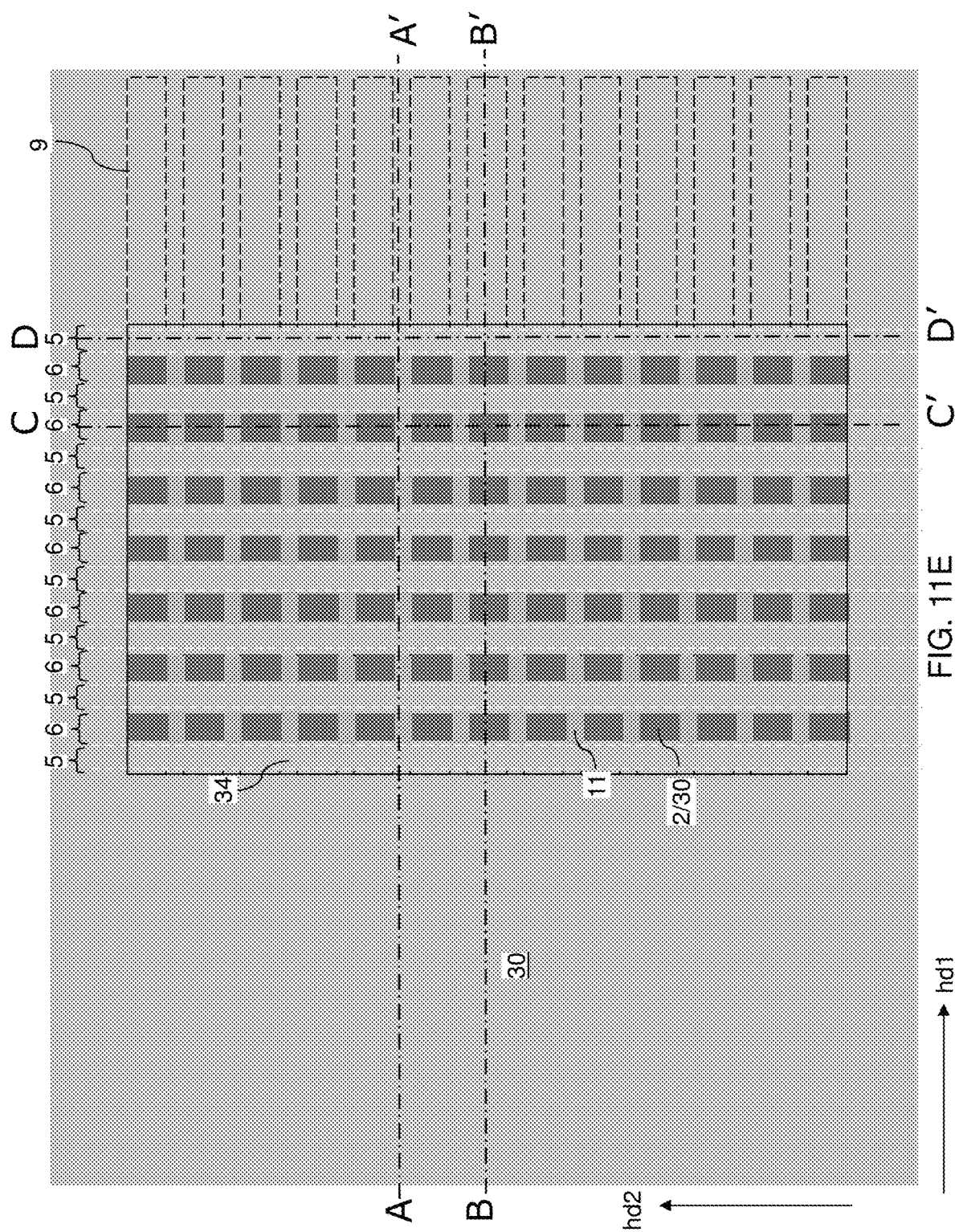
FIG. 11E is a top-down view of the exemplary structure of FIGS. 11A-11D. The vertical plane A-A' is the plane of the vertical cross-sectional view of FIG. 11A. The vertical plane B-B' is the plane of the vertical cross-sectional view of FIG. 11B. The vertical plane C-C' is the plane of the vertical cross-sectional view of FIG. 11C. The vertical plane D-D' is the plane of the vertical cross-sectional view of FIG. 11D.
Figure 12A:
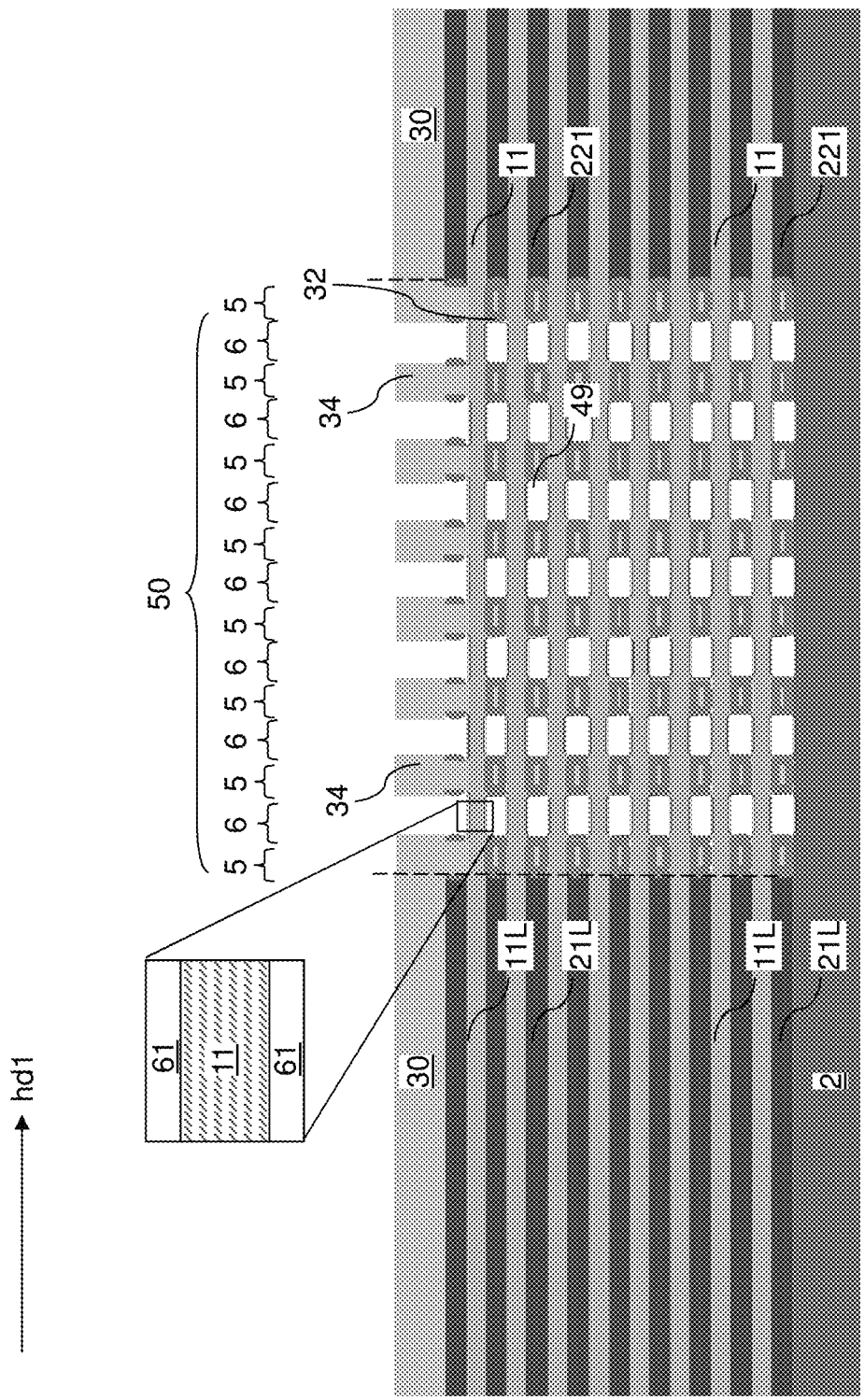
FIG. 12A is a first schematic vertical cross-sectional view of the exemplary structure within a first vertical plane corresponding to the vertical plane A-A' in FIG. 11E after surface oxidation of physically exposed portions of the silicon wires according to an embodiment of the present disclosure.
Figure 12B:
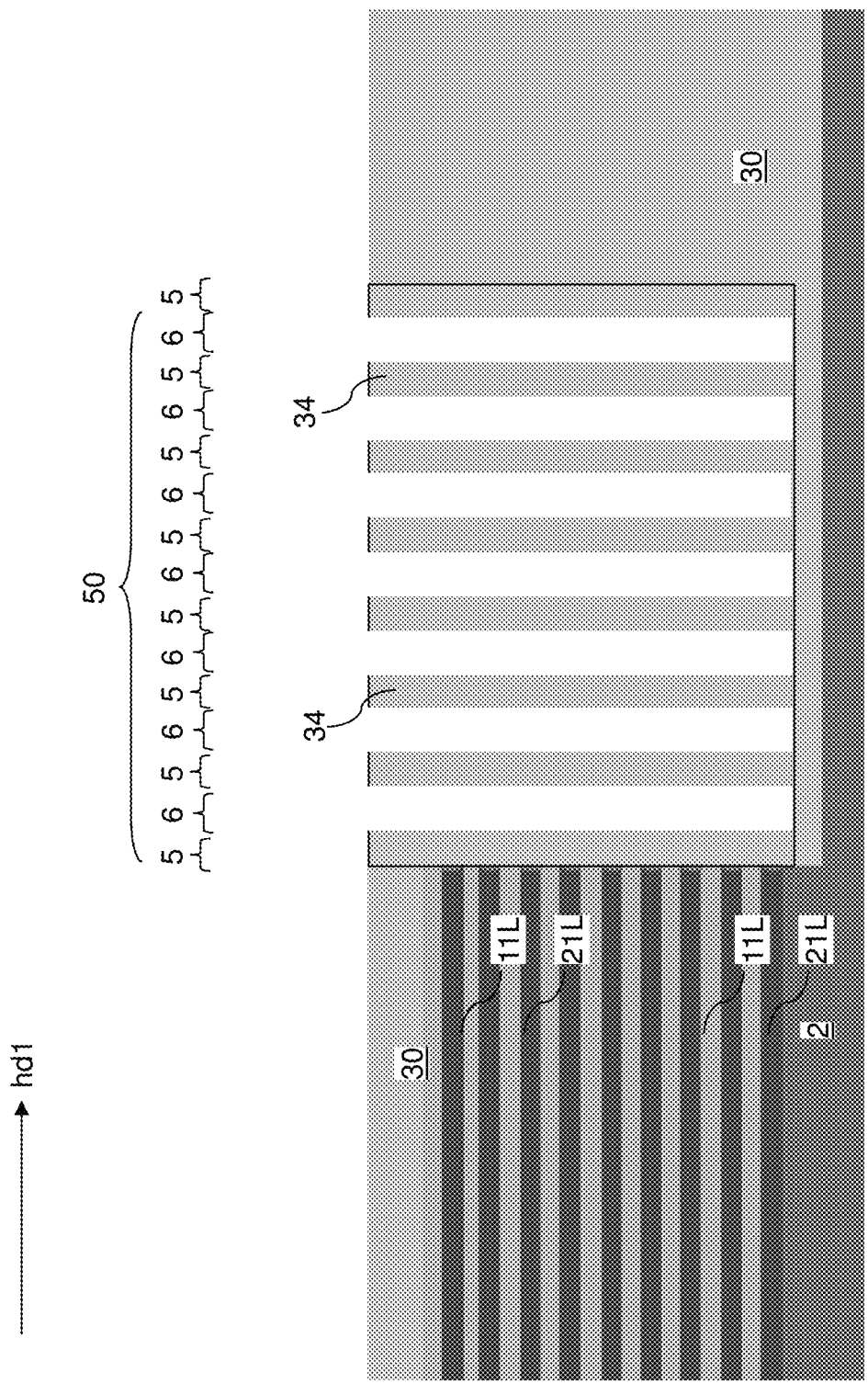
FIG. 12B is a second schematic vertical cross-sectional view of the exemplary structure of FIG. 12A within a second vertical plane corresponding to the vertical plane B-B' in FIG. 11E.
Figure 12C:
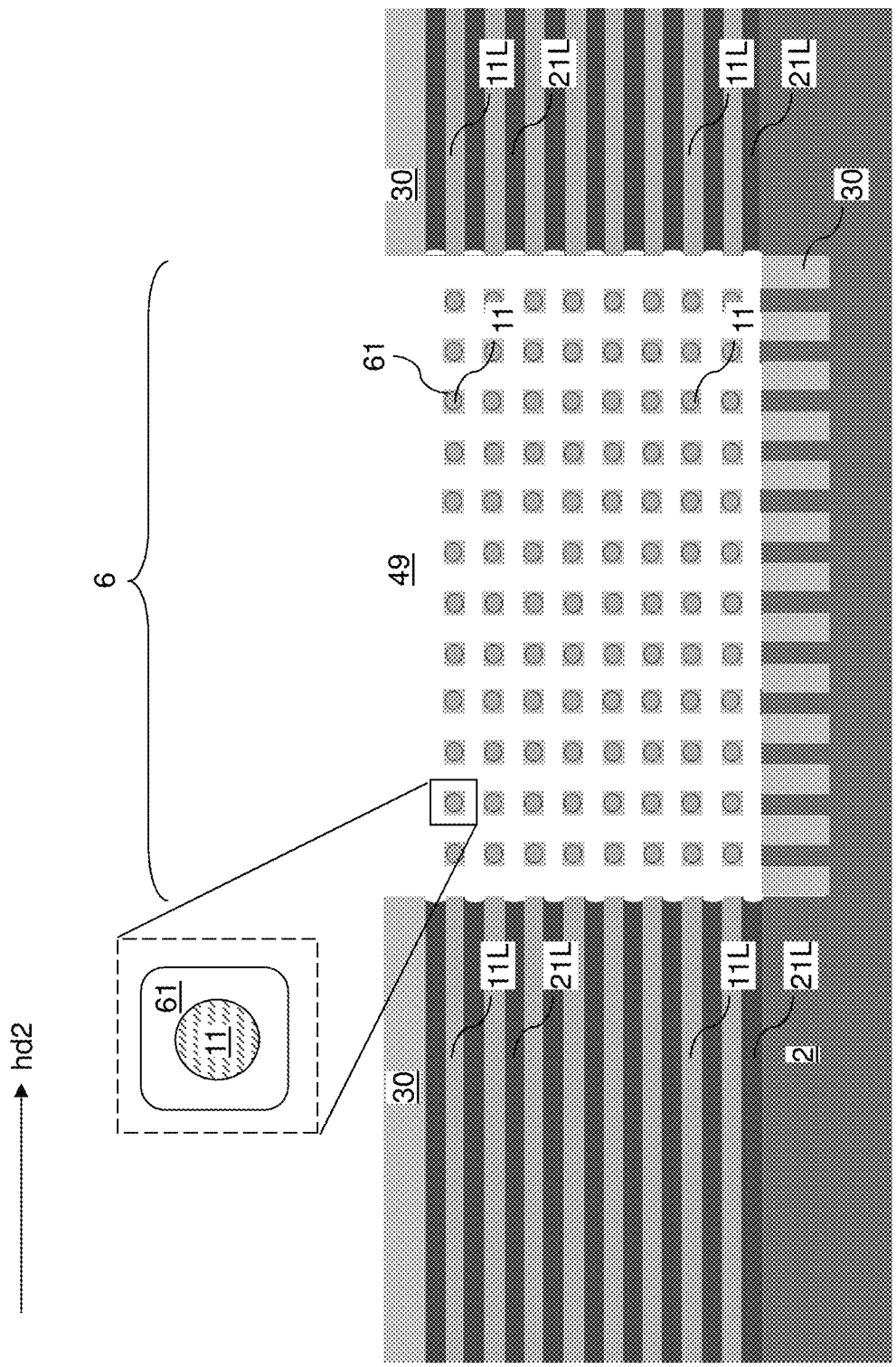
FIG. 12C is a third schematic vertical cross-sectional view of the exemplary structure of FIGS. 12A and 12B within a third vertical plane corresponding to the vertical plane C-C' in FIG. 11E.
Figure 13A:
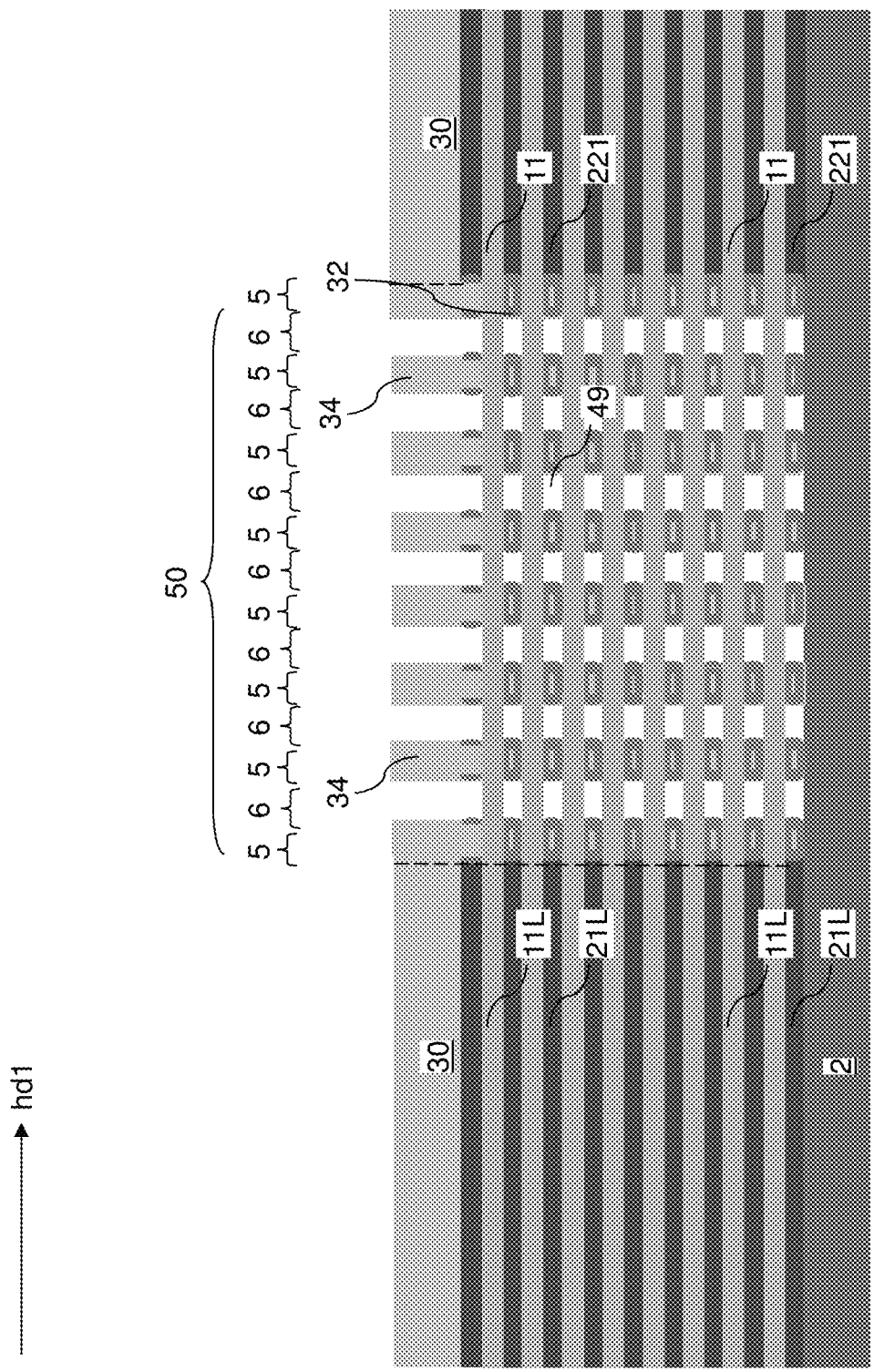
FIG. 13A is a first schematic vertical cross-sectional view of the exemplary structure within a first vertical plane corresponding to the vertical plane A-A' in FIG. 11E after removal of surface oxide portions according to an embodiment of the present disclosure.
Figure 13B:
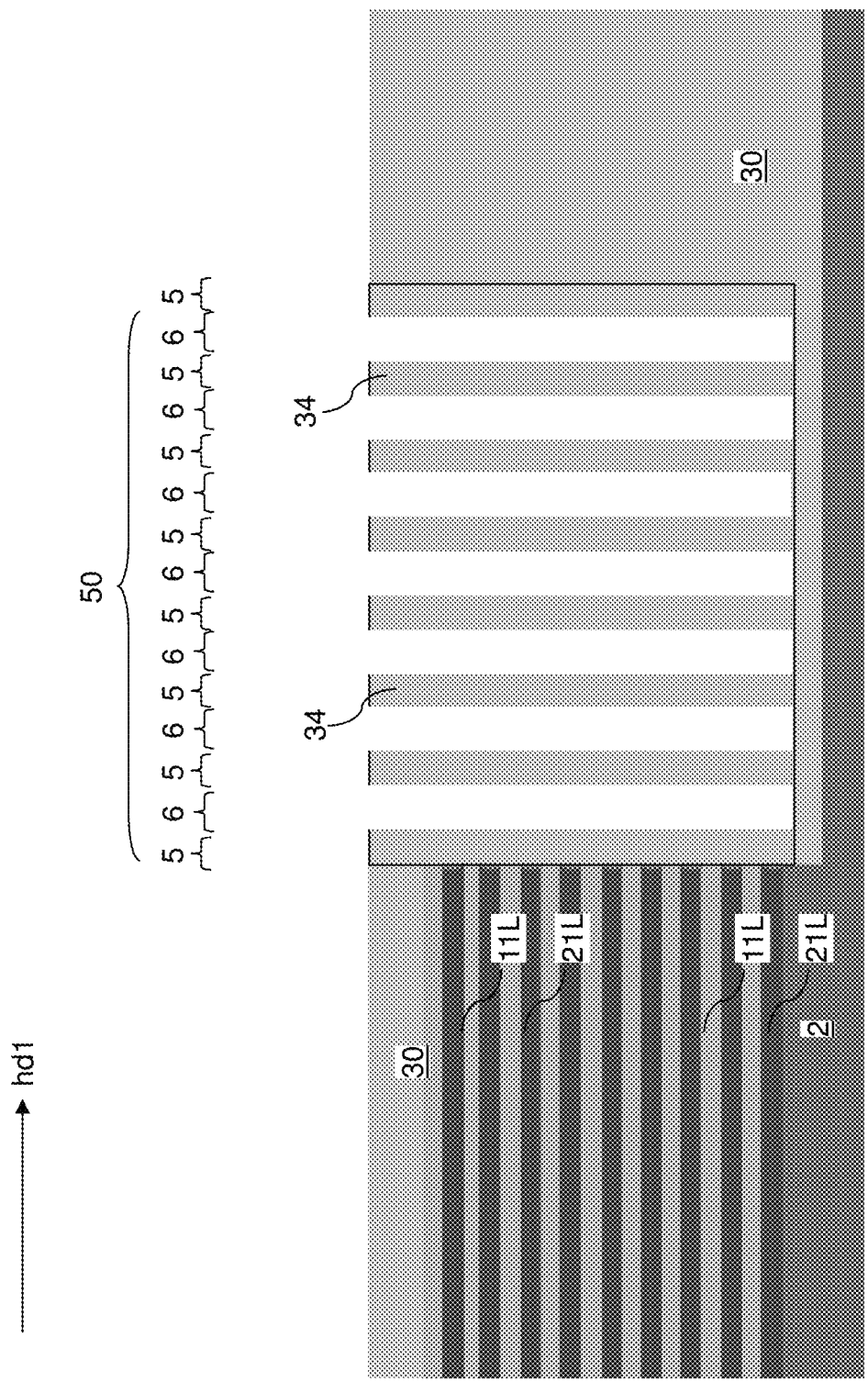
FIG. 13B is a second schematic vertical cross-sectional view of the exemplary structure of FIG. 13A within a second vertical plane corresponding to the vertical plane B-B' in FIG. 11E.
Figure 13C:
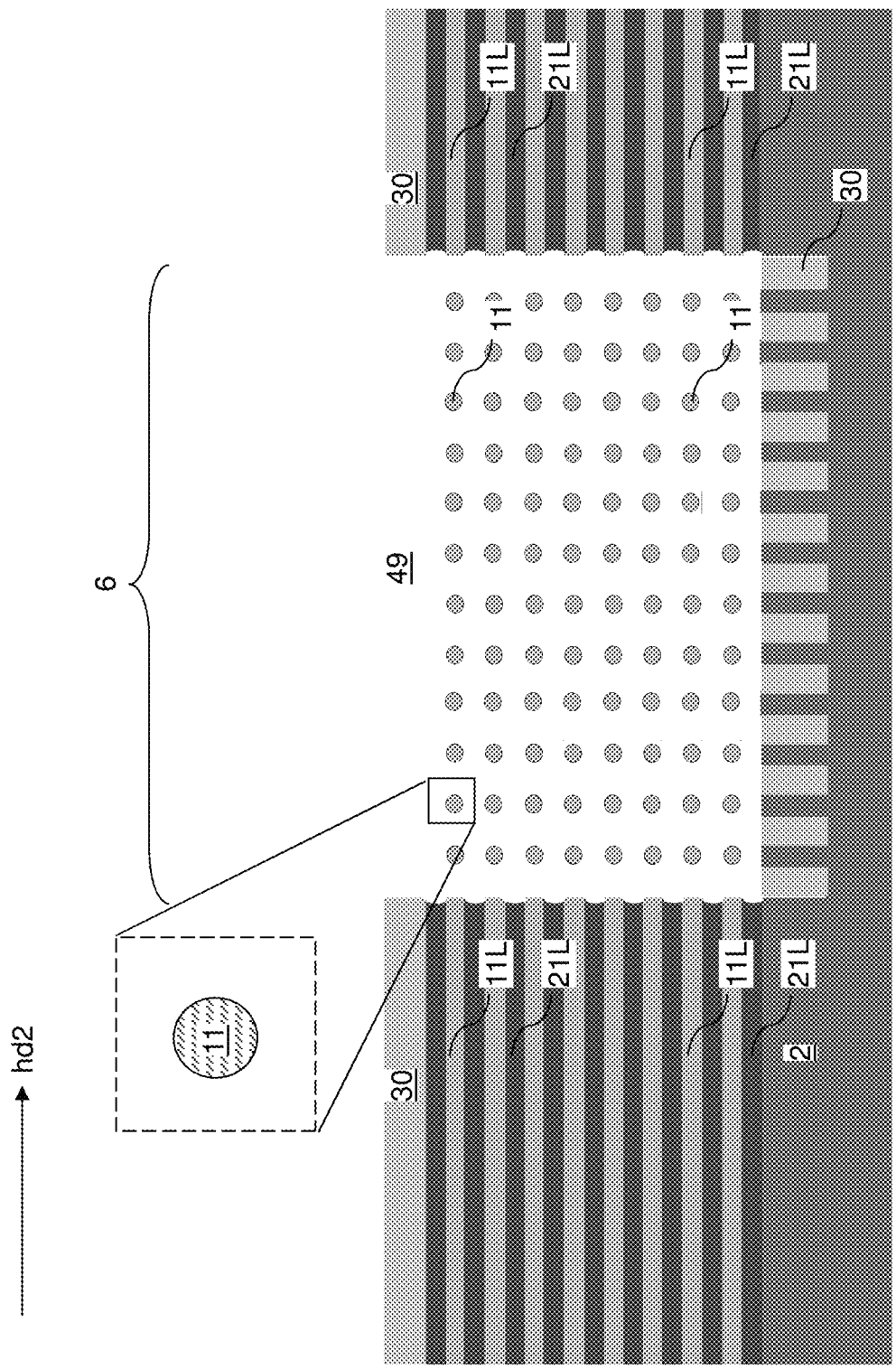
FIG. 13C is a third schematic vertical cross-sectional view of the exemplary structure of FIGS. 13A and 13B within a third vertical plane corresponding to the vertical plane C-C' in FIG. 11E.
Figure 13D:
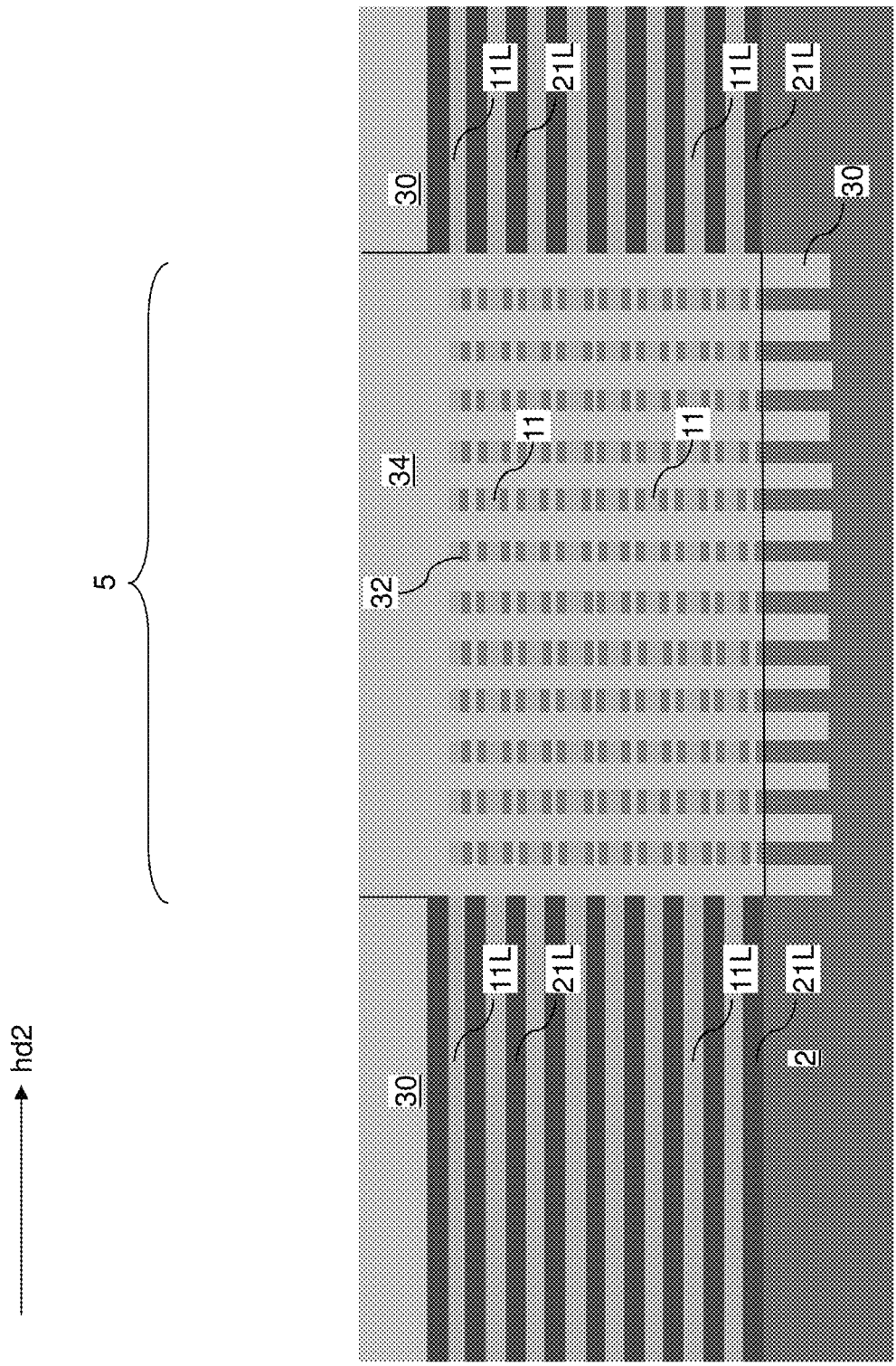
FIG. 13D is a fourth schematic vertical cross-sectional view of the exemplary structure of FIGS. 13A-13C within a fourth vertical plane corresponding to the vertical plane D-D' in FIG. 11E.

Each remaining portion of the deposited dielectric material constitutes a perforated dielectric wall structure 34. Each perforated dielectric wall structure 34 can include a two-dimensional array of perforations (openings) through which each of the silicon wires 11 extend along the first horizontal direction hd1, as shown in FIG. 10D. Each perforated dielectric wall structure can include vertically-extending portions 34V shown in FIG. 10D that fill the volumes of the vertically-extending cavities 39 that were formed at the processing steps of FIGS. 6A and 6B, and horizontal connection portions 34H, as shown in FIGS. 10A and 10D, that pass through a respective one of the tubular diffusion barrier material portions 32 and laterally connect a neighboring pair of vertically-extending portions. The perforated dielectric wall structures 34 are formed in remaining volumes of the nested cavities 37 after formation of the tubular diffusion barrier material portions 32 around the silicon wires 11. The perforated dielectric wall structures 34 are laterally spaced apart along the first horizontal direction hd1, and each of the perforated dielectric wall structures 34 includes a two-dimensional array of laterally-extending openings through which the silicon wires 11 extend along the first horizontal direction hd1.

Referring to FIGS. 11A-11E, the sacrificial multi-fingered gate structures 31 and the sacrificial matrix material layer 31L can be removed selective to the perforated dielectric wall structures 34 and the dielectric matrix 30. In one embodiment, the perforated dielectric wall structures 34 include silicon oxide, the sacrificial multi-fingered gate structures 31, and the sacrificial matrix material layer 31L include a material such as amorphous silicon, an amorphous silicon-germanium alloy including germanium at an atomic percentage greater than 20%, polysilicon, amorphous carbon, diamond-like carbon (DLC), a doped silicate glass (such as borosilicate glass) having a greater etch rate than the materials of the dielectric matrix 30, or organosilicate glass. In this case, an anisotropic etch process (such as a reactive ion etch) or an isotropic etch process (such as a wet etch process) can be performed to remove the material of the sacrificial multi-fingered gate structures 31 and the sacrificial matrix material layer 31L selective to the materials of the perforated dielectric wall structures 34 and the dielectric matrix 30.

A first isotropic etch process can be performed to remove remaining segments of the silicon-germanium wires 21 that are laterally exposed in the NAND gate region 50 between neighboring pair of the perforated dielectric wall structures 34. Specifically, the silicon-germanium blocks 121 are the remaining portions of the portions of the silicon-germanium wires 21 that are laterally exposed in the NAND gate region 50. The silicon-germanium blocks 121 can be removed selective to the materials of the silicon wires 11, the perforated dielectric wall structures 34, and the dielectric matrix 30 by an isotropic etch process. For example, a HCl vapor process or a wet etch process employing dilute hydrofluoric acid and hydrogen peroxide can be performed to remove the silicon-germanium blocks 121. Nested gate cavities 49 are formed by removing the sacrificial multi-fingered gate structures selective to the perforated dielectric wall structures 34 and by removing portions of the silicon-germanium wires 21 located between neighboring pairs of perforated dielectric wall structures 34. Each nested gate cavity 49 include a plurality of vertically-extending cavities and laterally-connecting cavities that connect neighboring pairs of the vertically-extending cavities. Each nested gate cavity 49 laterally surrounds each of the silicon wires 11.

Referring to FIGS. 12A-12D, an optional surface oxidation process is performed to oxidize physically exposed portions of the silicon wires 11. A thermal oxidation process can be performed to isotropically oxidize the physically exposed surfaces portions of the silicon wires 11 in a wet or dry oxidizing ambient. Tubular silicon oxide portions 61 are formed by conversion of the physically exposed surface portions of the silicon wires 11 into the tubular silicon oxide portions 61. The oxidation rate of the silicon wires 11 can be greater at edge regions than at planar surface regions, thereby generating a thicker silicon oxide material at edge regions of the silicon wires 11 than at planar surfaces of the silicon wires 11. The interfaces between remaining portions of the silicon wires 11 and the tubular silicon oxide portions 61 become contoured, and each section of the silicon wires 11 that are located in the gate electrode regions 6 become rounded sections having a vertical cross-sectional shape of a circle, an ellipse, or a rounded rectangle. Rounded sections of the silicon wires 11 are formed between neighboring pairs of the perforated dielectric wall structures 34 in the gate electrode regions 6.

Referring to FIGS. 13A-13D, the tubular silicon oxide portions 61 can be removed selective to the silicon wires 11 by an isotropic etch. For example, a wet etch process employing dilute hydrofluoric acid can be employed to remove the tubular silicon oxide portions 61.

Referring to FIGS. 14A-14D, tubular memory films 60 which store information (i.e., data) can be formed on the physically exposed surfaces of the silicon wires 11 in the gate electrode regions 6. The tubular memory films 60 can be formed by thermal conversion of surface portions of the physically exposed portions of the silicon wires 11 and/or by conformal deposition of at least one memory film material layer. The at least one memory film material layer can include silicon oxide and/or at least one dielectric metal oxide material. The thickness of the tubular memory films 60 can be in a range from 1.5 nm to 6 nm, although lesser and greater thicknesses can also be employed. The tubular memory films 60 are formed around rounded sections of the silicon wires 11 laterally surrounded by the nested gate cavities 49.

In one embodiment, each memory film 60 may include a charge trapping (i.e., charge storage) material, such as silicon nitride. In this embodiment, each memory film includes an inner tunneling dielectric layer, such as a silicon oxide or silicon oxide/nitride/oxide (ONO) trilayer, an outer blocking dielectric layer, such as silicon oxide and/or metal oxide, and a charge storage layer, such as a silicon nitride layer, a polysilicon floating gate layer, charge storage nanocrystals embedded in a dielectric layer, etc., located between the tunneling dielectric layer and the blocking dielectric layer.

In another embodiment, each memory film 60 may include a ferroelectric material, such as doped hafnium oxide, such as hafnium oxide doped with one or more of Si, Al, Gd, Y, Zr and/or La. For example, the memory film 60 may include orthorhombic phase hafnium oxide doped with at least one of silicon, aluminum, yttrium, gadolinium, lanthanum and/or zirconium. The atomic concentration of the dopant atoms (e.g., Al atoms) can be in a range from 0.5% to 16.6%. Alternatively, the ferroelectric material may include other compositions, such as a mixture of hafnium oxide and zirconium oxide. The memory film 60 may also include a non-ferroelectric dielectric layer, such as silicon oxide gate dielectric, located below the ferroelectric material layer and the silicon wires 11 (which comprise channels of the ferroelectric memory device). A ferroelectric memory device is a memory device containing the ferroelectric material to store information. The ferroelectric material acts as the memory material of the memory device. The dipole moment of the ferroelectric material is programmed in two different orientations (e.g., "up" or "down" polarization positions based on atom positions, such as oxygen and/or metal atom positions, in the crystal lattice) depending on the polarity of the applied electric field to the ferroelectric material to store information in the ferroelectric material. The different orientations of the dipole moment of the ferroelectric material can be detected by the electric field generated by the dipole moment of the ferroelectric material. For example, the orientation of the dipole moment can be detected by measuring electrical current passing through a semiconductor channel provided adjacent to the ferroelectric material in a multi-gate, field effect transistor-type ferroelectric memory device described below.

At least one conductive gate electrode material can be deposited in remaining volumes of the nested gate cavities 49 by at least one conformal deposition process. The at least one conductive gate electrode material can include doped silicon and/or a metallic material such as an elemental metal, an intermetallic alloy, or a metal-semiconductor alloy. For example, a TiN barrier layer and tungsten fill layer may be used to form the conductive gate electric material. Excess portions of the at least one conductive gate electrode material can be removed from above the horizontal plane including the top surface of the dielectric matrix 30 by a planarization process, which can employ a recess etch or a chemical mechanical planarization process. Each remaining portion of the at least one conductive gate electrode material constitutes a multi-fingered gate electrode 62.

Figure 14A:
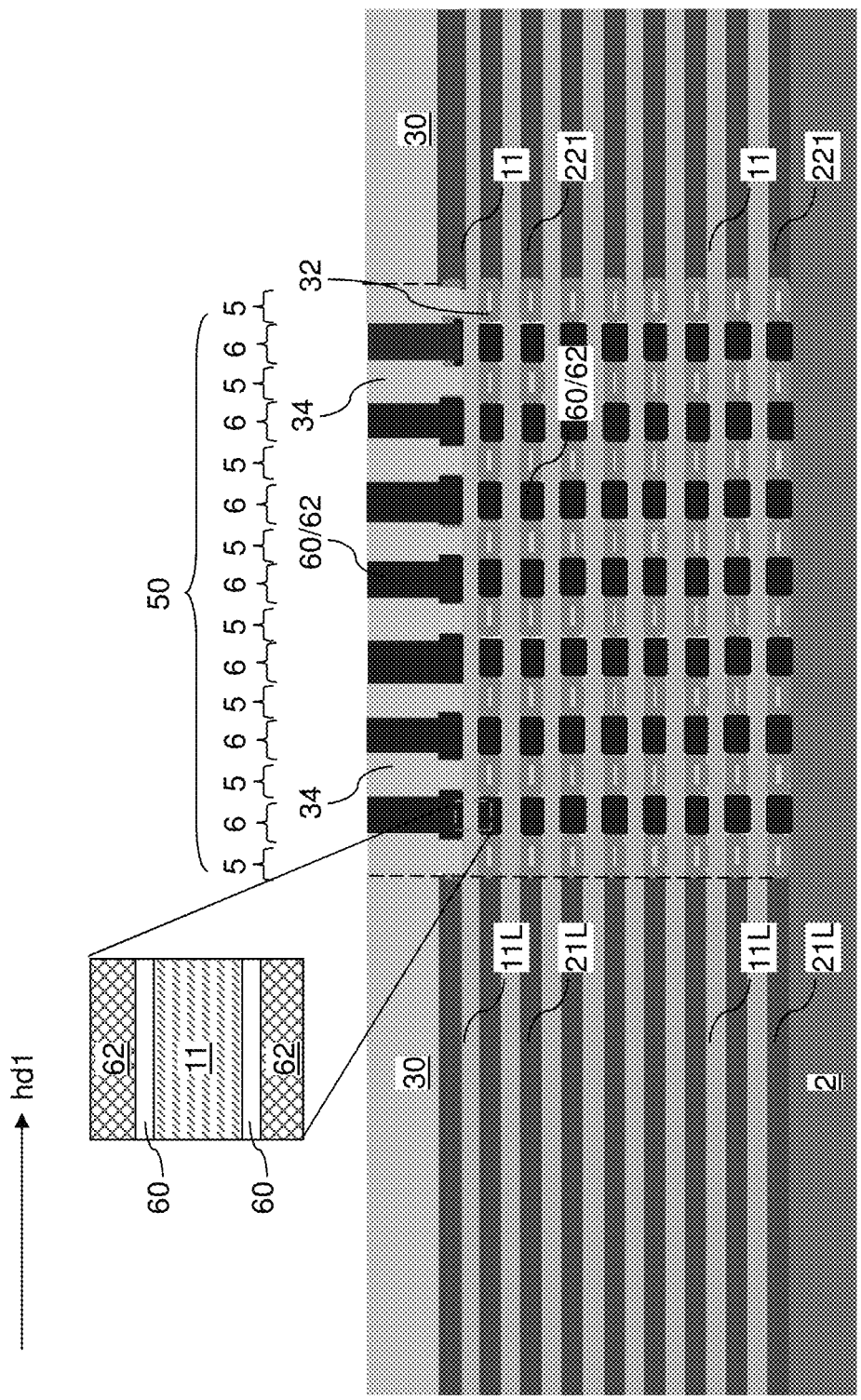
FIG. 14A is a first schematic vertical cross-sectional view of the exemplary structure within a first vertical plane corresponding to the vertical plane A-A' in FIG. 11E after formation of tubular memory films and multi-fingered gate electrodes according to an embodiment of the present disclosure.
Figure 14B:
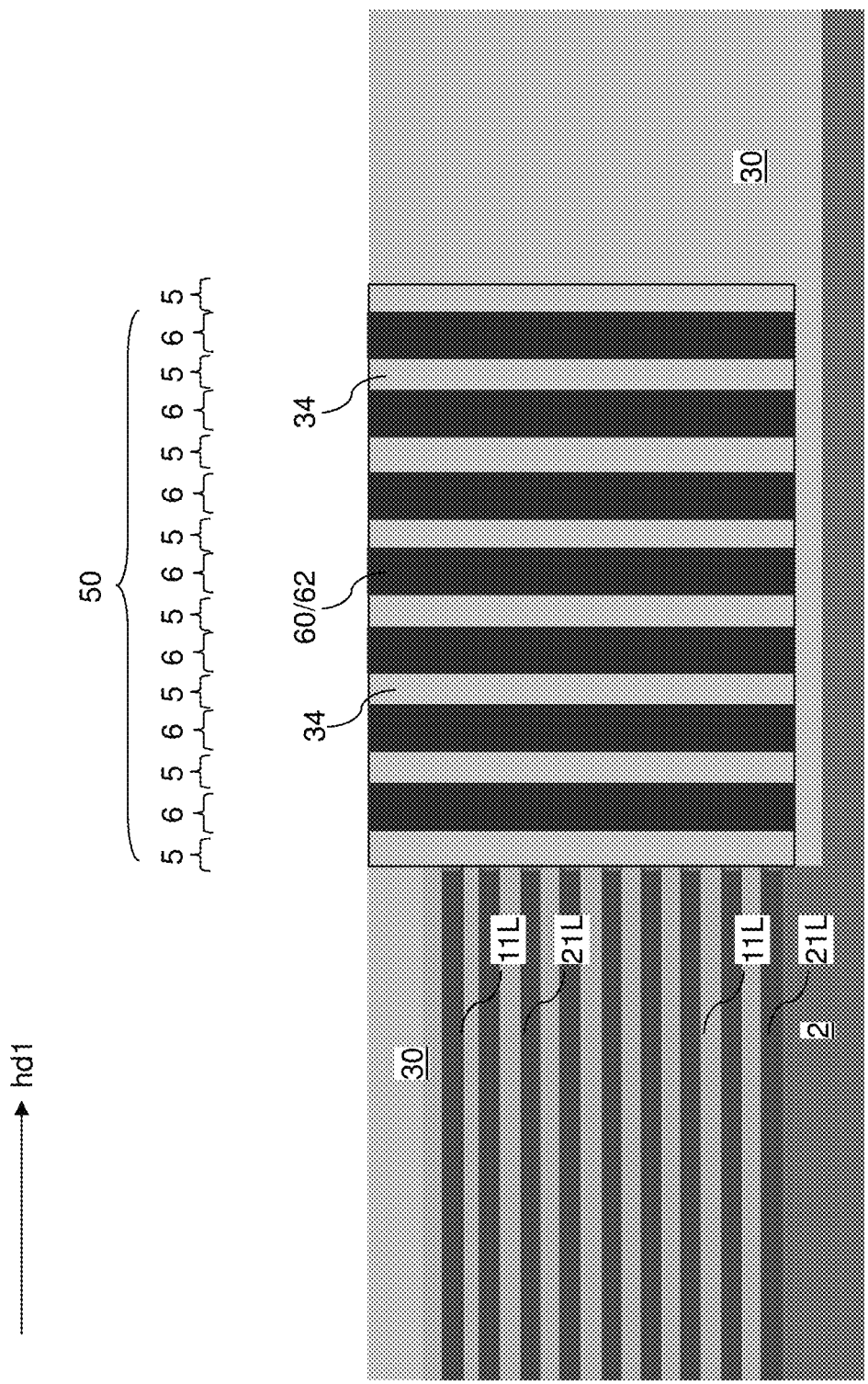
FIG. 14B is a second schematic vertical cross-sectional view of the exemplary structure of FIG. 14A within a second vertical plane corresponding to the vertical plane B-B' in FIG. 11E.
Figure 14C:
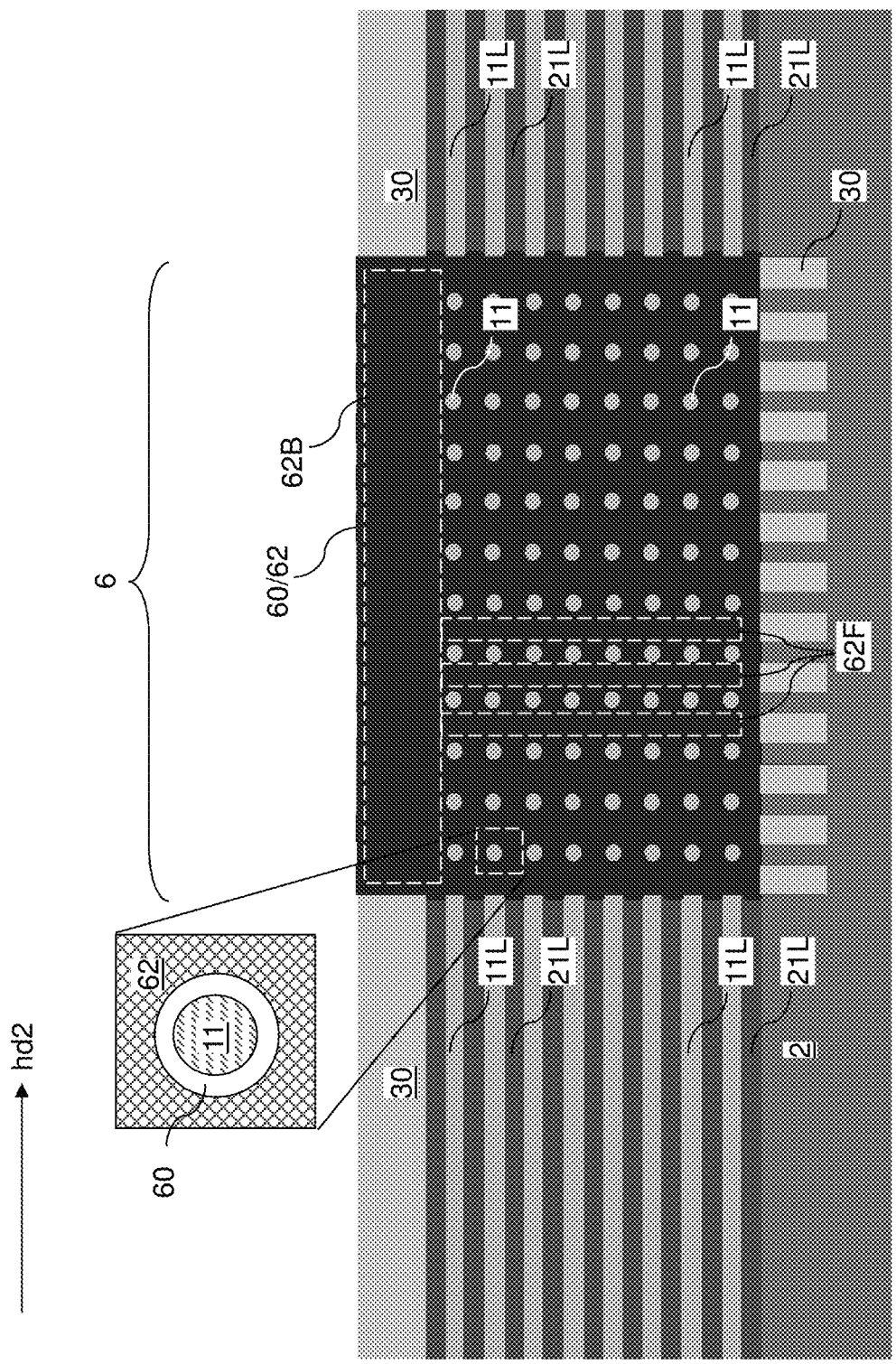
FIG. 14C is a third schematic vertical cross-sectional view of the exemplary structure of FIGS. 14A and 14B within a third vertical plane corresponding to the vertical plane C-C' in FIG. 11E.
Figure 14D:
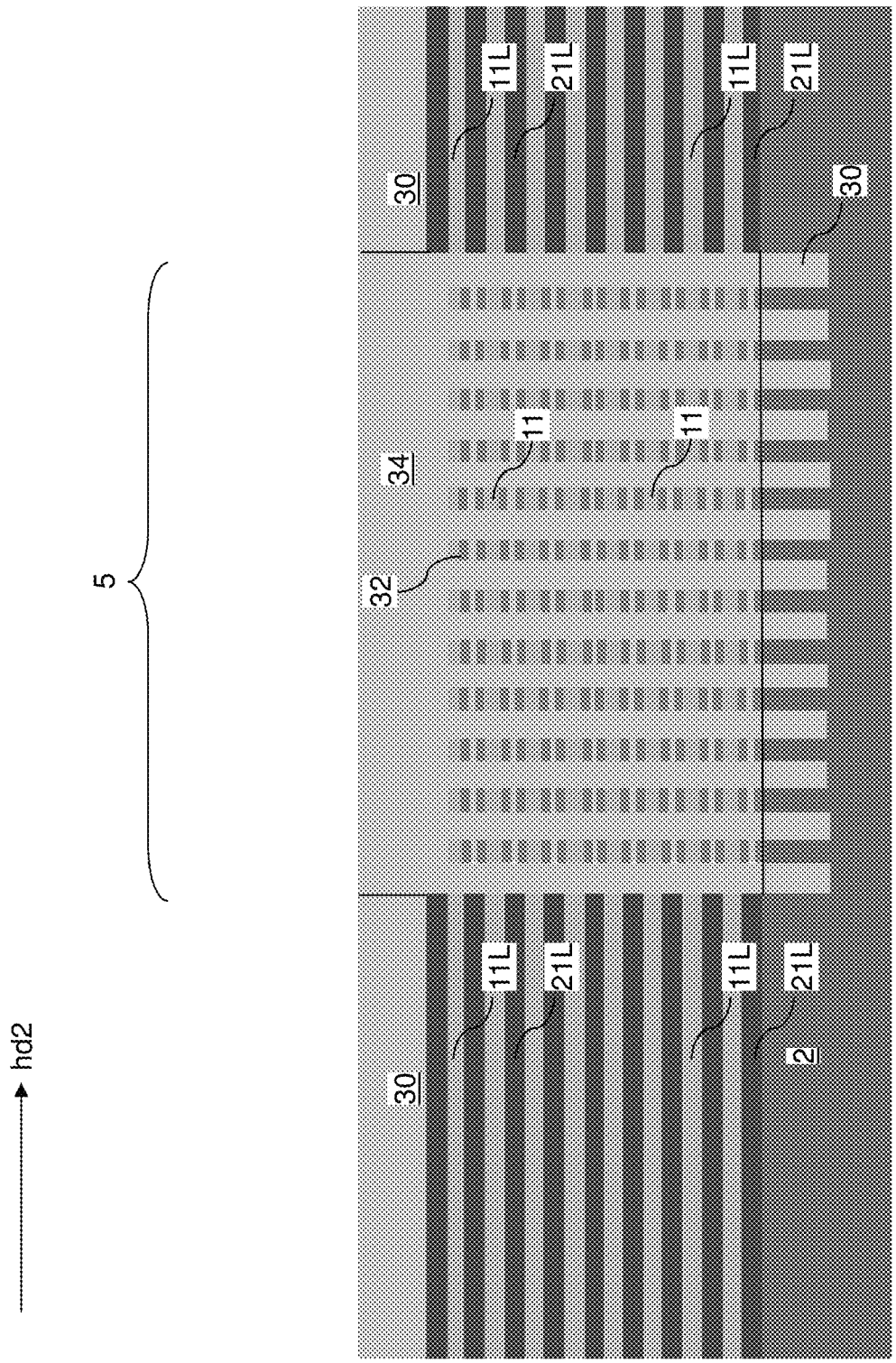
FIG. 14D is a fourth schematic vertical cross-sectional view of the exemplary structure of FIGS. 14A-14C within a fourth vertical plane corresponding to the vertical plane D-D' in FIG. 11E.

The multi-fingered gate electrodes 62 are formed on the tubular memory films 60 such that the multi-fingered gate electrodes 62 wrap around each of the tubular memory films 60. Thus, the multi-fingered gate electrodes 62 are formed over, and around, each of the tubular memory films 60 between neighboring pairs of the perforated dielectric wall structures 34. The multi-fingered gate electrodes 62 are laterally spaced apart along the first horizontal direction hd1. As shown in FIG. 14C, each of the multi-fingered gate electrodes 62 includes a respective gate electrode bar 62B which overlies the horizontal surface including the topmost surface of the topmost silicon wire 11 and extends along the second horizontal direction hd2. Each of the multi-fingered gate electrodes 62 also includes a respective set of vertically-extending gate electrode fingers 62F which is adjoined to a bottom portion of the respective gate electrode bar 62B, and spaced apart along the second horizontal direction hd2 by the silicon wires 11. In one embodiment, each of the vertically-extending gate electrode fingers extends vertically between a respective pair of vertical stacks of silicon wires 11.

Figure 15A:
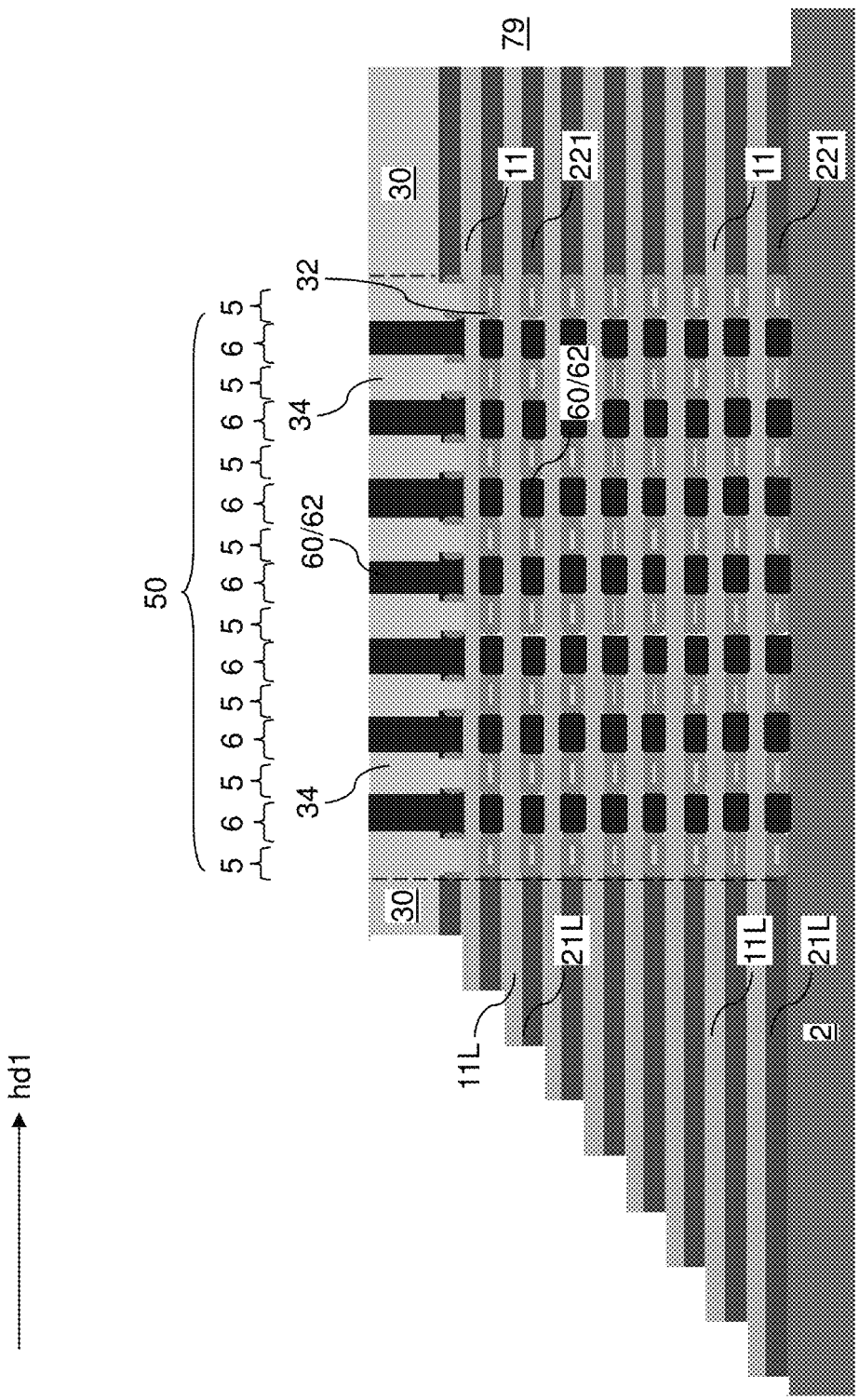
FIG. 15A is a first schematic vertical cross-sectional view of the exemplary structure after formation of stepped surfaces by patterning the silicon plate portions and the silicon-germanium plate portions according to an embodiment of the present disclosure.
Figure 15B:
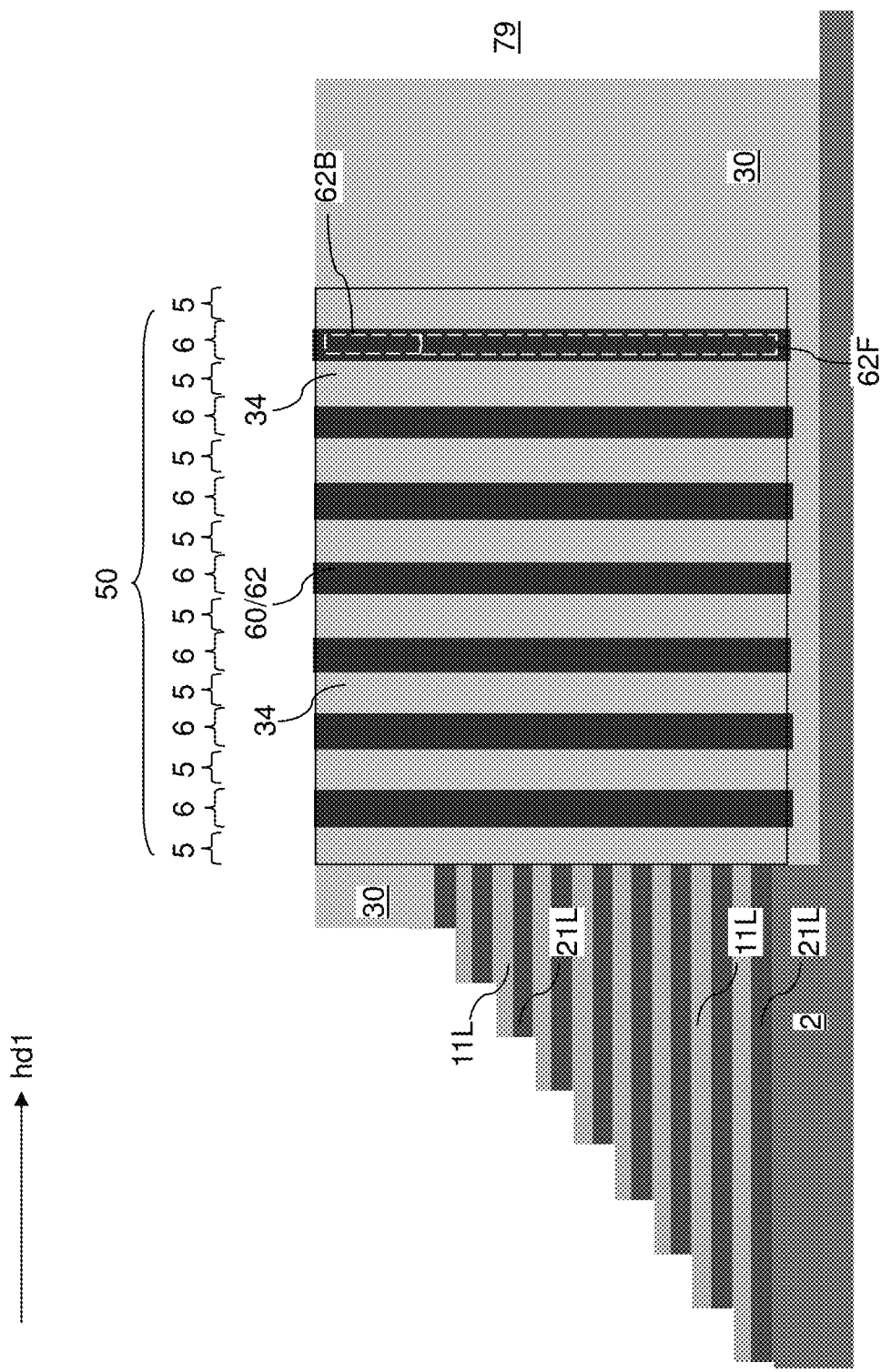
FIG. 15B is a second schematic vertical cross-sectional view of the exemplary structure at the processing steps of FIG. 15A.

Referring to FIGS. 15A-15C, a portion of the dielectric matrix 30 overlying the vertically alternating sequence of the silicon plate portions 11L and the silicon-germanium plate portions 21L can be removed by a combination of lithographic methods and an anisotropic etch process. Stepped surfaces can be formed by patterning the vertically alternating sequence of the silicon plate portions 11L and the silicon-germanium plate portions 21L. For example, a trimmable mask layer including a trimmable material (such as a carbon-based material providing a controlled ashing rate) can be applied over the exemplary structure, and can be lithographically patterned to form an opening with a straight edge along the second horizontal direction within a distal portion of the vertically alternating sequence of the silicon plate portions 11L and the silicon-germanium plate portions 21L. The distal portion of the vertically alternating sequence of the silicon plate portions 11L and the silicon-germanium plate portions 21L refers to the portion of the vertically alternating sequence of the silicon plate portions 11L and the silicon-germanium plate portions 21L that is located on an opposite side of the NAND gate region 50.

A sequence of processing steps including an anisotropic etch process that etches a silicon-germanium plate portion 21L and a silicon plate portion 11L and a trimming process that isotropically trims the trimmable mask layer can be repeated performed to pattern the vertically alternating sequence of the silicon plate portions 11L and the silicon-germanium plate portions 21L. The sequence of processing steps can be repeated until a top surface of the substrate 2 is physically exposed. The stepped surfaces can continuously extend from the substrate 2 to a portion of the dielectric matrix 30 that contacts a topmost layer of the vertically alternating sequence of the silicon plate portions 11L and the silicon-germanium plate portions 21L. Further, a backside trench 79 can be formed on an opposite side of the stepped surfaces such that a sidewall of each of the silicon wires 11 and the silicon-germanium wire segments 221 are physically exposed. The backside trench 79 can vertically extend to the top surface of the substrate 2.

Figure 16A:
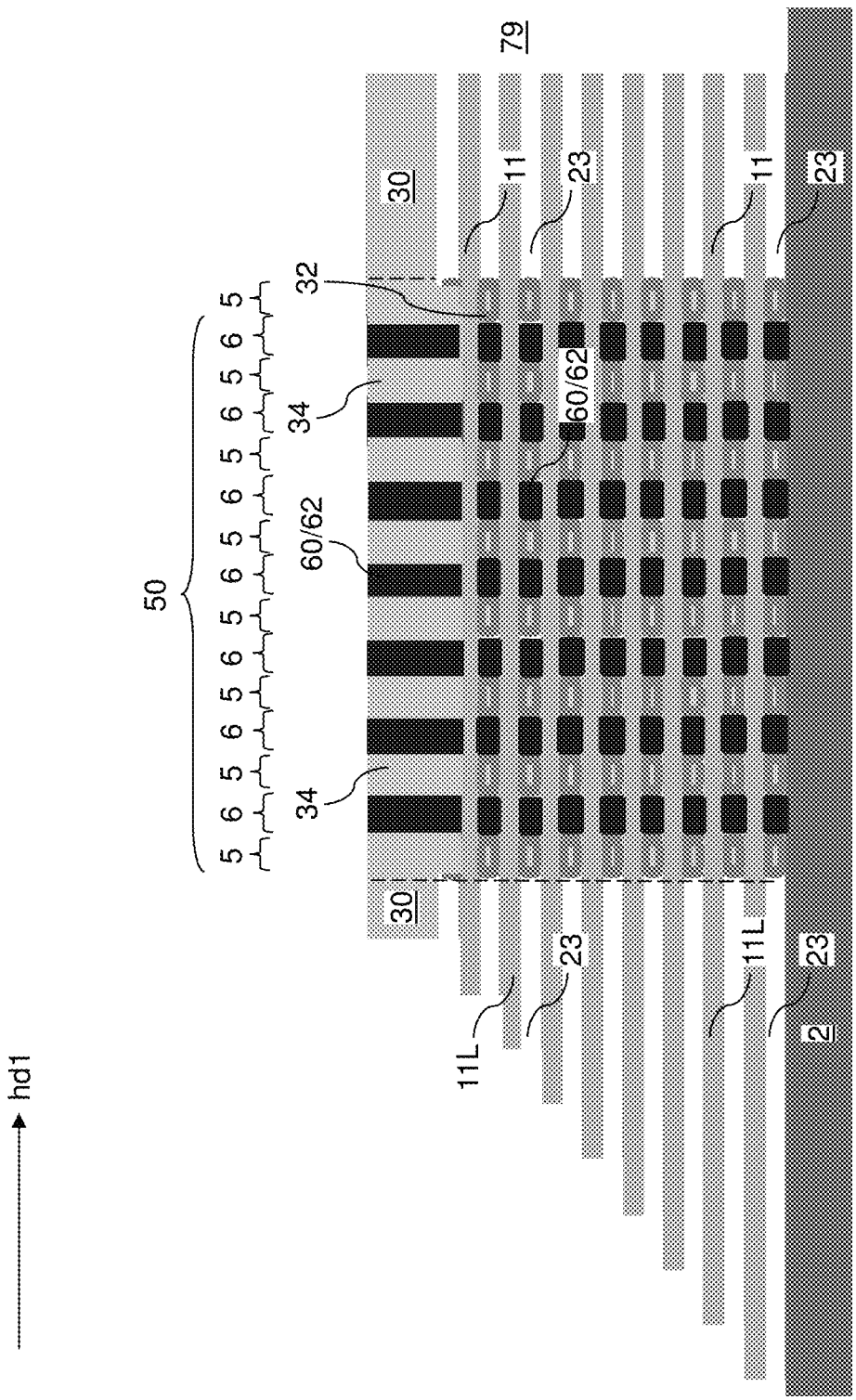
FIG. 16A is a first schematic vertical cross-sectional view of the exemplary structure within a first vertical plane corresponding to the vertical plane A-A' in FIG. 15C after removal of remaining portions of the silicon-germanium layers according to an embodiment of the present disclosure.
Figure 16B:
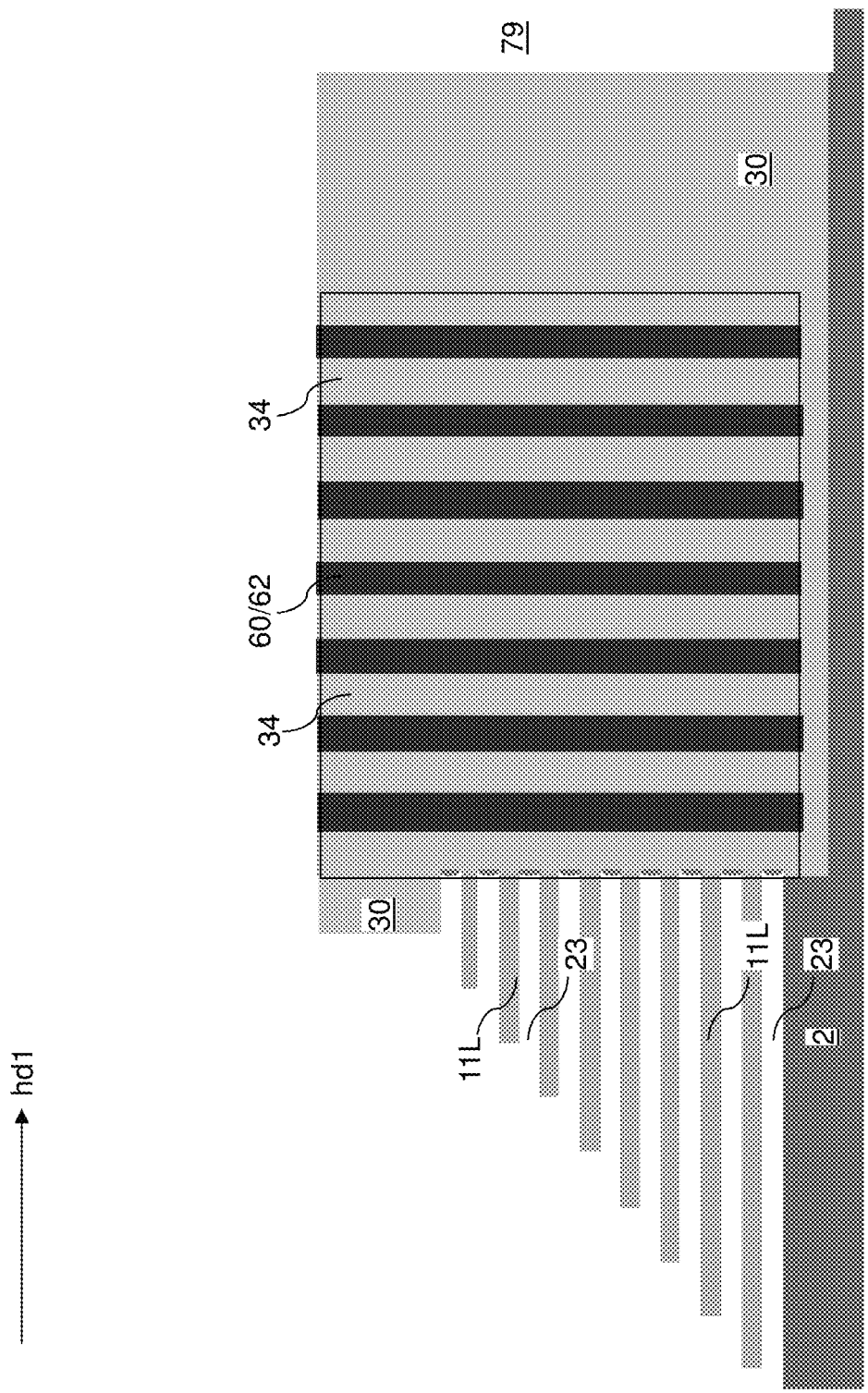
FIG. 16B is a second schematic vertical cross-sectional view of the exemplary structure of FIG. 16A within a second vertical plane corresponding to the vertical plane B-B' in FIG. 15C.

Referring to FIGS. 16A and 16B, remaining portions of the silicon-germanium layers 210, i.e., remaining portions of the silicon-germanium plate portions 21L and the silicon-germanium wire segments 221, can be removed selective to the silicon plate portions 11L. Specifically, a second isotropic etch process can be performed to remove the silicon-germanium plate portions 21L and distal portions of the silicon-germanium wires 21 (i.e., the silicon-germanium wire segment 221) selective to the multi-fingered silicon layers (11L, 11) that include the silicon plate portions 21L and the silicon wires 21. The etch process may be performed by providing the etching medium over the stepped surfaces where sidewalls of the silicon-germanium plate portions 21L are exposed and by providing the etching medium into the backside trenches where the sidewalls of the silicon-germanium wire segments 221 are exposed. Lateral cavities 23 are formed in volumes from which the silicon-germanium plate portions 21L and the silicon-germanium wire segments 221 are removed.

Figure 17A:
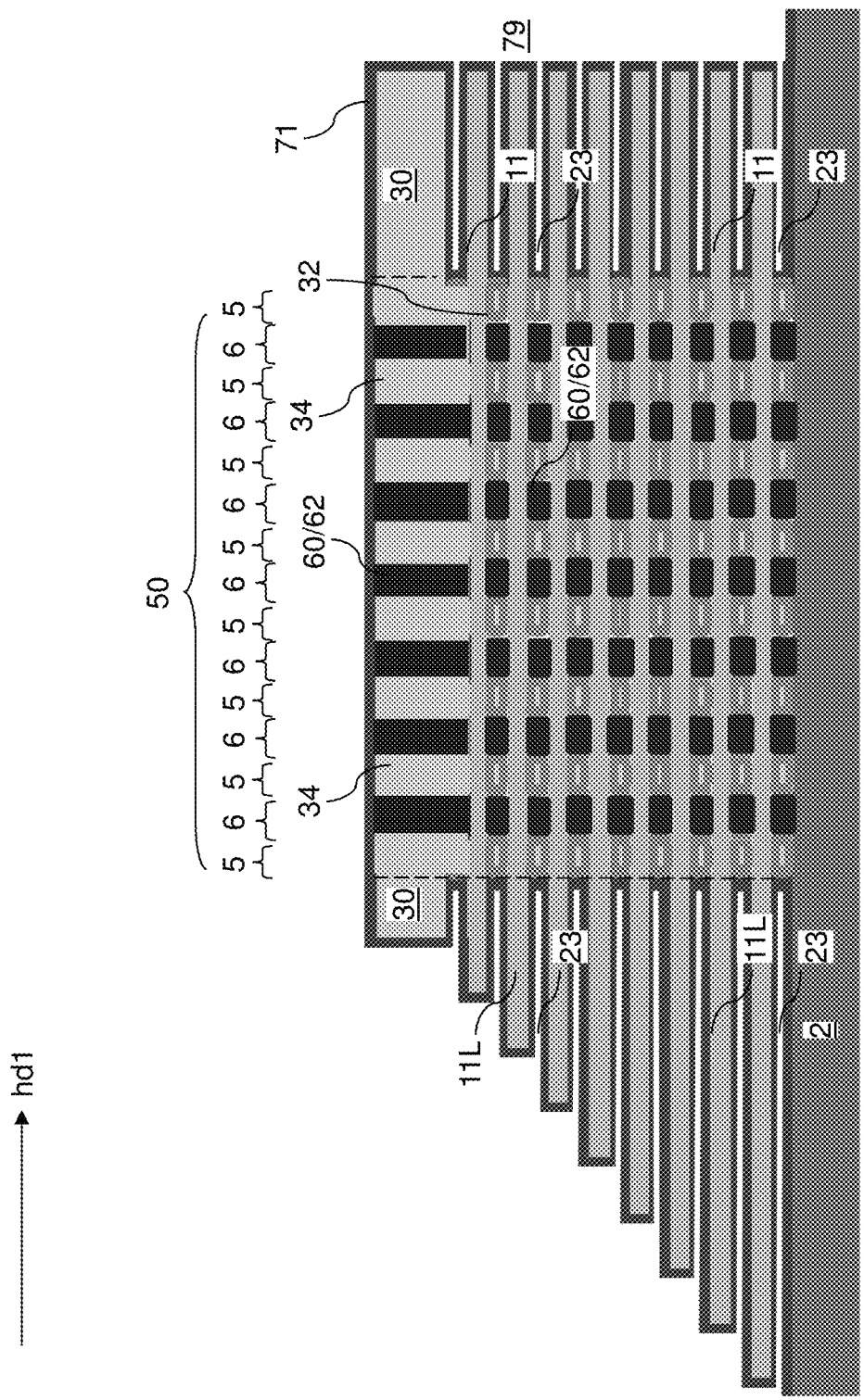
FIG. 17A is a first schematic vertical cross-sectional view of the exemplary structure within a first vertical plane corresponding to the vertical plane A-A' in FIG. 15C after deposition of a conformal doped silicate glass layer according to an embodiment of the present disclosure.
Figure 17B:
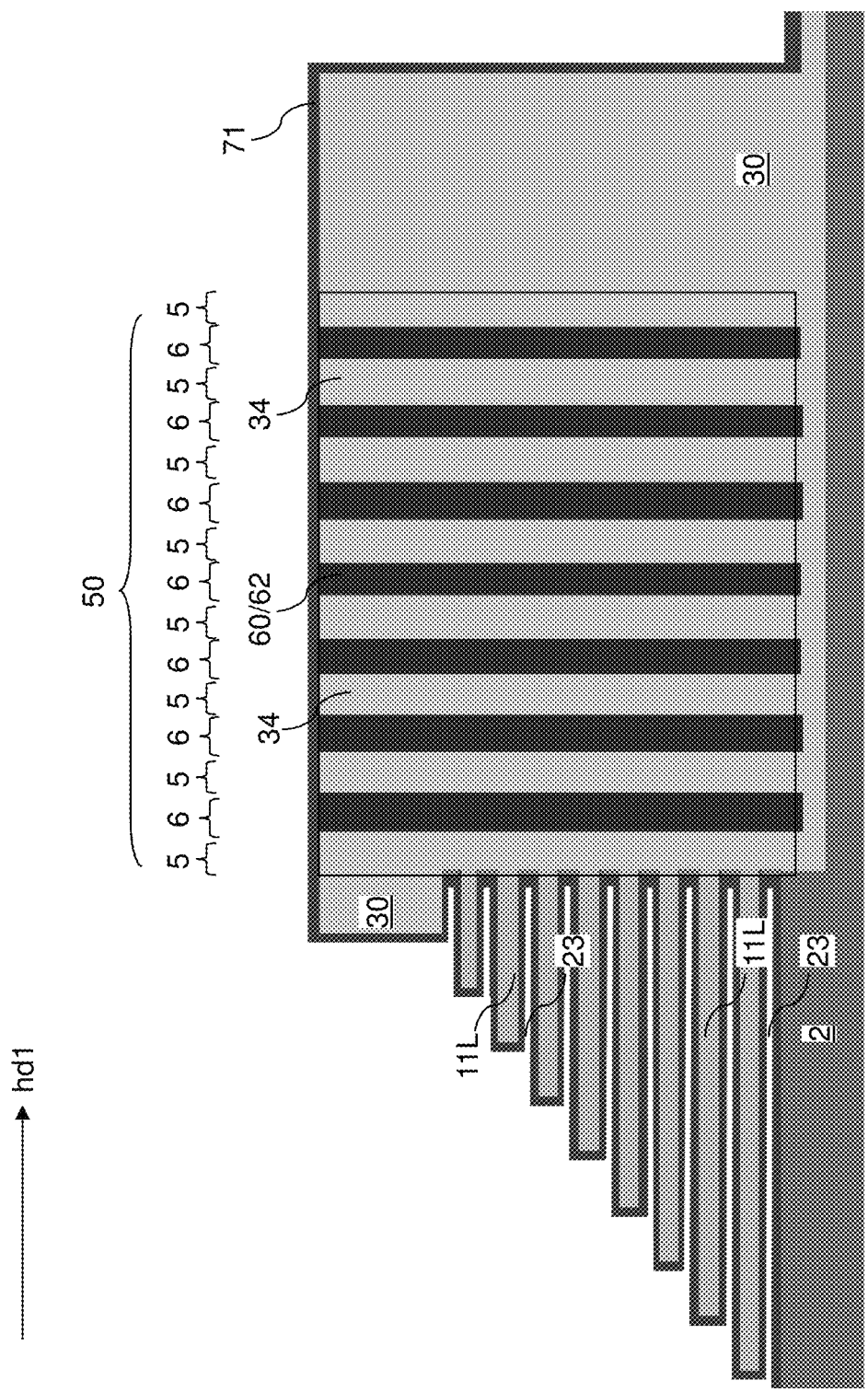
FIG. 17B is a second schematic vertical cross-sectional view of the exemplary structure of FIG. 17A within a second vertical plane corresponding to the vertical plane B-B' in FIG. 15C.

Referring to FIGS. 17A and 17B, a first conformal doped silicate glass layer 71 can be deposited on the physically exposed surfaces of the multi-fingered silicon layers (11L, 11). The first conformal doped silicate glass layer 71 includes a silicate glass material including dopants of a second conductivity type, which is the opposite of the first conductivity type. Thus, the multi-fingered silicon layers (11L, 11) have a doping of the first conductivity type, and the first conformal doped silicate glass layer 71 includes dopants of the second conductivity type. If the first conductivity type is p-type, the second conductivity type is n-type, and vice versa.

For example, if the multi-fingered silicon layers (11L, 11) are p-doped, the first conformal doped silicate glass layer 71 can include n-type dopants such as phosphorus or arsenic. In this case, the first conformal doped silicate glass layer 71 can be a phosphosilicate glass layer or an arsenosilicate glass layer. If the multi-fingered silicon layers (11L, 11) are n-doped, the first conformal doped silicate glass layer 71 can include p-type dopants such as boron. In this case, the first conformal doped silicate glass layer 71 can be a borosilicate glass layer. The thickness of the first conformal doped silicate glass layer 71 can be less than one half of the height of the gaps between neighboring pairs of multi-fingered silicon layers (11L, 11). The atomic percentage of dopants of the second conductivity type in the first conformal doped silicate glass layer 71 can be in a range from 0.1% to 10%, such as from 0.3% to 5%, although lesser and greater atomic percentages can also be employed.

Figure 18A:
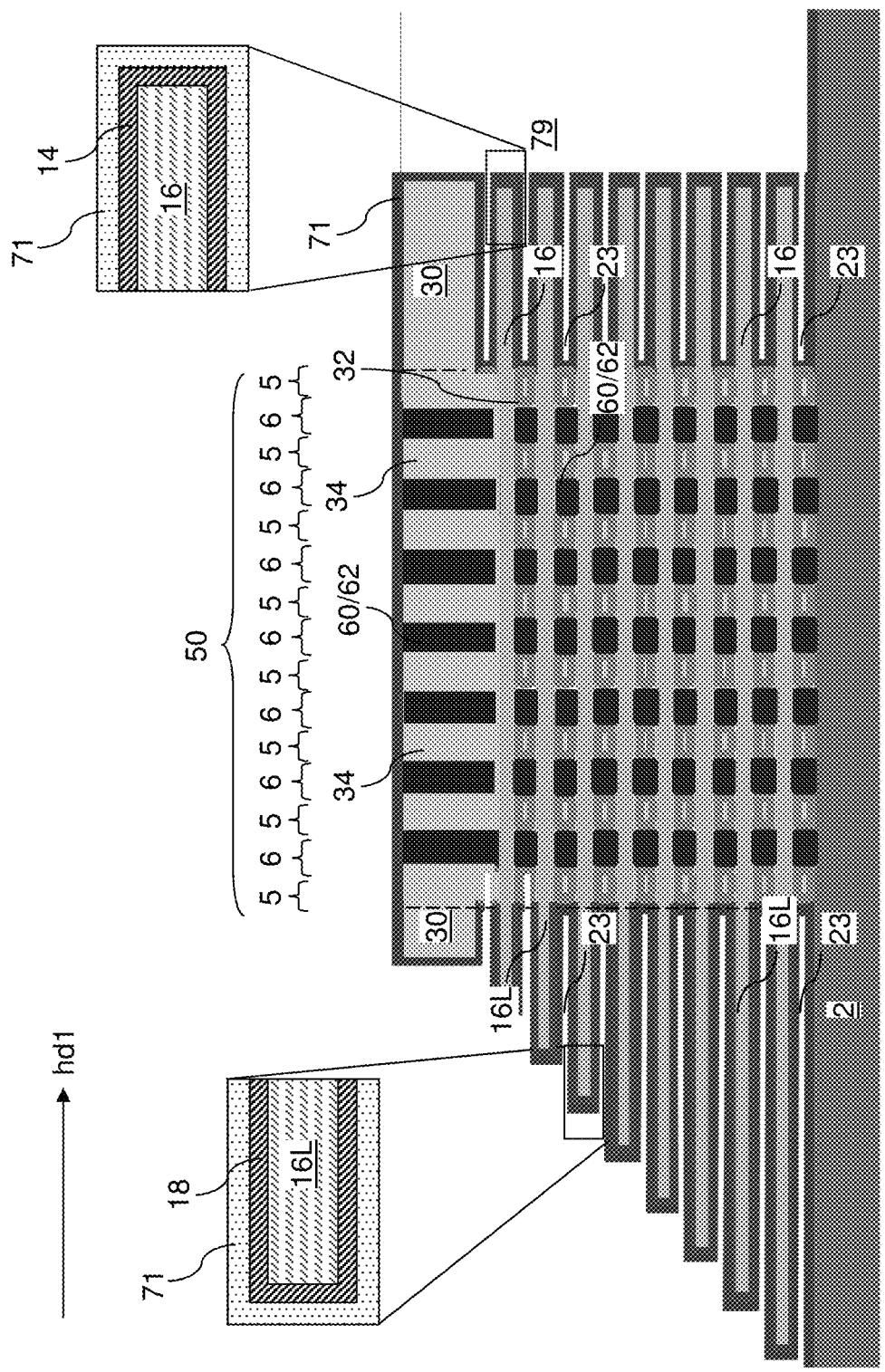
FIG. 18A is a first schematic vertical cross-sectional view of the exemplary structure within a first vertical plane corresponding to the vertical plane A-A' in FIG. 15C after formation of first active regions in distal portions of the silicon wires and second active regions located in the silicon plate portions according to an embodiment of the present disclosure.
Figure 18B:
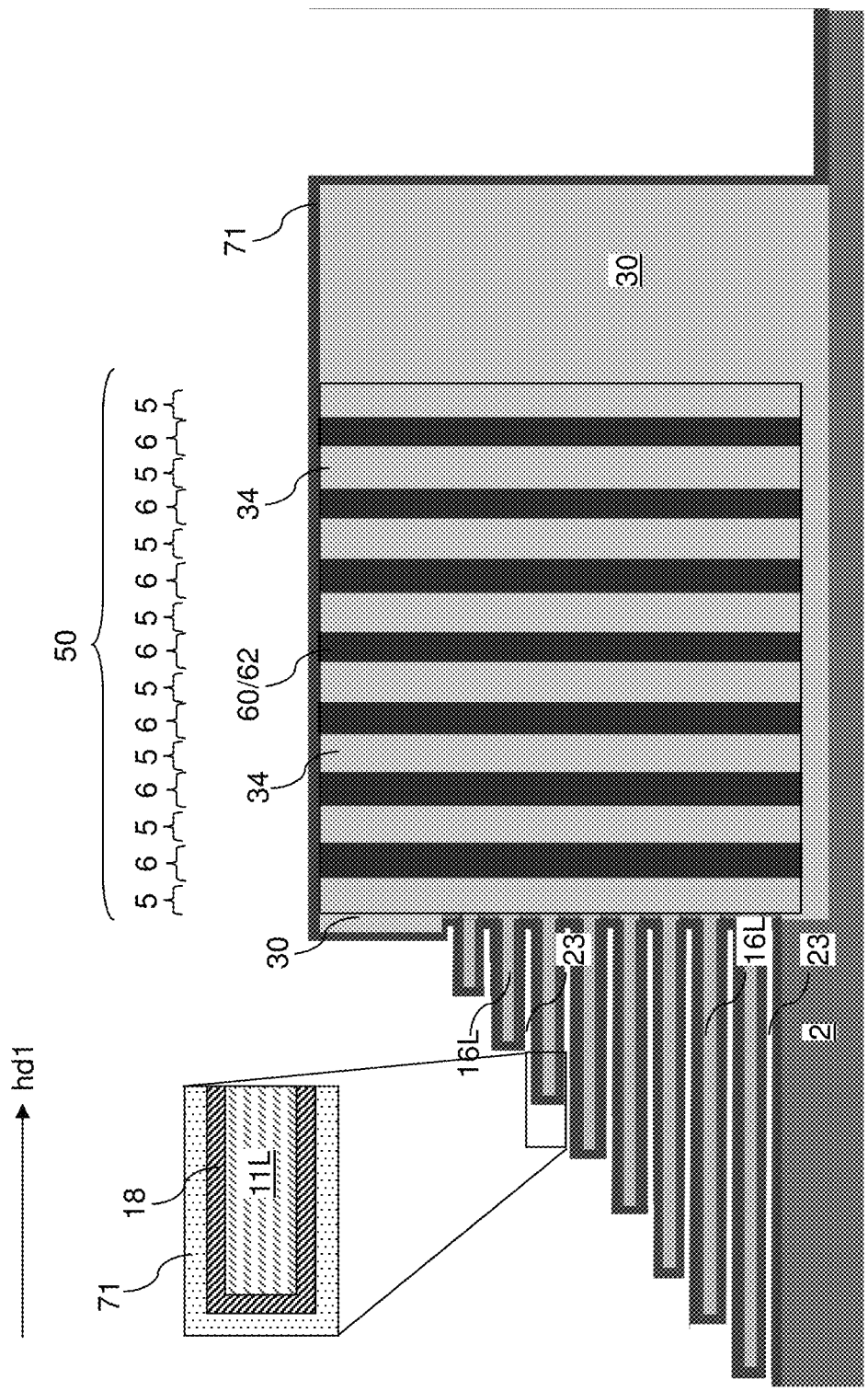
FIG. 18B is a second schematic vertical cross-sectional view of the exemplary structure of FIG. 18A within a second vertical plane corresponding to the vertical plane B-B' in FIG. 15C.

Referring to FIGS. 18A and 18B, a thermal anneal process can be performed to diffuse dopants of the second conductivity into portions of the multi-fingered silicon layers (11L, 11) that contact the first conformal doped silicate glass layer 71. The anneal temperature can be in a range from 700 degrees Celsius to 1,000 degrees Celsius, although lower and higher temperatures can also be employed. First active regions 14 can be formed in distal portions of the silicon wires 11 that are located outside of the NAND gate region 50 on the opposite side of the silicon plate portions 11L. Second active regions 18 can be formed in the silicon plate portions 11L. The first active regions 14 can be formed as a two-dimensional array of first active regions 14 at an end portion of each of the silicon wires 11. The second active regions 18 can be formed on the silicon plate portions 11L of the multi-fingered silicon layers (11L, 11). The first active regions 14 and the second active regions 18 have a doping of the second conductivity type. The first active regions 14 and the second active regions 18 are source/drain regions of multi-gated horizontal semiconductor transistors. In one embodiment, the first active regions 14 can be source regions and the second active regions 18 can be drain regions. Alternatively, the first active regions 14 can be drain regions and the second active regions 18 can be source regions.

Undoped portions of each multi-fingered silicon layer (11L, 11) include a multi-channel assembly (16L, 16). Each multi-channel assembly (16L, 16) includes a plate channel portion 16L and a plurality of wire channel portions 16. P-n junctions are formed at each interface between a multi-channel assembly (16L, 16) and a second active region 18, and between the multi-channel assembly (16L, 16) and each of the first active regions 14 that contact the multi-channel assembly (16L, 16). The first conformal doped silicate glass layer 71 can be subsequently removed selective to the multi-fingered silicon layers (16L, 16, 14, 18) by an isotropic etch process. For example, a wet etch process employing dilute hydrofluoric acid can be employed to remove the first conformal doped silicate glass layer 71.

Figure 19A:
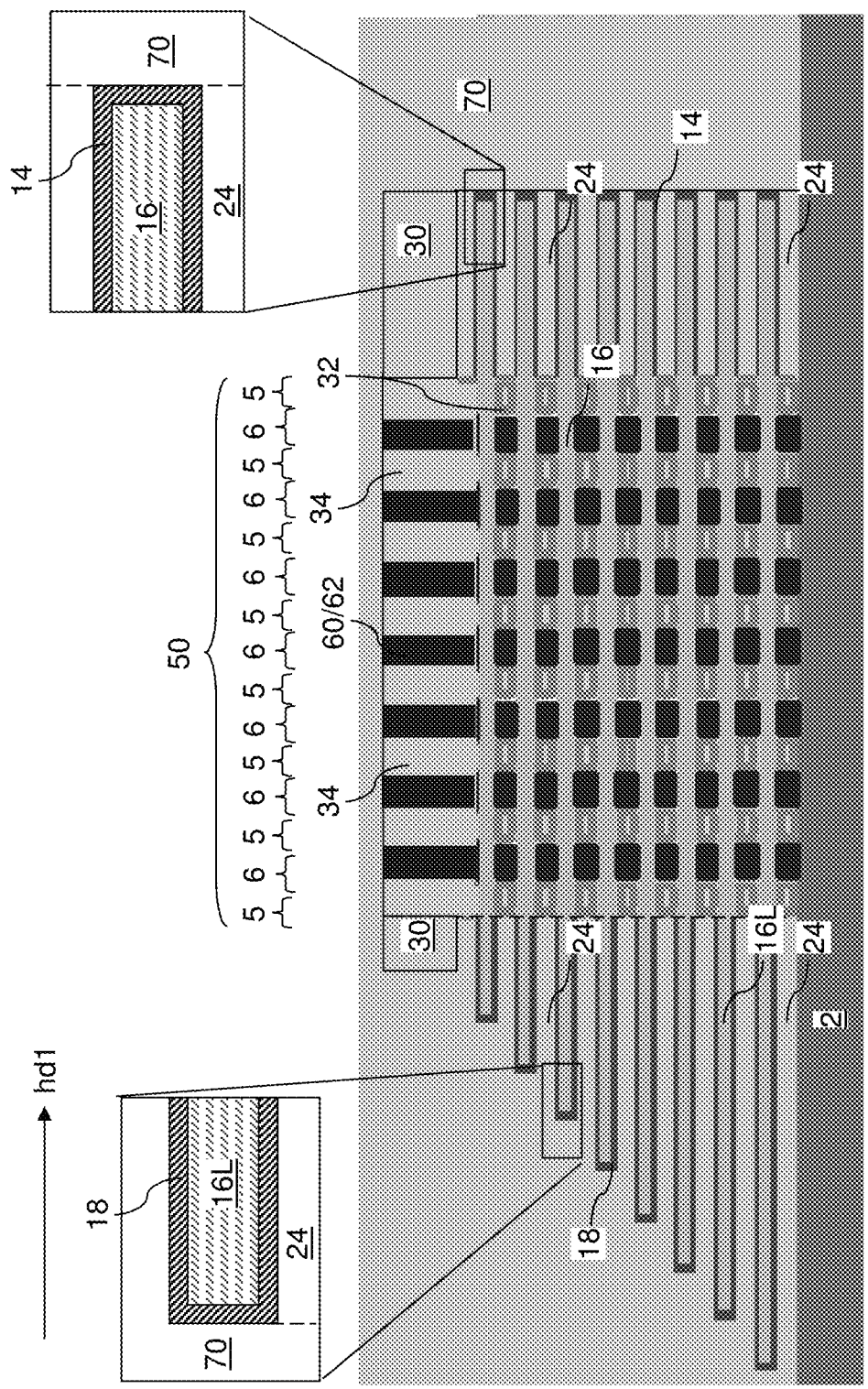
FIG. 19A is a first schematic vertical cross-sectional view of the exemplary structure within a first vertical plane corresponding to the vertical plane A-A' in FIG. 15C after removal of the conformal doped silicate glass layer and formation of a capping dielectric structure according to an embodiment of the present disclosure.
Figure 19B:
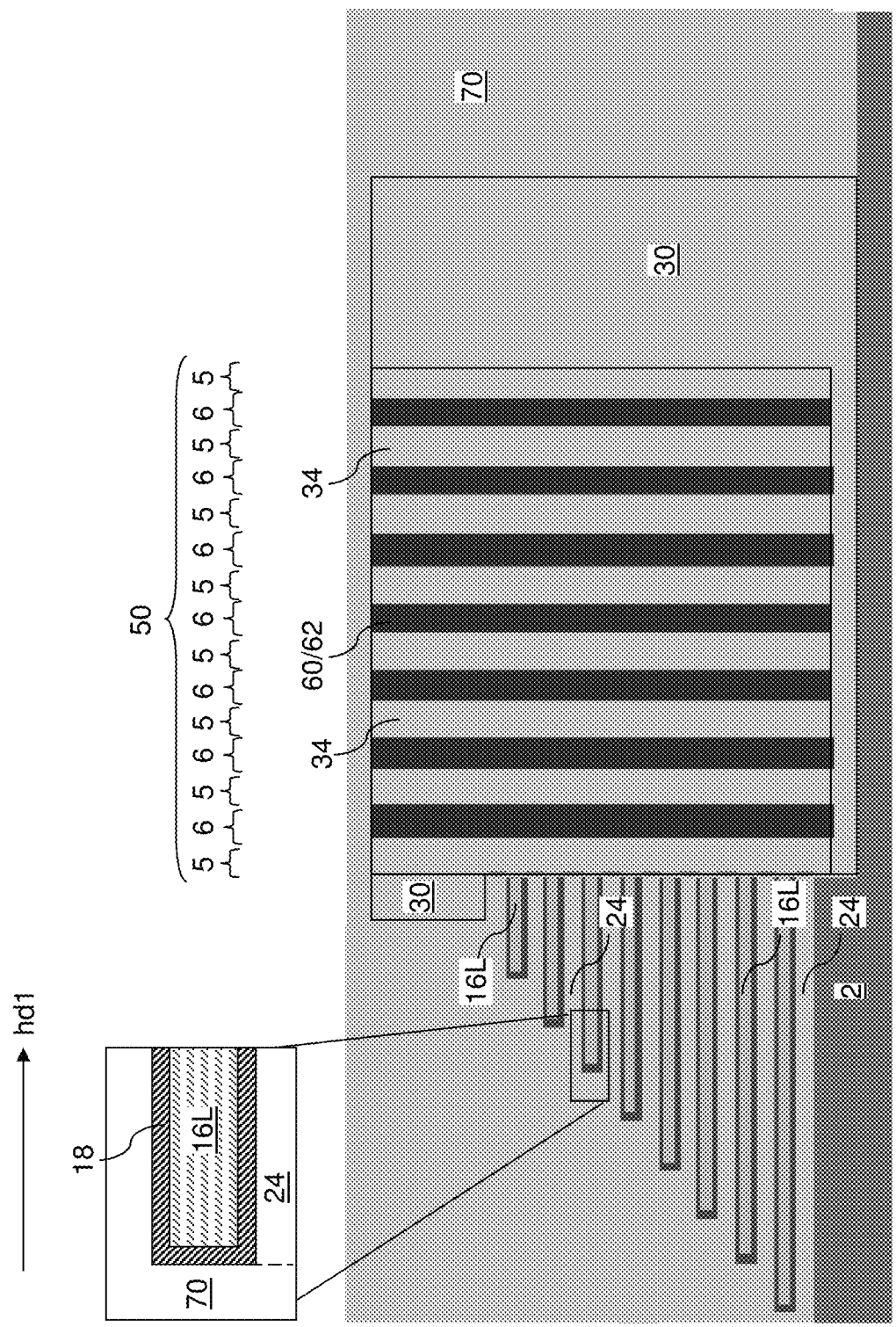
FIG. 19B is a second schematic vertical cross-sectional view of the exemplary structure of FIG. 19A within a second vertical plane corresponding to the vertical plane B-B' in FIG. 15C.

Referring to FIGS. 19A and 19B, a capping dielectric structure 70 can be formed over the stepped surfaces, the dielectric matrix 30, the multi-fingered gate electrodes 62, and in the backside trench 79 by depositing a dielectric material such as silicon oxide. The dielectric material may be deposited conformally to fill each of the lateral cavities 23 between the silicon plate portions or between the distal portions of the silicon wires, i.e., between each vertically neighboring pair of second active regions 18 and between each vertically neighboring pair of first active regions 14. In this case, a dielectric spacer layer 24 can be formed between each vertically neighboring pair of second active regions 18 and between each vertically neighboring pair of first active regions 14. Alternatively, the dielectric material can be deposited non-conformally to provide air gaps between each vertically neighboring pair of second active regions 18 and between each vertically neighboring pair of first active regions 14.

Figure 20A:
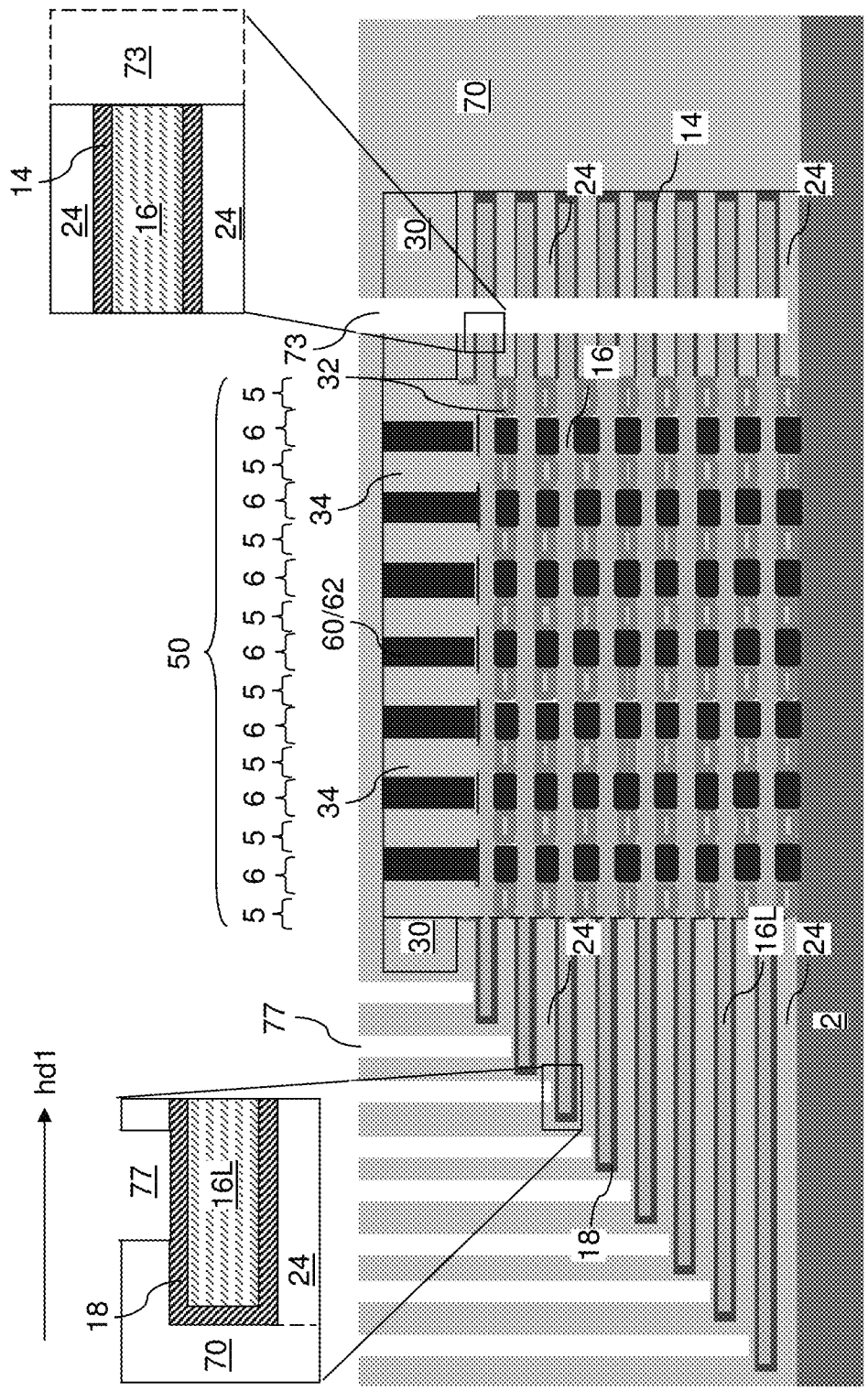
FIG. 20A is a first schematic vertical cross-sectional view of the exemplary structure within a first vertical plane corresponding to the vertical plane A-A' in FIG. 15C after formation of contact via cavities according to an embodiment of the present disclosure.
Figure 20B:
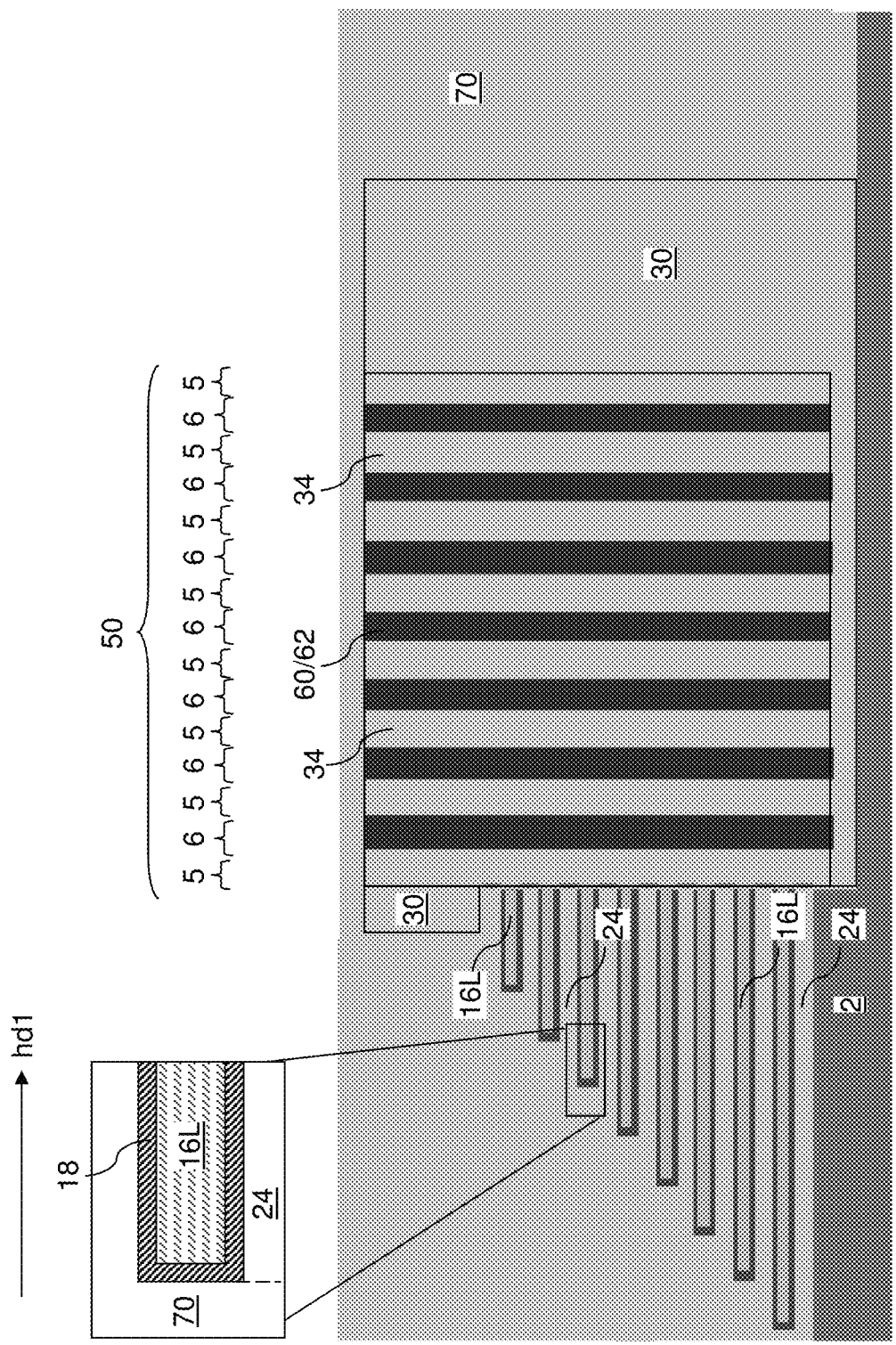
FIG. 20B is a second schematic vertical cross-sectional view of the exemplary structure of FIG. 20A within a second vertical plane corresponding to the vertical plane B-B' in FIG. 15C.

Referring to FIGS. 20A and 20B, first contact via cavities 73 and second contact via cavities 77 can be formed. The first contact via cavities 73 can be formed such that each first contact via cavity vertically extends through a vertical stack of silicon wires, and thus, through a vertical stack of first active regions 14. The second contact via cavities 77 can be formed such that a top surface of a second active region 18 is physically exposed at the bottom of each second contact via cavity 77. The first contact via cavities 73 can be formed by applying a first photoresist layer over the exemplary structure and by forming discrete openings that are laterally spaced apart along the second horizontal direction above each vertical stack of first active regions 14, and by transferring the pattern in the first photoresist layer through each of the underlying silicon wires. The first photoresist layer can be subsequently removed. The second contact via cavities 77 can be formed by applying a second photoresist layer over the exemplary structure and by forming discrete openings that are laterally spaced apart along the first horizontal direction hd1 such that each opening overlies a horizontal surface among the stepped surfaces of the silicon plate portions. An anisotropic etch is performed such that the pattern of the openings in the second photoresist layer is transferred through the capping dielectric structure 70. The anisotropic etch can be selective to silicon so that the second contact via cavities 77 stops on an underlying one of the multi-fingered silicon layers (16L, 16, 14, 18), e.g., on the underlying respective second active regions 18.

Figure 21A:
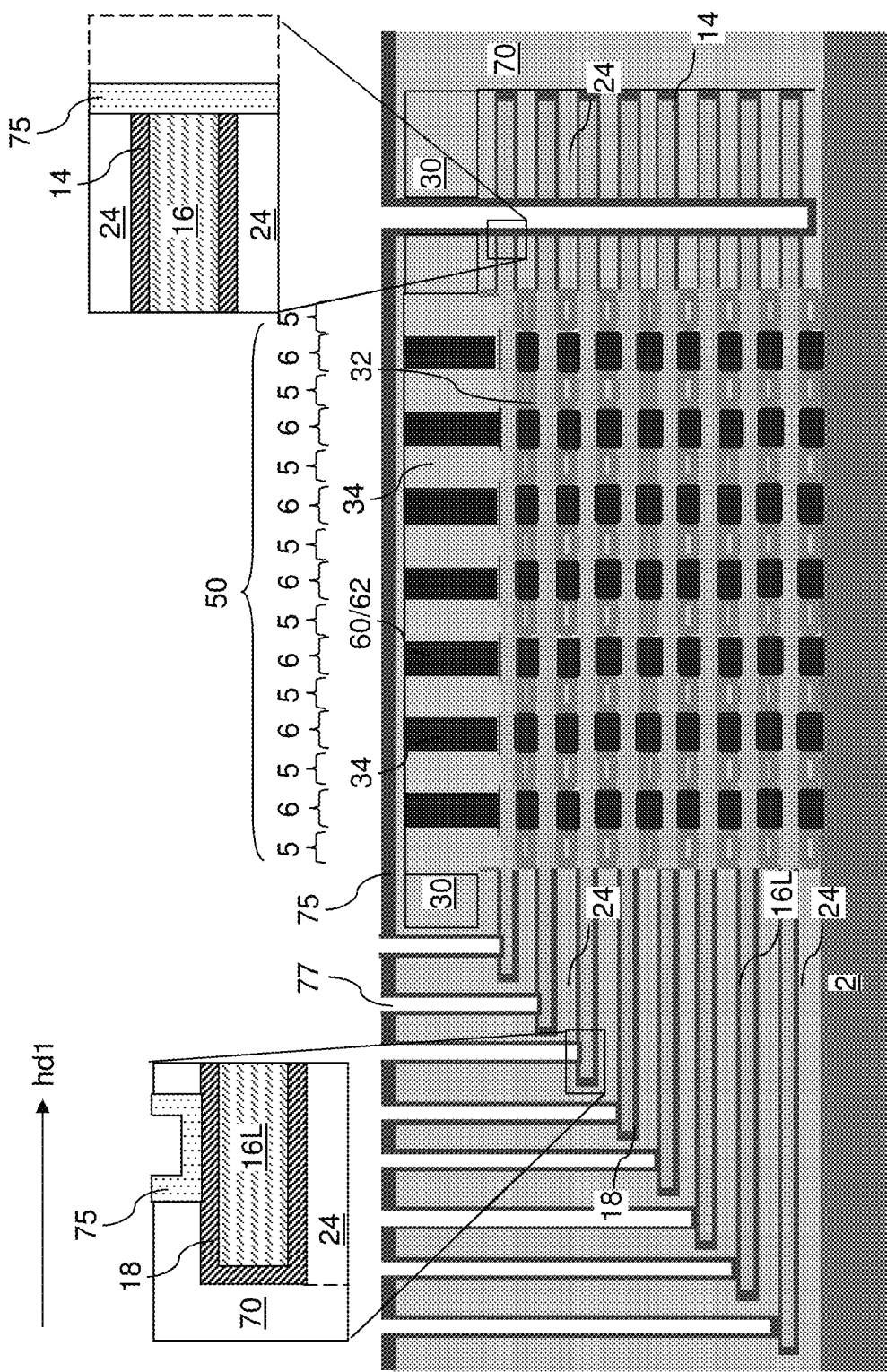
FIG. 21A is a first schematic vertical cross-sectional view of the exemplary structure within a first vertical plane corresponding to the vertical plane A-A' in FIG. 15C after deposition of another conformal doped silicate glass layer according to an embodiment of the present disclosure.
Figure 21B:
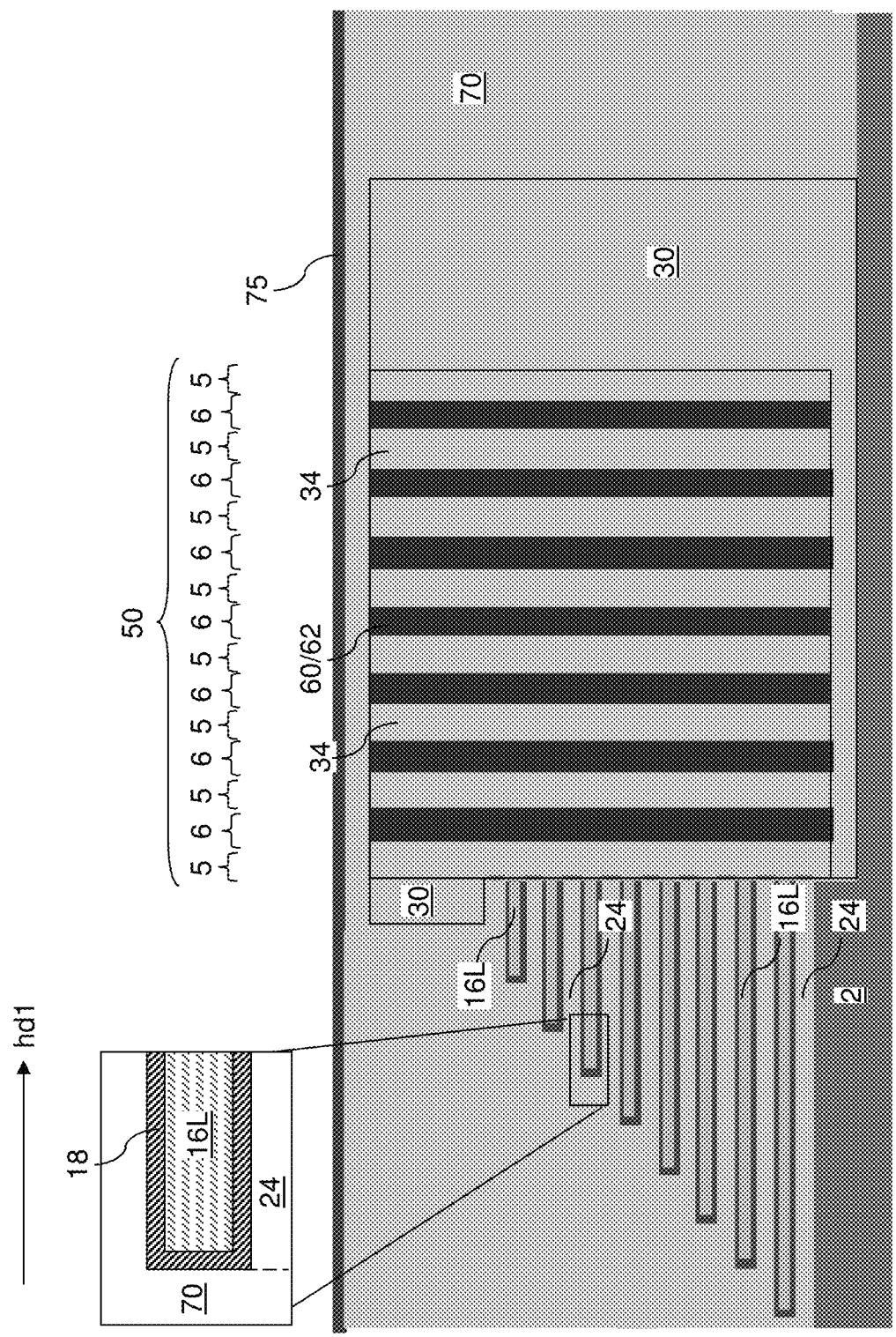
FIG. 21B is a second schematic vertical cross-sectional view of the exemplary structure of FIG. 21A within a second vertical plane corresponding to the vertical plane B-B' in FIG. 15C.

Referring to FIGS. 21A and 21B, a second conformal doped silicate glass layer 75 can be optionally formed in the first contact via cavities 73 and in the second contact via cavities 77 by a conformal deposition process. The second conformal doped silicate glass layer 75 includes dopants of the second conductivity type. In one embodiment, the second conformal doped silicate glass layer 75 can include the same material as the first conformal doped silicate glass layer 71.

Figure 22A:
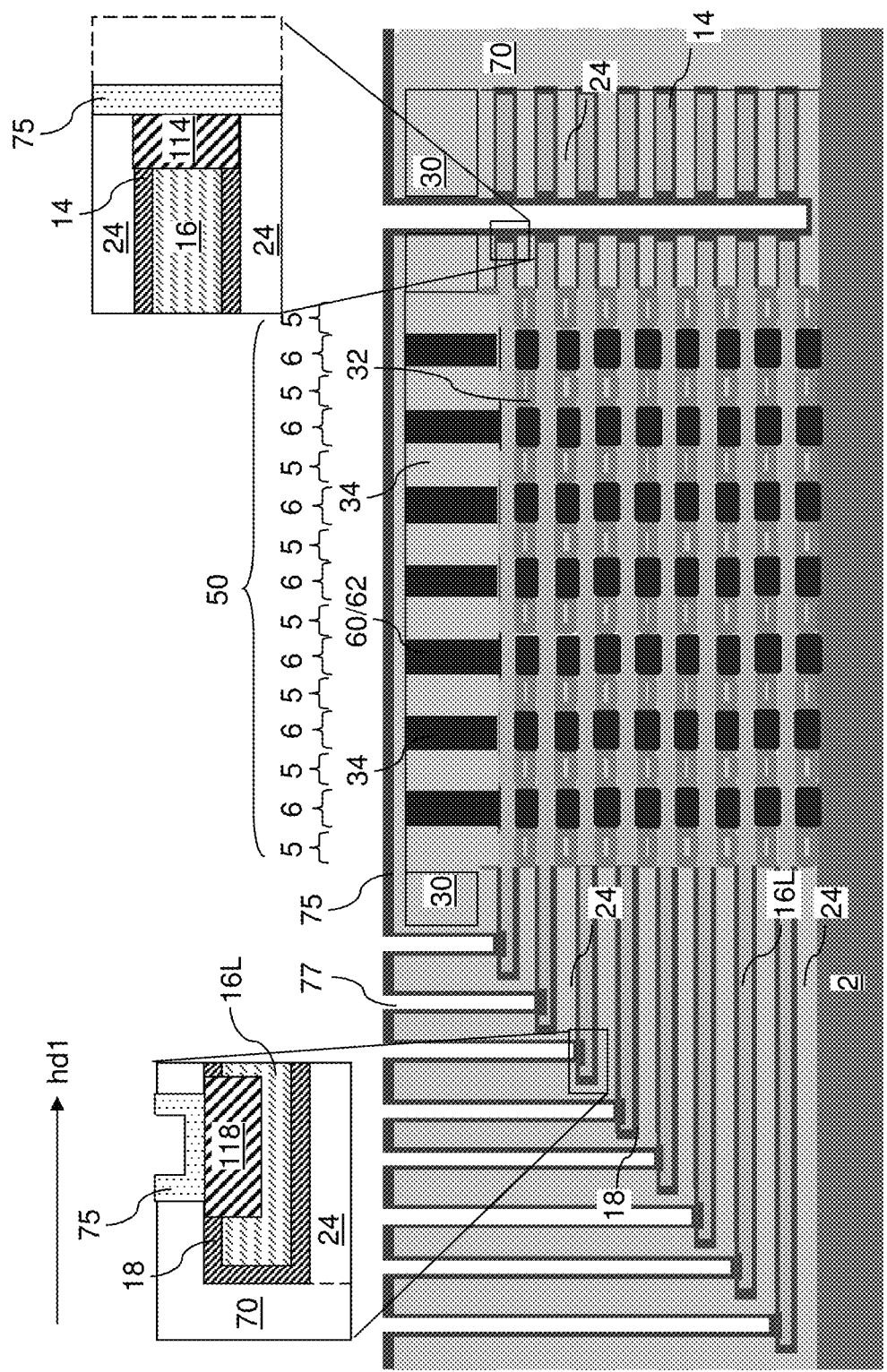
FIG. 22A is a first schematic vertical cross-sectional view of the exemplary structure within a first vertical plane corresponding to the vertical plane A-A' in FIG. 15C after formation of doped semiconductor pockets according to an embodiment of the present disclosure.
Figure 22B:
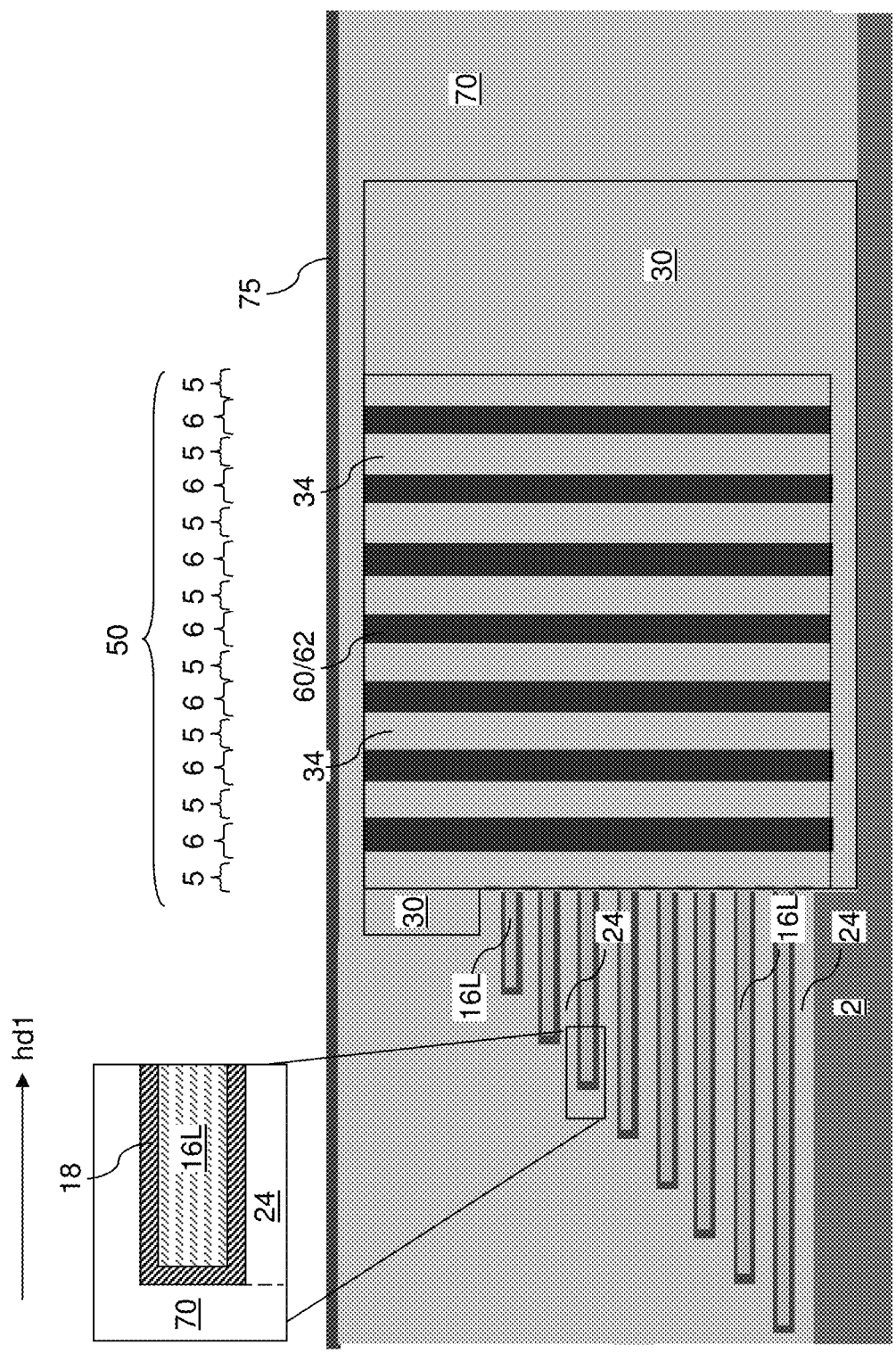
FIG. 22B is a second schematic vertical cross-sectional view of the exemplary structure of FIG. 22A within a second vertical plane corresponding to the vertical plane B-B' in FIG. 15C.

Referring to FIGS. 22A and 22B, a thermal anneal is performed to outdiffuse dopants of the second conductivity type from the second conformal doped silicate glass layer 75. First doped semiconductor pockets 114 having a higher dopant concentration than the first active regions 14 can be formed on each portion of the first active regions 14 that is proximal to the second conformal doped silicate glass layer 75, and second doped semiconductor pockets 118 having a higher dopant concentration than the second active regions 18 can be formed on each portion of the second active regions 18 that is proximal to the second conformal doped silicate glass layer 75. In other words, each portion of the first active regions 14 that is proximal to the second conformal doped silicate glass layer 75 is converted into first doped semiconductor pockets 114, and each portion of the second active regions 18 that is proximal to the second conformal doped silicate glass layer 75 is converted into second doped semiconductor pockets 118. Subsequently, the second conformal doped silicate glass layer 75 can be removed by an isotropic etch process such as a wet etch employing hydrofluoric acid.

Figure 23A:
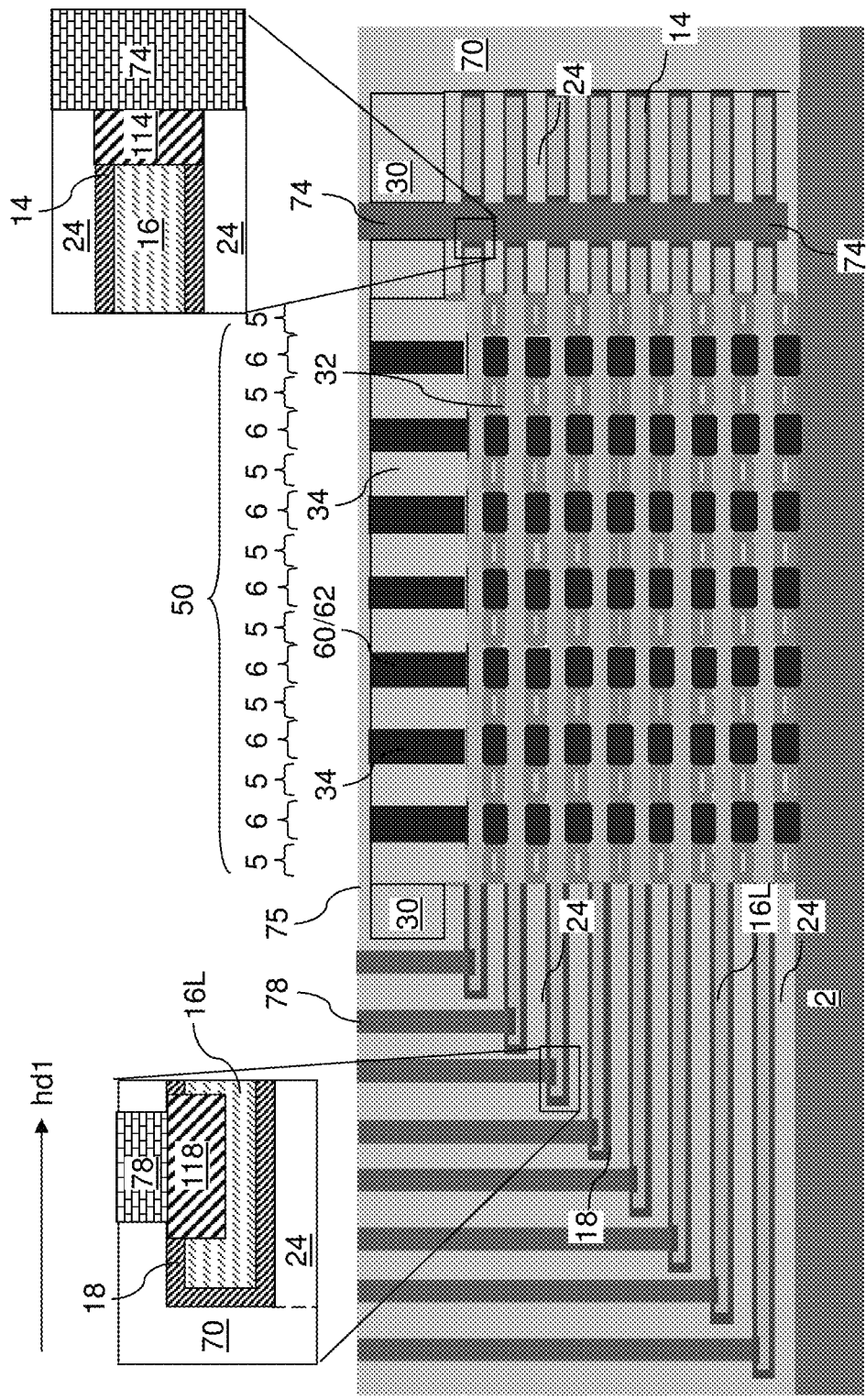
FIG. 23A is a first schematic vertical cross-sectional view of the exemplary structure within a first vertical plane corresponding to the vertical plane A-A' in FIG. 15C after formation of contact via structures according to an embodiment of the present disclosure.
Figure 23B:
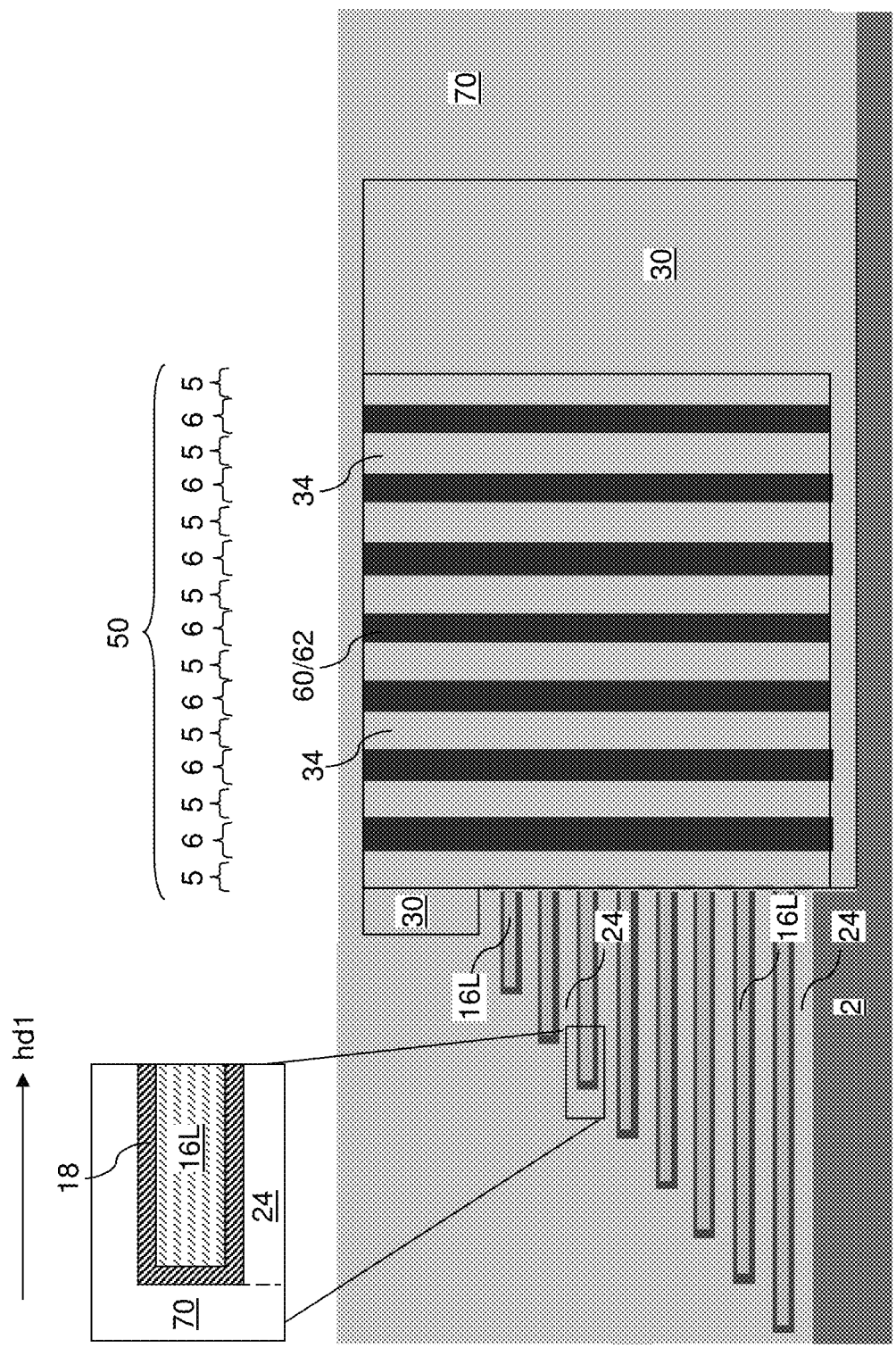
FIG. 23B is a second schematic vertical cross-sectional view of the exemplary structure of FIG. 23A within a second vertical plane corresponding to the vertical plane B-B' in FIG. 15C.

Referring to FIGS. 23A and 23B, at least one conductive material (e.g., a Ti/TiN/W stack) can be deposited in the first contact via cavities 73 and in the second contact via cavities 77. Excess portions of the at least one conductive material can be removed from above the topmost surface of the capping dielectric structure 70 by a planarization process.

The planarization process can employ a recess etch process and/or a chemical mechanical planarization process. Each remaining portion of the at least one conductive material in the first contact via cavities 73 constitutes a first contact via structure 74, and each remaining portion of the at least one conductive material in the second contact via cavities 77 constitutes a second contact via structure 78.

Figure 24A:
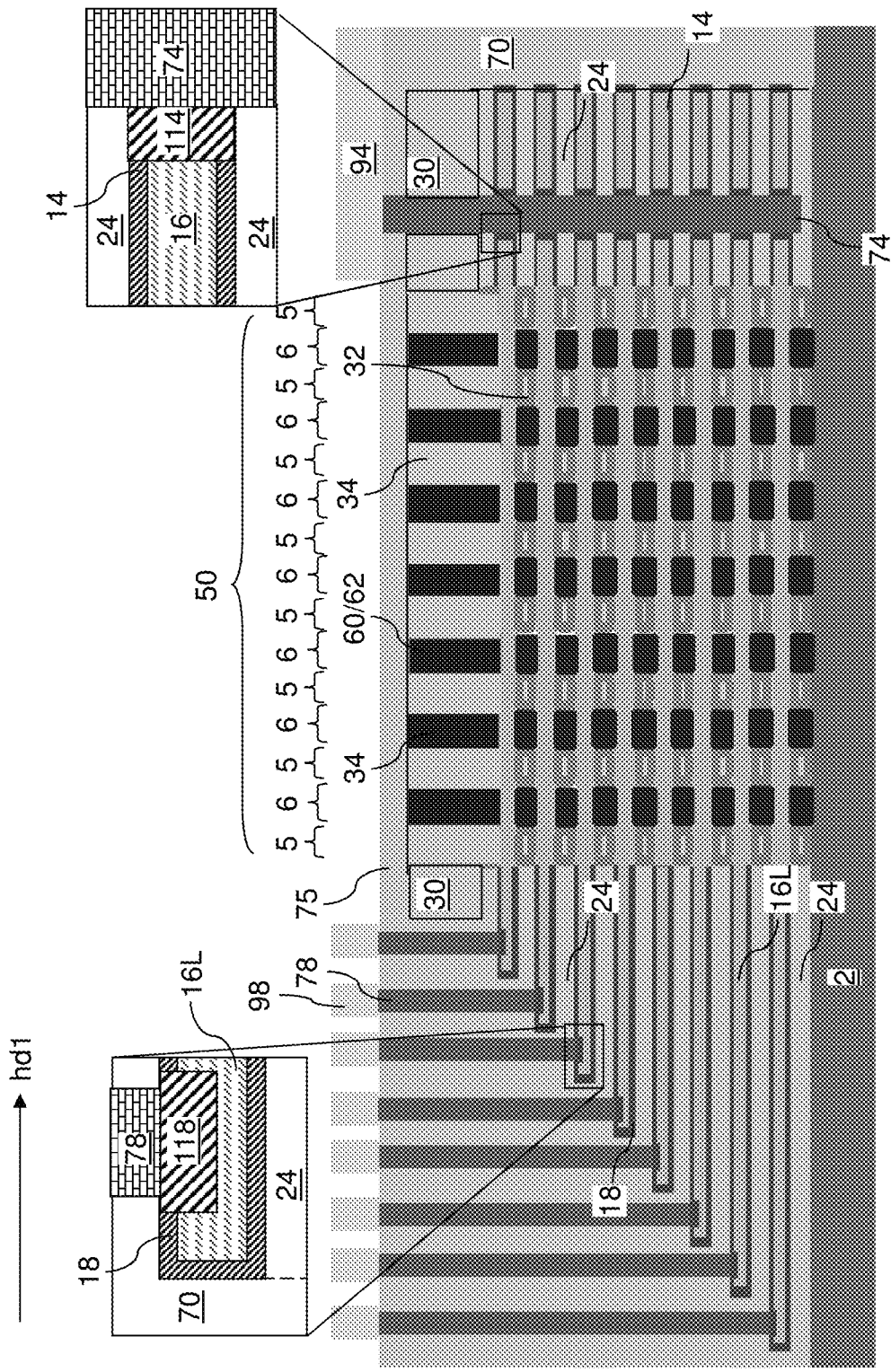
FIG. 24A is a first schematic vertical cross-sectional view of the exemplary structure within a first vertical plane after formation of metal line structures according to an embodiment of the present disclosure.
Figure 24B:
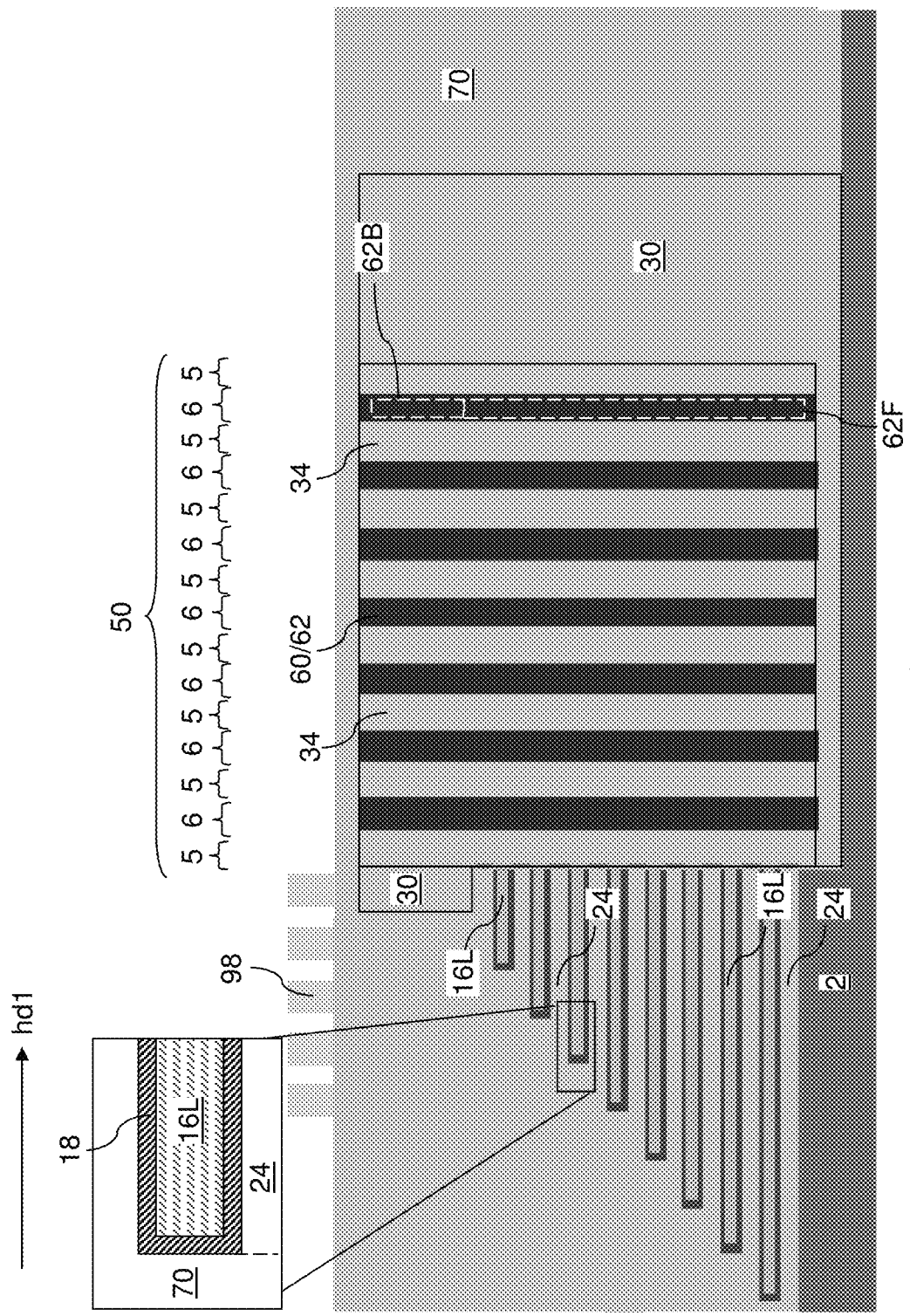
FIG. 24B is a second schematic vertical cross-sectional view of the exemplary structure of FIG. 24A.
Figure 24C:
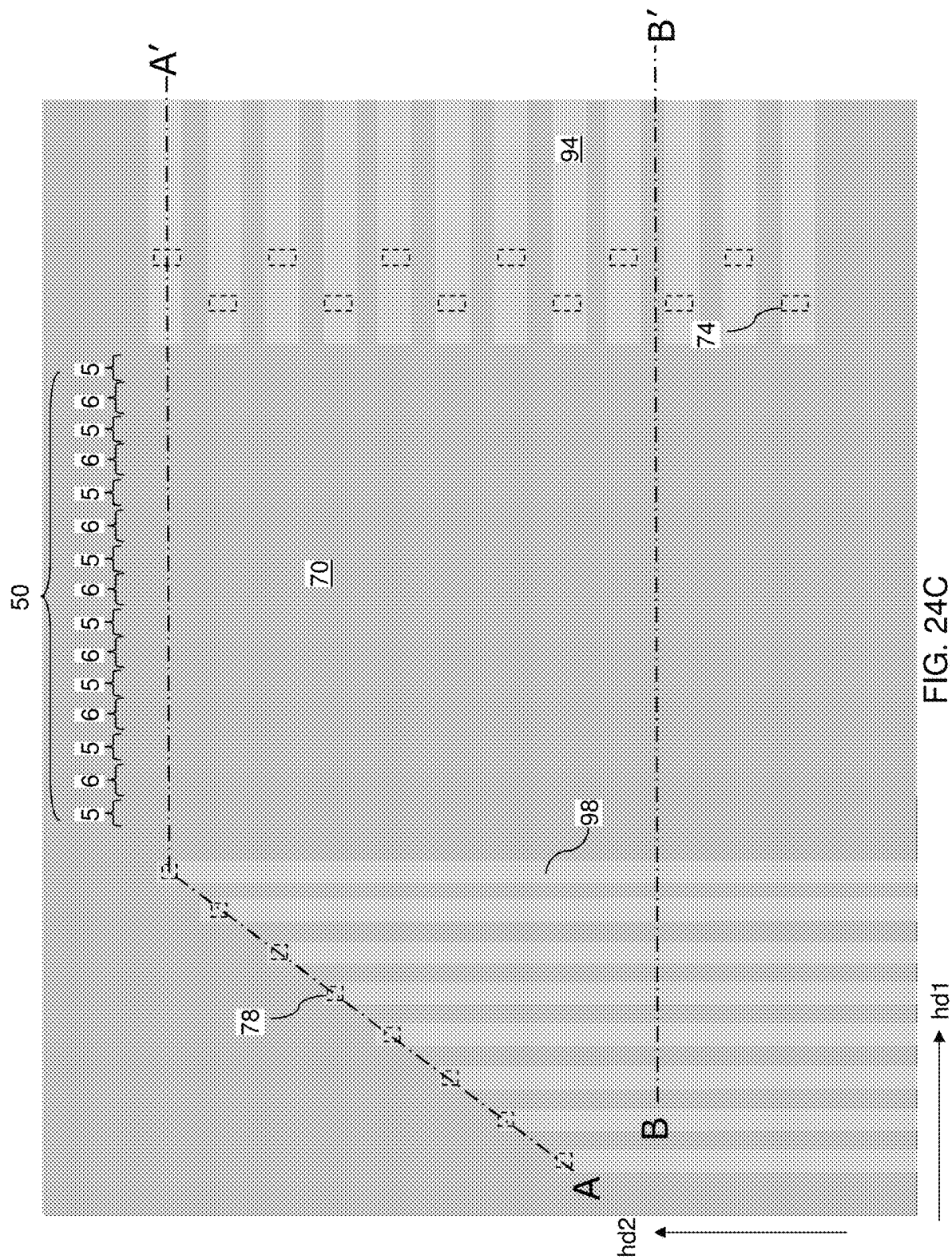
FIG. 24C is a top-down view of the exemplary structure of FIGS. 24A and 24B. The vertical plane A-A' is the plane of the vertical cross-sectional view of FIG. 24A. The vertical plane B-B' is the plane of the vertical cross-sectional view of FIG. 24B.

Referring to FIGS. 24A-24C, metal line structures (94, 98) can be formed over the top surface of the capping dielectric structure 70. The metal line structures (94, 98) include first metal lines 94 that contact a respective one of the first contact via structures 74, and second metal lines 98 that contact a respective one of the second contact via structures 78. In one embodiment, the first metal lines 94 can be employed as source lines and the second metal lines 98 can be employed as bit lines.

Figure 25:
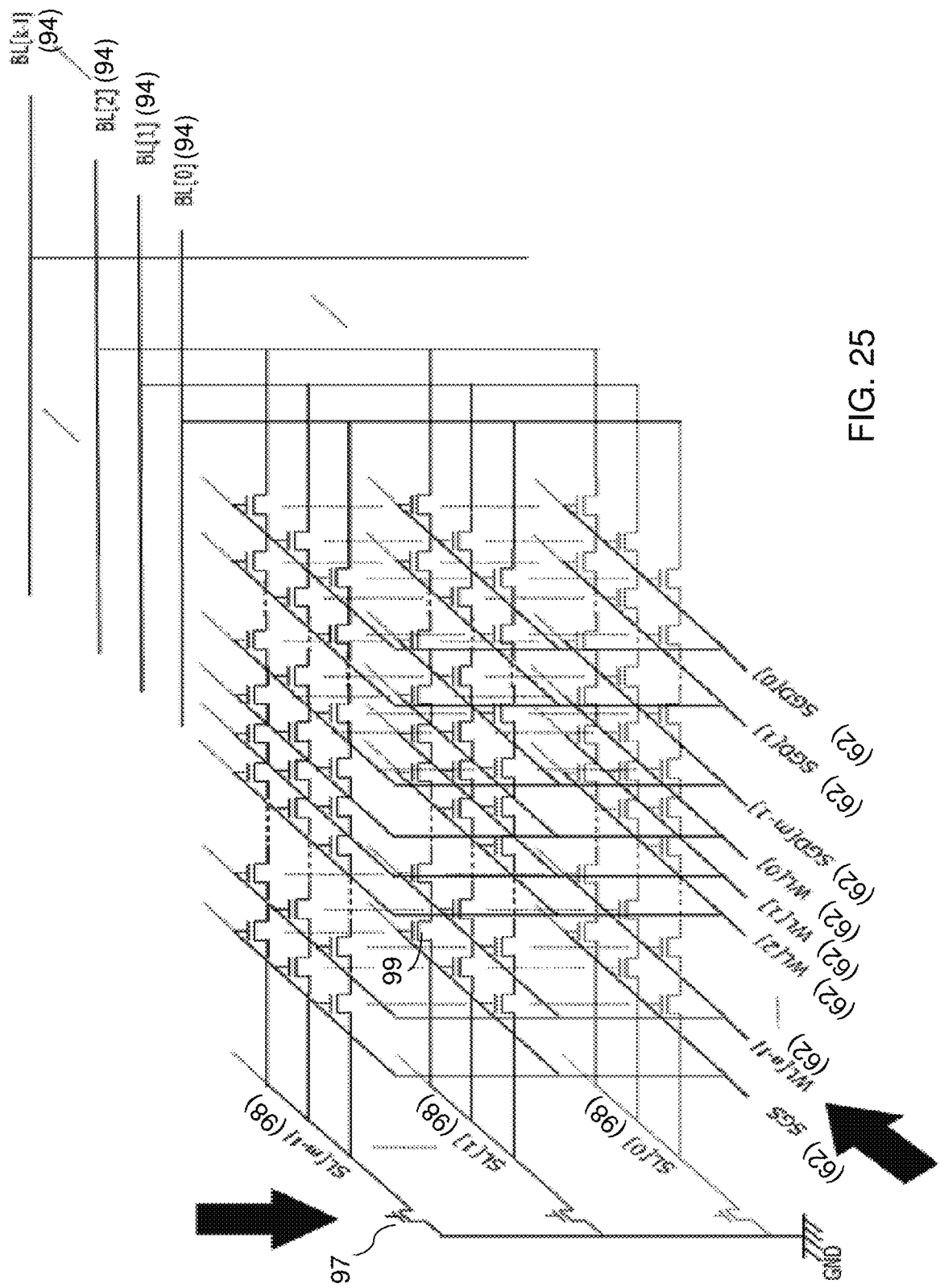
FIG. 25 is a circuit diagram for the three-dimensional memory device of the present disclosure.

Referring to FIG. 25, a circuit diagram for the exemplary three-dimensional memory device of the embodiments of the present disclosure is shown. Source select transistors 97 can be connected to the second metal lines 98, which can function as source lines SL(x) to address cell layer selection to access memory cells 99 (e.g., each transistor in the array which contains a memory film 60). The multi-fingered gate electrodes 62 can be electrically wired, for example, by forming contact via structures through the capping dielectric structure 70 and by forming additional metal lines (not shown) over the capping dielectric structure 70. The multi-fingered gate electrodes 62 can include word lines WL(y) for accessing memory cells in the three-dimensional array of memory elements, a source select electrode SGS that activates the silicon channels from the source side, and at least one drain select electrode SGD(i) that activates the silicon channels from the drain side. Bit line select transistors (not shown) can be connected to the first metal lines 94, which function as bit lines BL(z).

Each tubular memory film 60 constitutes a memory element of each memory cell 99 of the three-dimensional memory array of memory cells. Each tubular memory film 60 can be independently accessed by selecting a bit line BL(z), a word line WL(y), and a source line SL(x). In case a total of n word lines WL(y), a total of m drain select electrodes SGD(i) and one source select electrode SGS are provided, then a total of n+m+1 stack transistors can be provided to independently activate the n+m+1 gate electrodes 62 to program, erase and read. Each of the drain select electrode SGD(i), in which i is an integer from 0 to m−1, can be separately programmed proceeding to the normal operations of the array:

SGD programming can be performed as follows. BLs are set to the value to program SGD[m−1]. Gate voltage of SL[x](m>=x, m>=0) is set to 0 and the rest of SL[m−1:x+1, x−1:0] are set to $V_{program}$. Gate voltage of SGS and all WLs are high to enable conduction. This voltage is lower than $V_{program}$. Gate voltage of SGD[m−1] are set to $V_{program}$; this programs cells on SGD[m−1] row at cell layer [x]. Repeat programming SGD[m−2:0] cells for each layer as the same procedure as SGD[m−1] programming. The SGD programming encodings should be set such that SGD[m−1:0] will select only one layer of cells for a given row.

Referring to all drawings and according to various embodiments of the present disclosure, a three-dimensional memory device includes multi-fingered silicon layers (14, 114, 16, 16L, 18, 118) which are vertically spaced from one another (e.g., by insulating fill material portions of the capping dielectric structure 70 or by air gaps), and which are located over a substrate 2, wherein each of the multi-fingered silicon layers includes a respective silicon plate portion (16L, 18, 118) and a respective set of silicon wires (16, 14, 114) extending along a first horizontal direction hd1 and laterally spaced apart along a second horizontal direction hd2. Tubular memory films 60 surround respective portions 14 of each of the silicon wires. Gate electrodes 62 comprise vertically-extending gate electrode fingers 62F which extend vertically between a respective laterally-neighboring pair of silicon wires (16, 14, 114). The gate electrodes 62 are laterally spaced apart along the first horizontal direction hd1. Each of the silicon wires (16, 14, 114) comprises a respective channel portion (i.e., a wire channel portion 16) that is either undoped (i.e. not intentionally doped) or has a doping of a first conductivity type and extending under each of the multi-fingered gate electrodes 62. First active regions 14 are located at an end portion of each of the silicon wires (16, 14, 114) and having a doping of a second conductivity type that is an opposite of the first conductivity type, and second active region 18 are located in the silicon plate portions (16L, 18, 118) of the multi-fingered silicon layers (14, 114, 16, 16L, 18, 118) and having a doping of the second conductivity type.

In one embodiment shown in FIGS. 14C, 15B, 15C and 24B, each gas electrode 62 comprises a multi-fingered gate electrode which contains a respective gate electrode bar 62B which overlies the multi-fingered silicon layers (14, 114, 16, 16L, 18, 118) and extends along the second horizontal direction hd2. The gate electrode bar 62B adjoins top ends of a respective subset of vertically-extending gate electrode fingers 62F.

In one embodiment, the substrate 2 comprises, and/or consists of, a single crystalline substrate silicon layer; and each of the multi-fingered silicon layers (14, 114, 16, 16L, 18, 118) comprises a respective single crystalline silicon material having same crystallographic orientations as the single crystalline substrate silicon layer.

In one embodiment, the three-dimensional memory device comprises first contact via structures 74 contacting a respective vertical stack of the first active regions 14 within the two-dimensional array of first active regions 14. In one embodiment, each of the first contact via structures 74 contacts only one silicon wire (16, 14, 114) of each multi-fingered silicon layer (14, 114, 16, 16L, 18, 118) of the multi-fingered silicon layers (14, 114, 16, 16L, 18, 118). The first contact via structures are laterally spaced apart along the second horizontal direction hd2.

In one embodiment, the silicon plate portions (16L, 18, 118) of the multi-fingered silicon layers (14, 114, 16, 16L, 18, 118) form stepped surfaces, such that they have different lateral extents such that distal sidewalls of the silicon plate portions (16L, 18, 118) of the multi-fingered silicon layers (14, 114, 16, 16L, 18, 118) are laterally offset from a most proximal one of the multi-fingered gate electrodes 62 by lateral distances that decrease with a vertical distance of the silicon plate portions (16L, 18, 118) from the substrate 2. In one embodiment, the three-dimensional memory device comprises second contact via structures 78 contacting a respective one of the second active regions 18 within a respective one of the silicon plate portions (16L, 18, 118).

In one embodiment, the silicon wires 11 of the multi-fingered silicon layers (14, 114, 16, 16L, 18, 118) are arranged as a two-dimensional rectangular array having a horizontal pitch along the second horizontal direction hd2 and having a vertical pitch along a vertical direction.

In one embodiment, each of the silicon wires (14, 114, 16) includes a laterally alternating sequence of rounded sections and rectangular sections; each of the rounded sections has a vertical cross-sectional shape of a circle, an ellipse, or a rounded rectangle; and each of the rectangular sections has a vertical cross-sectional shape of a rectangle.

In one embodiment, each of the multi-fingered gate electrodes 62 surrounds a respective tubular memory films 60, and each of the tubular memory films 60 contacts, and surrounds, a respective one of the rounded sections of the silicon wires. In one embodiment, the device also includes a tubular diffusion barrier material portions 32 that includes an opening and that extend along the second horizontal direction hd2 is located between each vertically neighboring pair of rectangular sections.

In one embodiment, the three-dimensional memory device comprises perforated dielectric wall structures 34 that are interlaced with the multi-fingered gate electrodes 62 along the first horizontal direction hd1 and including a respective two-dimensional array of laterally-extending openings therethrough, wherein each of the silicon wires (14, 114, 16) passes through the two-dimensional array of laterally-extending openings.

In one embodiment, each channel portion (i.e., a wire channel portion 16) of the silicon wires (14, 114, 16) comprises a portion of a silicon channel (16L, 16) of a horizontally-extending NAND string; and each of the multi-fingered gate electrodes 62 comprises a control gate of the horizontally-extending NAND strings. In one embodiment, each tubular memory film 60 comprises a tunneling dielectric layer, a blocking dielectric layer and a charge storage layer located between the tunneling dielectric layer and the blocking dielectric layer. In this embodiment each NAND string comprises a charge trapping (i.e., charge storage) memory device.

In another embodiment, each tubular memory film 60 comprises a ferroelectric material, and the three-dimensional memory device comprises a ferroelectric memory device.

In another embodiment, a three-dimensional memory device comprises horizontal semiconductor channels 14 (e.g., portions of the silicon wires 11) which are vertically spaced from one another and which are located over a substrate 2; multi-fingered gate electrodes 62, each including a respective gate electrode bar 62B which overlies the multi-fingered silicon layers and extends along the second horizontal direction, and a respective set of vertically-extending gate electrode fingers 62F which is adjoined to a bottom portion of the respective gate electrode bar, wherein each of the vertically-extending gate electrode fingers 62F extends vertically between a respective laterally-neighboring pair of horizontal semiconductor channels 14; and ferroelectric memory films 60 that are located between the horizontal semiconductor channels 14 and the multi-fingered gate electrodes 62.

The three-dimensional memory array of some embodiments of the present disclosure includes single crystalline silicon channels (16L, 16), which can provide high charge carrier mobility compared to polycrystalline semiconductor channels of prior art devices. Thus, the on-current of the memory device of some embodiments of the present disclosure can be significantly higher than the on-current of prior art memory devices containing vertical polysilicon channels.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:
   multi-fingered silicon layers which are vertically spaced from one another and which are located over a substrate, wherein each of the multi-fingered silicon layers includes a respective silicon plate portion and a respective set of silicon wires extending along a first horizontal direction and laterally spaced apart along a second horizontal direction;
   tubular memory films which surround respective portions of each of the silicon wires;
   gate electrodes comprising vertically-extending gate electrode fingers, wherein each of the vertically-extending gate electrode fingers extends vertically between a respective laterally-neighboring pair of silicon wires, wherein the gate electrodes are laterally spaced apart along the first horizontal direction, and wherein each of the silicon wires comprises a respective channel portion that is undoped or has a doping of a first conductivity type and extending under each of the gate electrodes;
   first active regions located at an end portion of each of the silicon wires and having a doping of a second conductivity type that is an opposite of the first conductivity type; and
   second active regions located in the silicon plate portions of the multi-fingered silicon layers and having a doping of the second conductivity type;
   wherein:
      each of the silicon wires includes a laterally alternating sequence of rounded sections and rectangular sections;
      each of the rounded sections has a vertical cross-sectional shape of a circle, an ellipse, or a rounded rectangle; and
      each of the rectangular sections has a vertical cross-sectional shape of a rectangle.

2. The three-dimensional memory device of claim 1, wherein:
   the substrate comprises a single crystalline substrate silicon layer; and
   each of the multi-fingered silicon layers comprises a respective single crystalline silicon material having same crystallographic orientations as the single crystalline substrate silicon layer.

3. The three-dimensional memory device of claim 1, further comprising first contact via structures contacting a respective vertical stack of the first active regions, wherein each of the first contact via structures contacts only one silicon wire of each multi-fingered silicon layer of the multi-fingered silicon layers, and wherein the first contact via structures are laterally spaced apart along the second horizontal direction.

4. The three-dimensional memory device of claim 3, further comprising second contact via structures contacting a respective one of the second active regions within a respective one of the silicon plate portions, wherein the silicon plate portions of the multi-fingered silicon layers form stepped surfaces.

5. The three-dimensional memory device of claim 1, wherein the silicon wires of the multi-fingered silicon layers are arranged as a two-dimensional rectangular array having a horizontal pitch along the second horizontal direction and having a vertical pitch along a vertical direction.

6. The three-dimensional memory device of claim 1, wherein:
   each of the gate electrodes surrounds a respective tubular memory film; and
   each of the tubular memory films contacts, and surrounds, a respective one of the rounded sections of the silicon wires.

7. The three-dimensional memory device of claim 6, further comprising tubular diffusion barrier material portions including an opening extend along the second horizontal direction and are located between each vertically neighboring pair of the rectangular sections.

8. The three-dimensional memory device of claim 1, further comprising perforated dielectric wall structures that are interlaced with the gate electrodes along the first horizontal direction and including a respective two-dimensional array of laterally-extending openings therethrough, wherein each of the silicon wires passes through the two-dimensional array of laterally-extending openings.

9. The three-dimensional memory device of claim 1, wherein:
   each channel portion of the silicon wires comprises a portion of a silicon channel of a horizontally-extending NAND string; and
   each of the gate electrodes comprises a control gate of the horizontally-extending NAND strings.

10. The three-dimensional memory device of claim 9, wherein each tubular memory film comprises a tunneling dielectric layer, a blocking dielectric layer and a charge storage layer located between the tunneling dielectric layer and the blocking dielectric layer.

11. The three-dimensional memory device of claim 1, wherein each tubular memory film comprises a ferroelectric material, and the three-dimensional memory device comprises a ferroelectric memory device.

12. The three-dimensional memory device of claim 1, wherein:
   each of the gate electrodes comprises a respective gate electrode bar which overlies the multi-fingered silicon layers;
   the gate electrode bar extends along the second horizontal direction; and
   the gate electrode bar adjoins top ends of a respective subset of the vertically-extending gate electrode fingers.

* * * * *